United States Patent
Katsurai et al.

(10) Patent No.: US 9,083,476 B2
(45) Date of Patent: Jul. 14, 2015

(54) SIGNAL MULTIPLEXING DEVICE

(75) Inventors: Hiroaki Katsurai, Tokyo (JP); Hideki Kamitsuna, Tokyo (JP); Yusuke Ohtomo, Tokyo (JP)

(73) Assignee: NIPPON TELEGRAPH AND TELEPHONE CORPORATION, Tokyo (JP)

( * ) Notice: Subject to any disclaimer, the term of this patent is extended or adjusted under 35 U.S.C. 154(b) by 186 days.

(21) Appl. No.: 13/980,570

(22) PCT Filed: Jan. 20, 2012

(86) PCT No.: PCT/JP2012/051176
§ 371 (c)(1),
(2), (4) Date: Jul. 18, 2013

(87) PCT Pub. No.: WO2012/105334
PCT Pub. Date: Aug. 9, 2012

(65) Prior Publication Data
US 2013/0294464 A1 Nov. 7, 2013

(30) Foreign Application Priority Data

Jan. 31, 2011 (JP) .................................. 2011-017603
Feb. 15, 2011 (JP) .................................. 2011-029702

(51) Int. Cl.
| | |
|---|---|
| *H04J 3/06* | (2006.01) |
| *H03L 7/08* | (2006.01) |
| *H03L 7/18* | (2006.01) |
| *H04L 7/033* | (2006.01) |
| *H04L 7/00* | (2006.01) |
| *H04L 7/027* | (2006.01) |

(52) U.S. Cl.
CPC ............. *H04J 3/0635* (2013.01); *H03L 7/0805* (2013.01); *H03L 7/18* (2013.01); *H04L 7/033* (2013.01); *H03L 2207/06* (2013.01); *H04L 7/0083* (2013.01); *H04L 7/0276* (2013.01)

(58) Field of Classification Search
CPC ....... H04J 3/0635; H03L 7/0805; H03L 7/18; H03L 2207/06; H04L 7/033
See application file for complete search history.

(56) References Cited

U.S. PATENT DOCUMENTS

2002/0033738 A1    3/2002 Saeki et al.
(Continued)

FOREIGN PATENT DOCUMENTS

| CN | 1897583 A | 1/2007 |
|---|---|---|
| JP | H03-166836 A | 7/1991 |

(Continued)

OTHER PUBLICATIONS

Terada et al., "Jitter-reduction and pulse-width-distortion compensation circuits for a 10Gb/s burst-mode CDR circuit", in 2009 IEEE International Solid-State Circuits Conference Digest, pp. 104-106, Feb. 2009.

*Primary Examiner* — Robert Wilson
(74) *Attorney, Agent, or Firm* — Blakely Sokoloff Taylor & Zafman

(57) ABSTRACT

A signal multiplexing device includes a selector (1) that selects one of input data (4) and a complementary signal (16), a clock recovery circuit (30a) that adjusts the phase of a recovered clock (7) to the timing of the output signal of the selector (1), and a flip-flop circuit (3) that performs identification/recovery of the output signal of the selector (1) based on the recovered clock (7). The frequency of the complementary signal (16) is an integral submultiple of the frequency of the recovered clock (7). The selector (1) selects the complementary signal (16) during part of the no-signal period of the input data (4).

19 Claims, 27 Drawing Sheets

(56) References Cited

U.S. PATENT DOCUMENTS

2003/0093703 A1    5/2003    Oliver et al.
2007/0121772 A1*    5/2007    Wada ............................ 375/371
2013/0294464 A1*    11/2013    Katsurai et al. ............... 370/516

FOREIGN PATENT DOCUMENTS

| | | |
|---|---|---|
| JP | H07-030532 A | 1/1995 |
| JP | H11-214991 A | 8/1999 |
| JP | 2008-227786 A | 9/2008 |

* cited by examiner

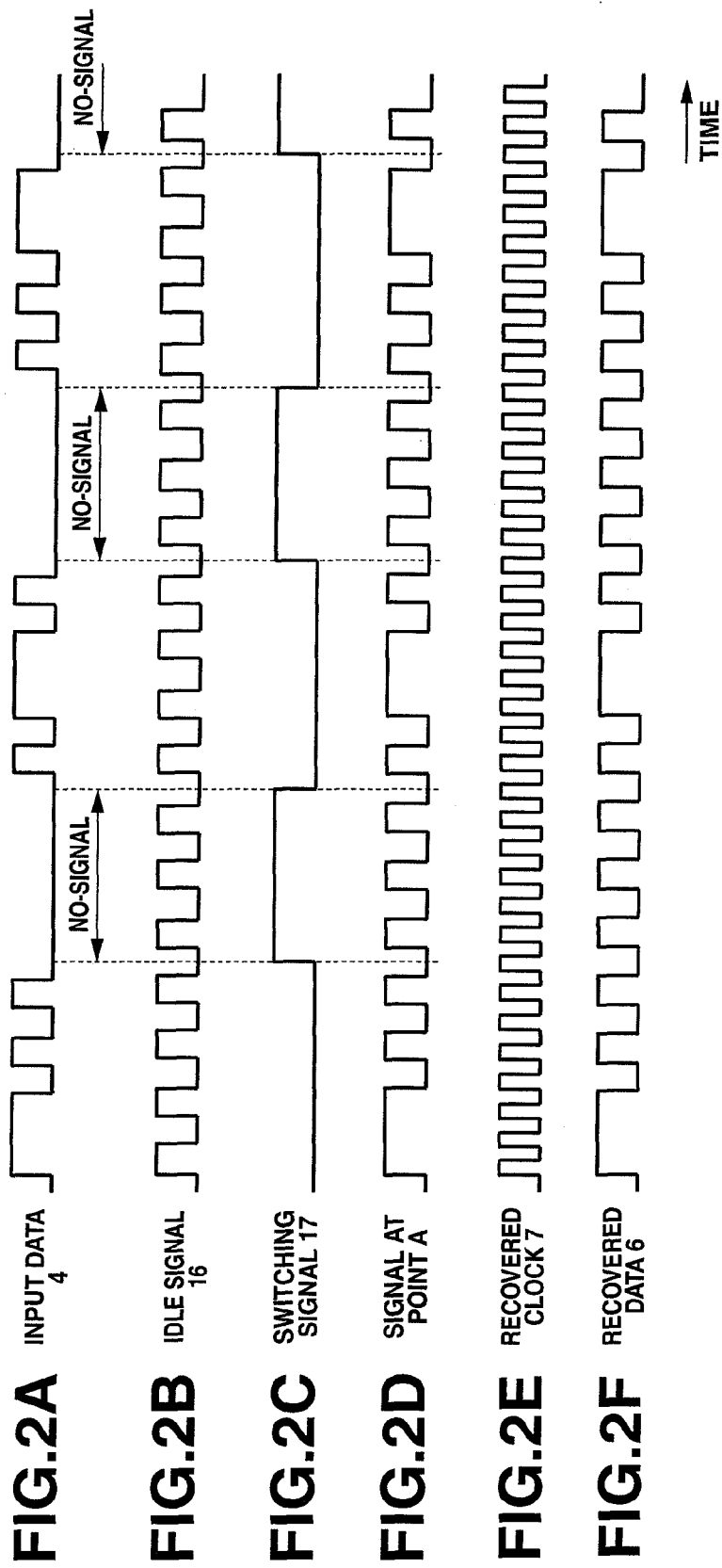

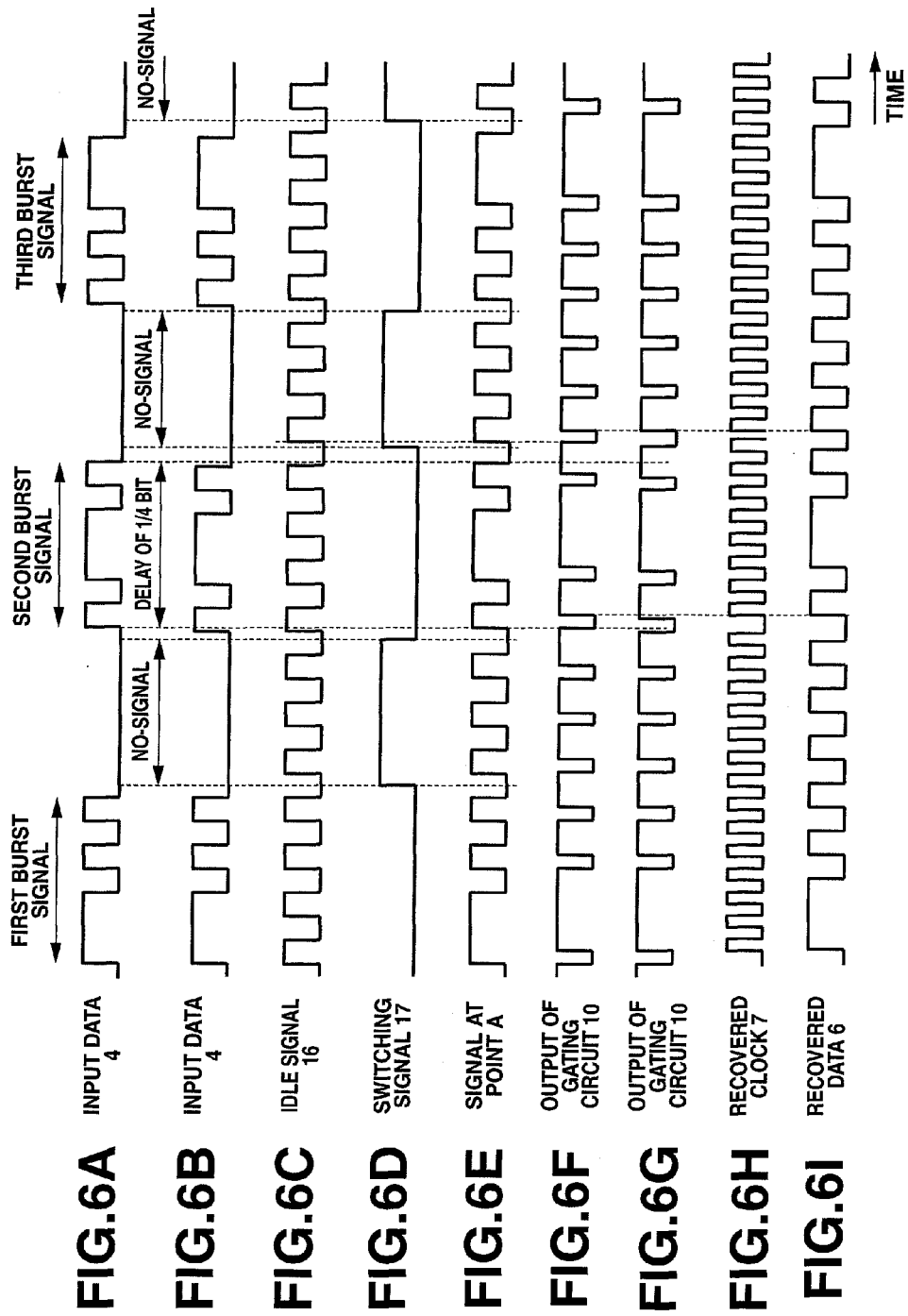

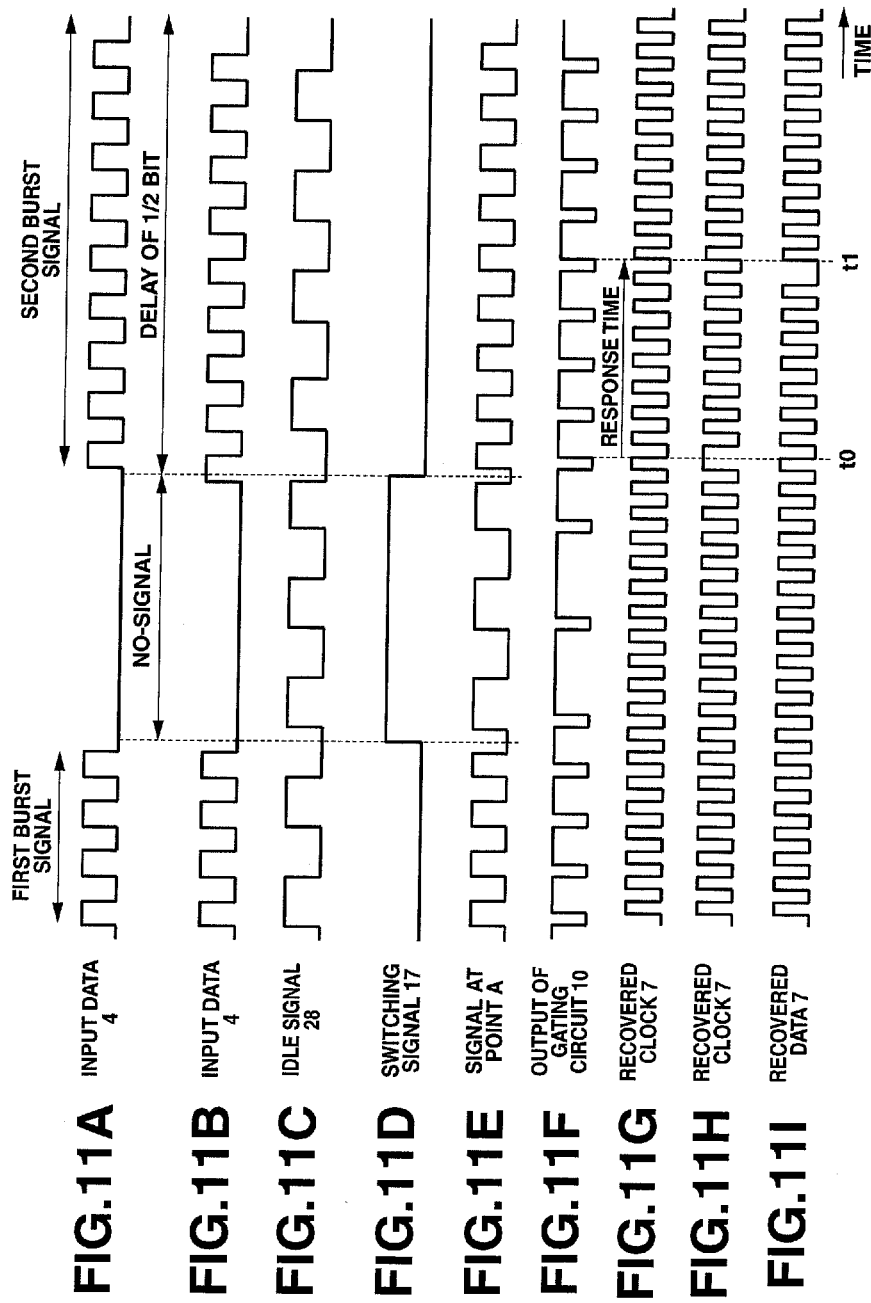

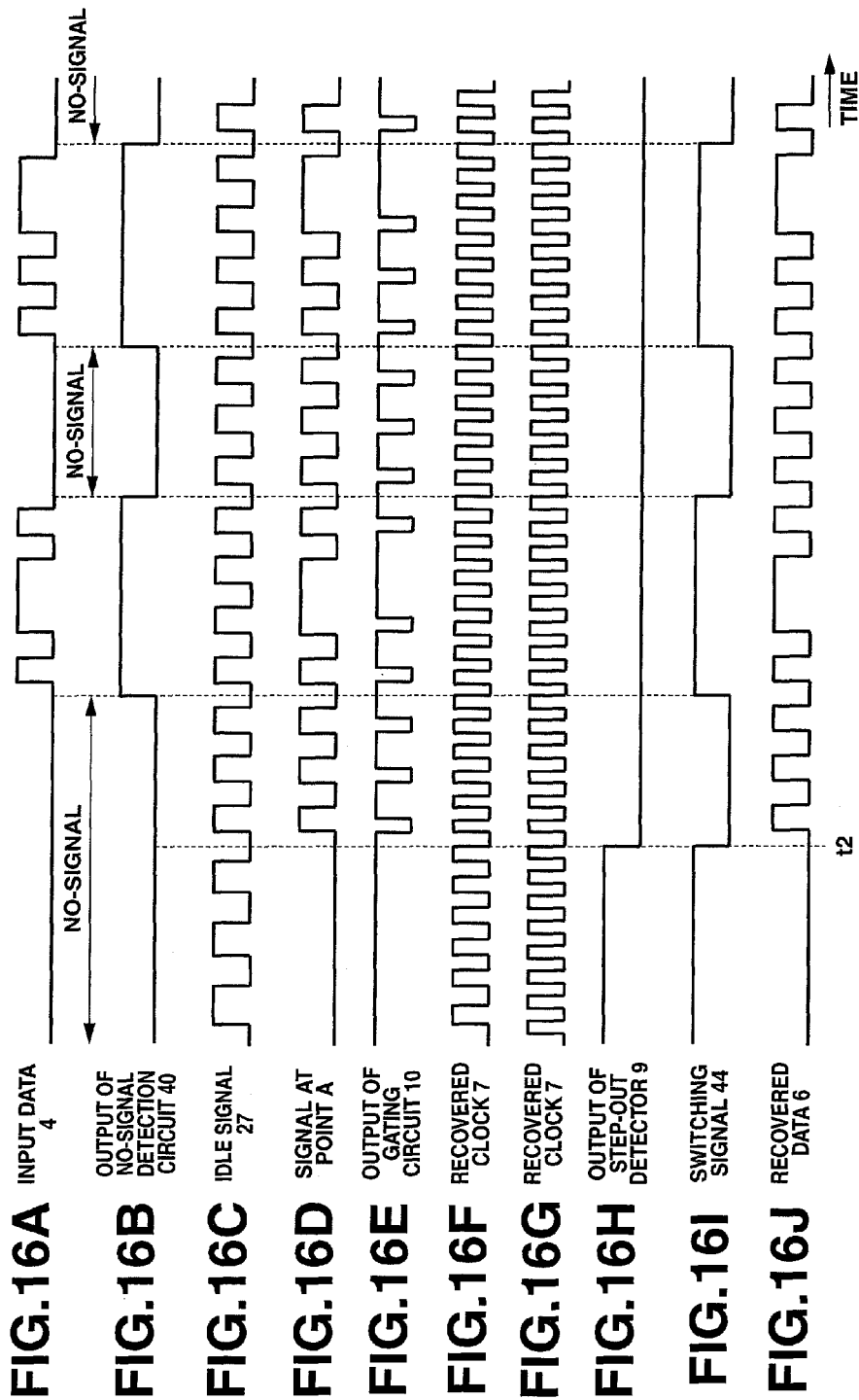

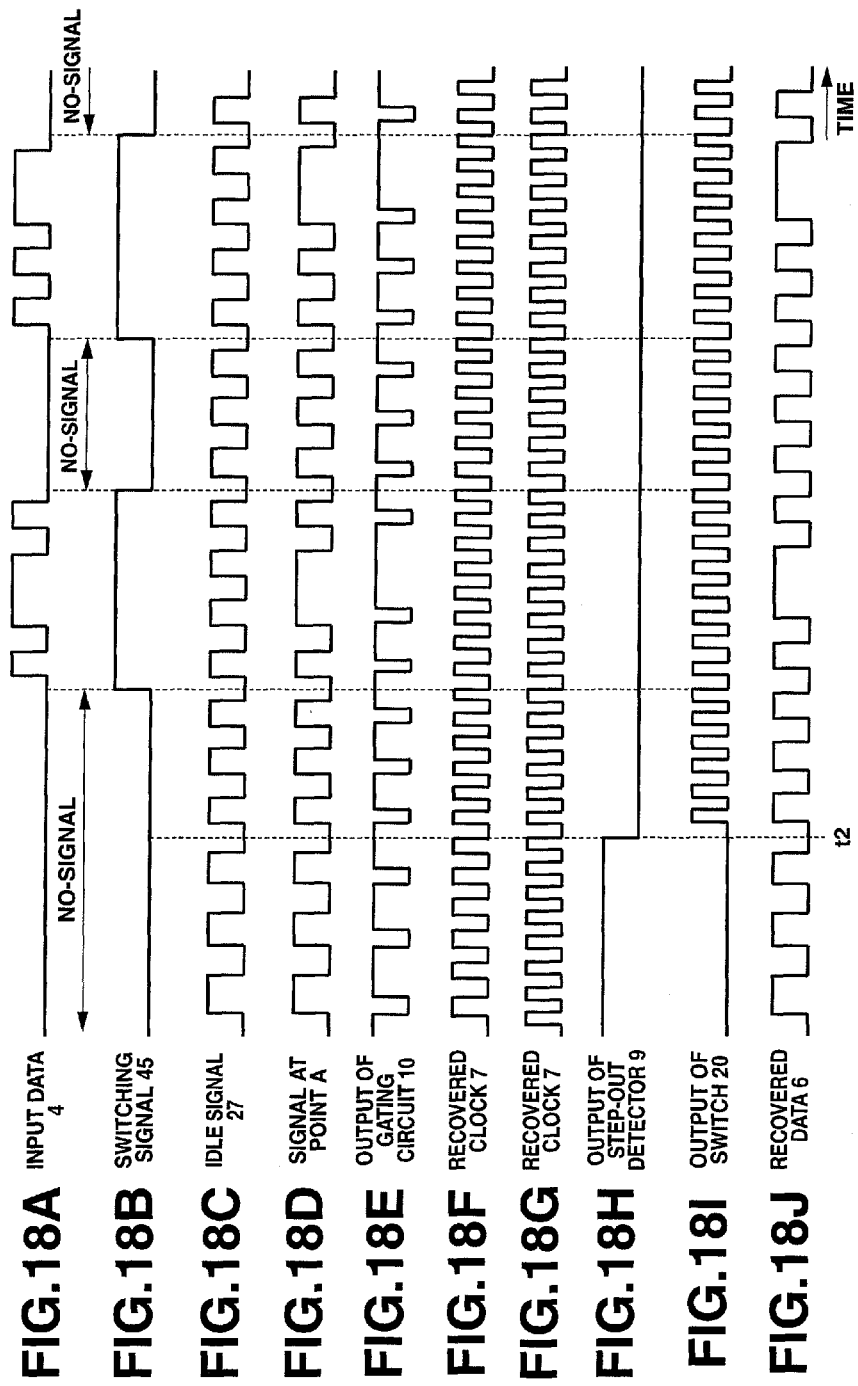

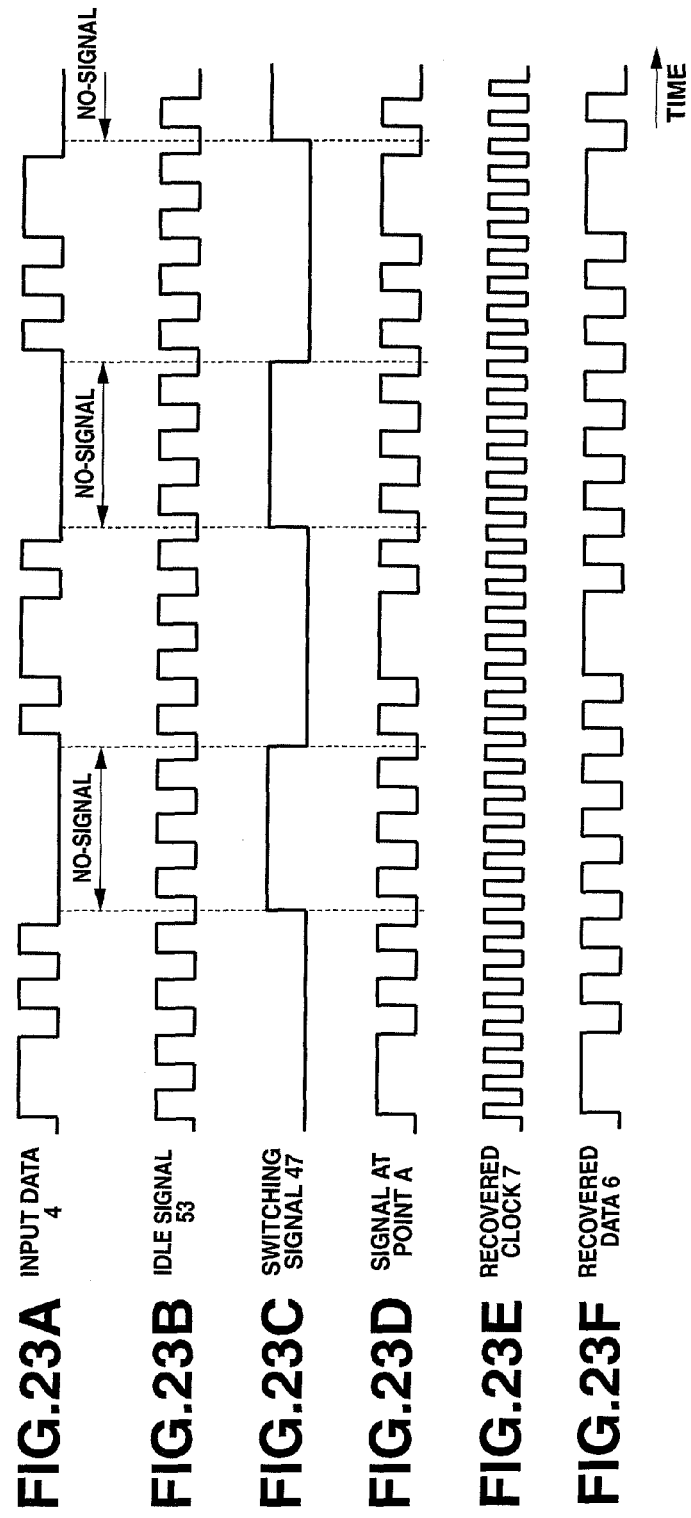

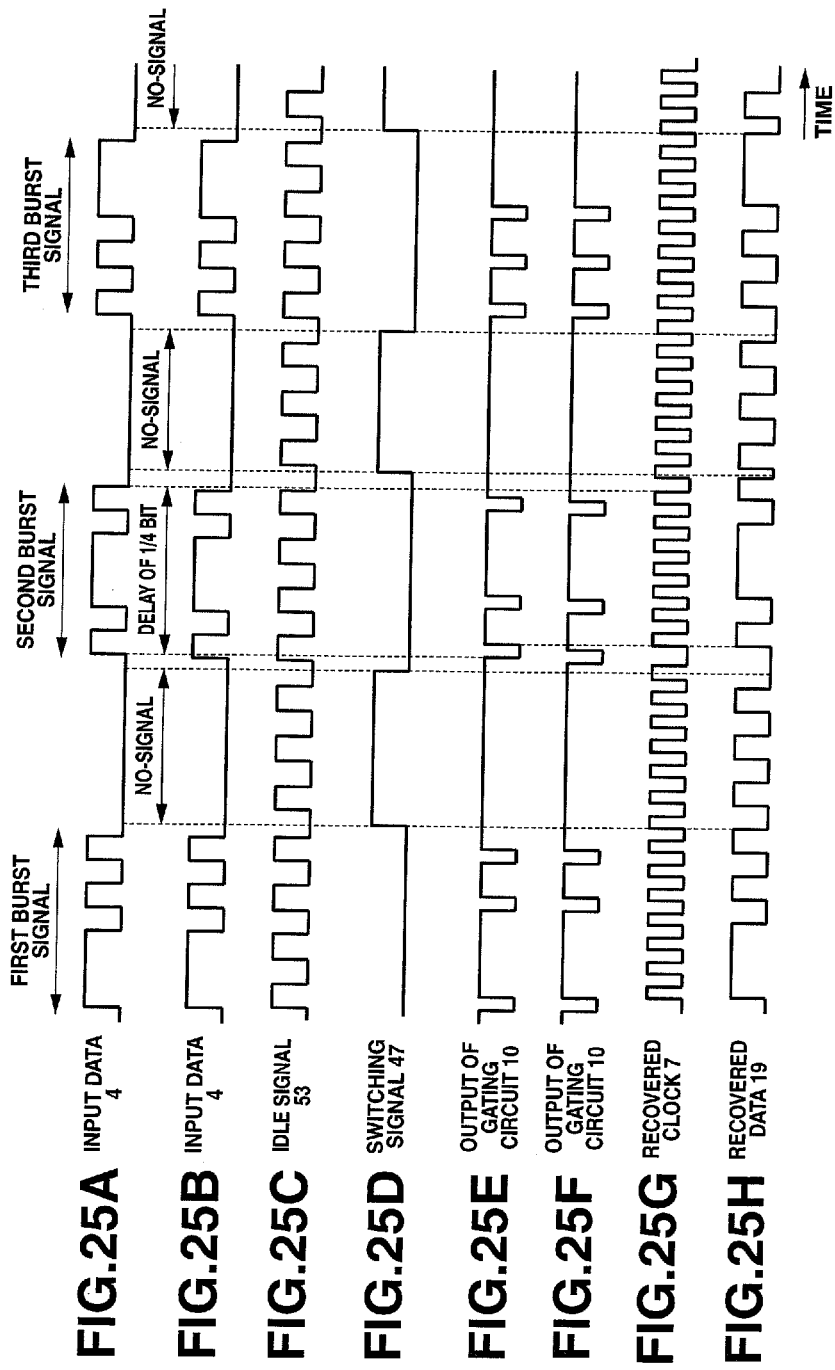

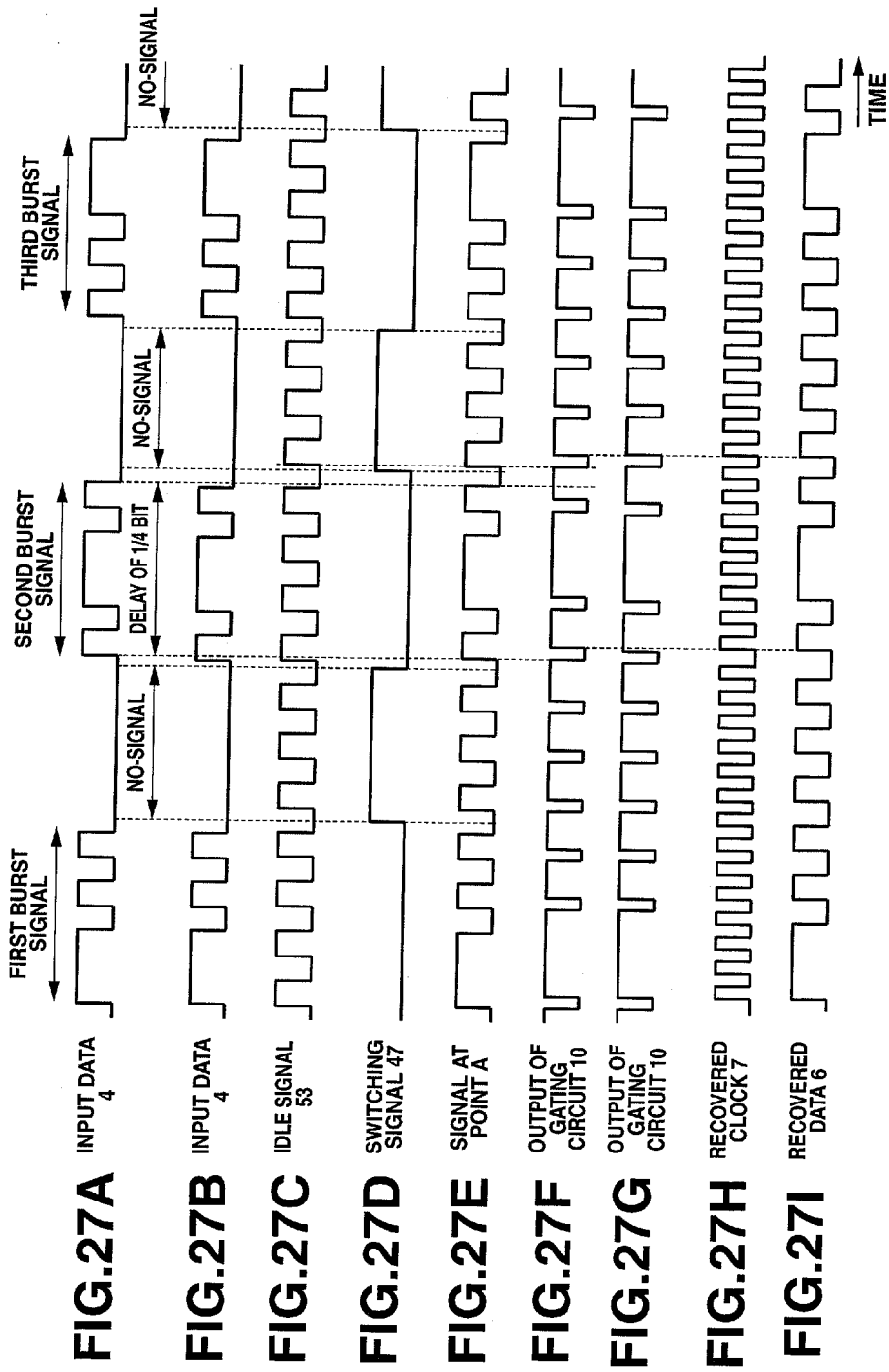

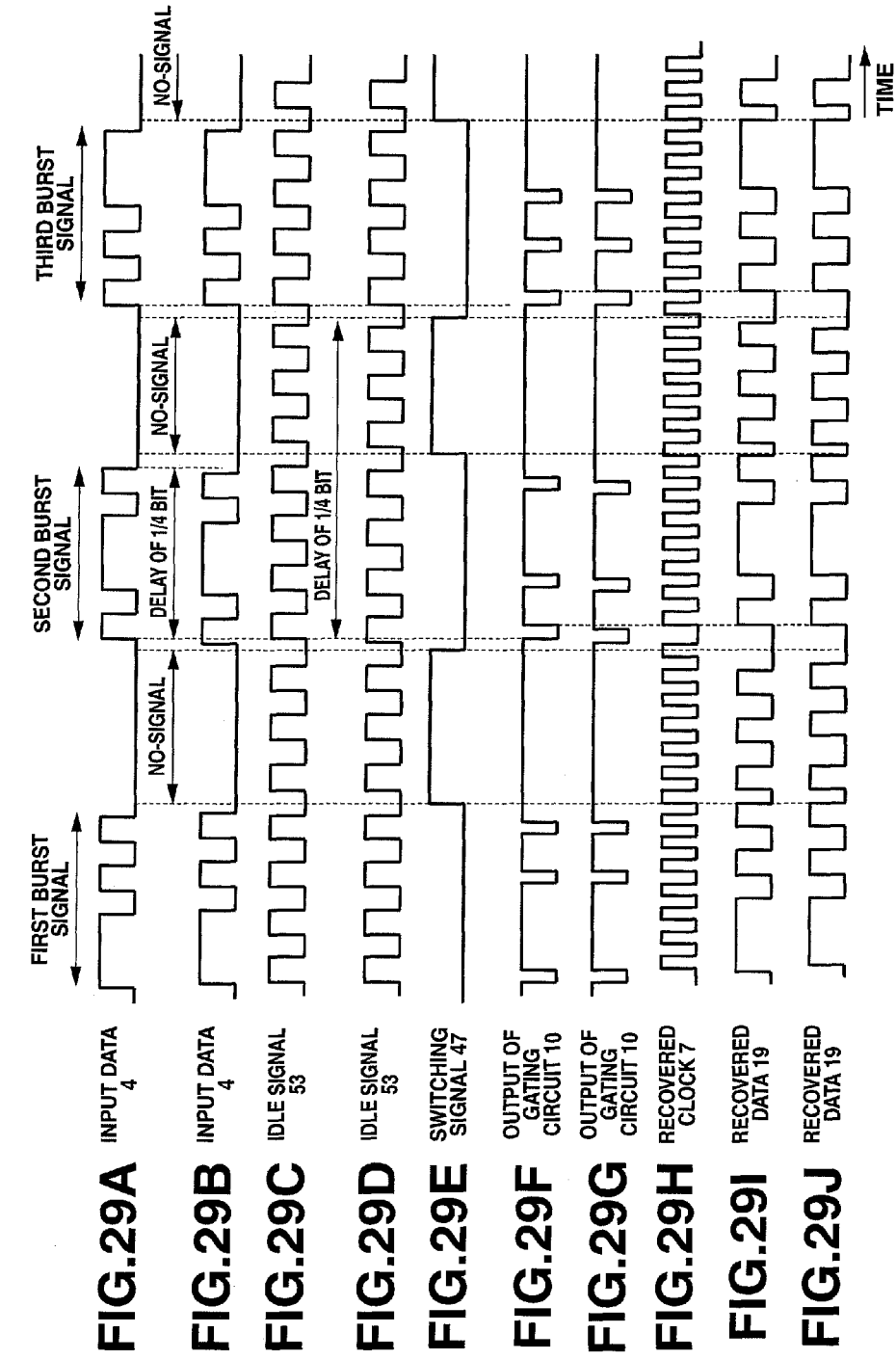

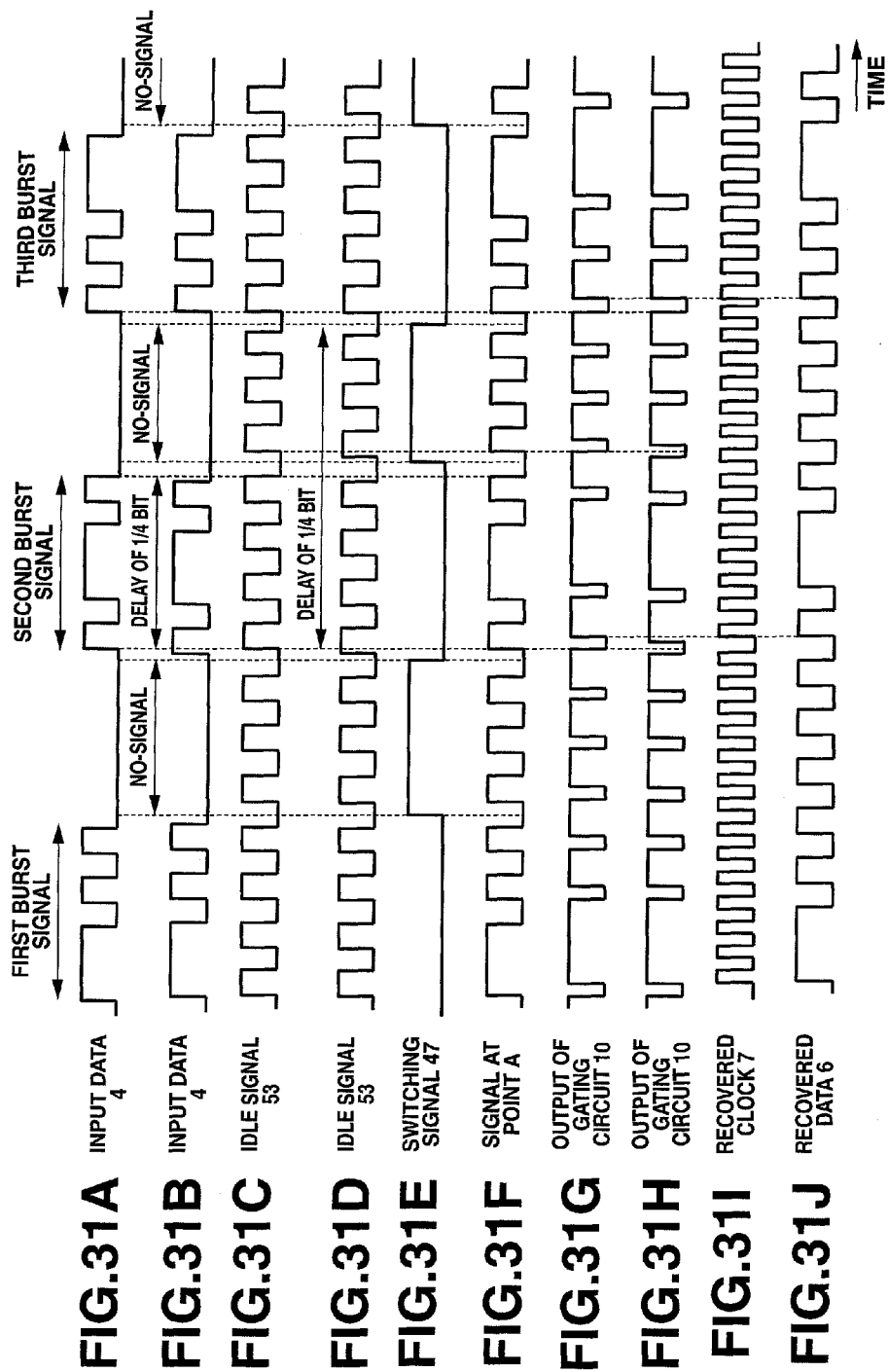

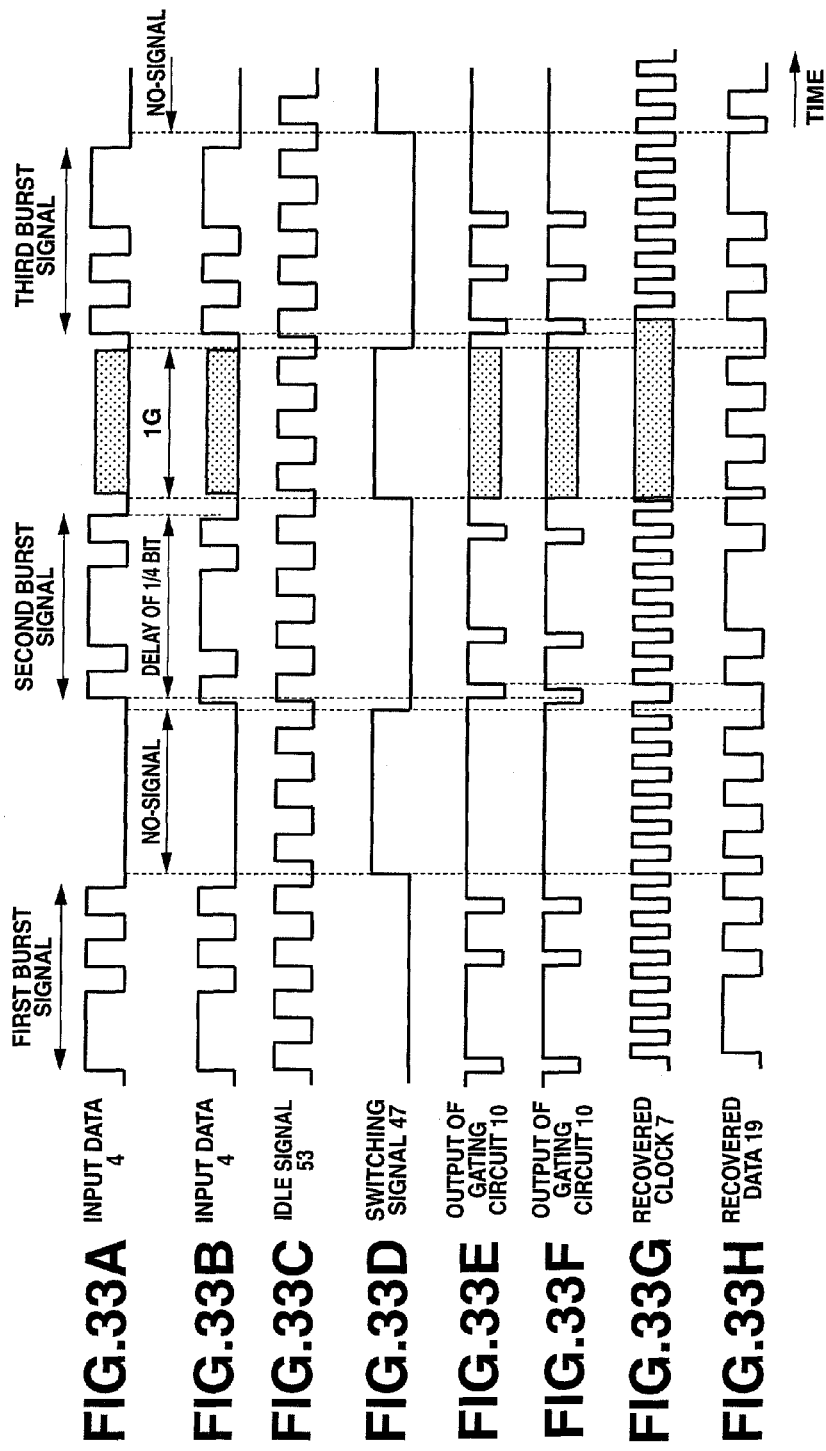

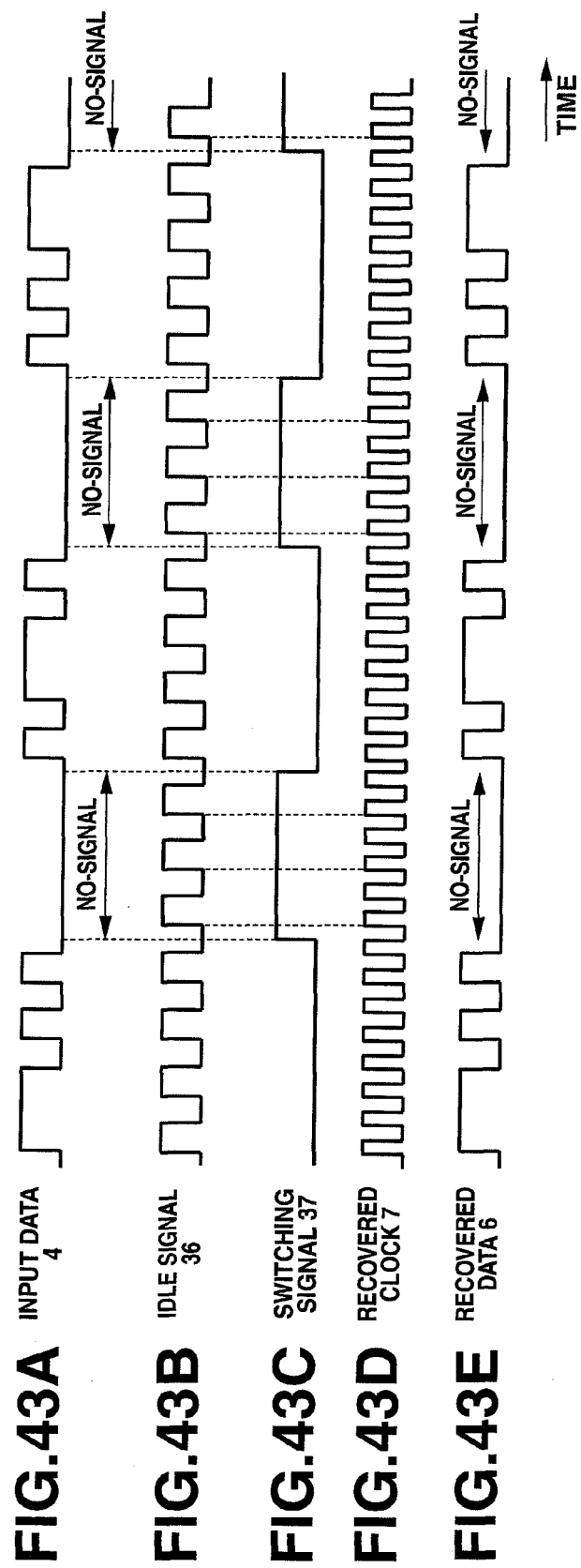

SIGNAL MULTIPLEXING DEVICE

TECHNICAL FIELD

The present invention relates to a device provided, for example, at the preceding stage of a CDR circuit that performs retiming of an input signal and, more particularly, to a signal multiplexing device that multiplexes a complementary signal on an input signal.

BACKGROUND ART

FIG. 41 illustrates an example of the arrangement of a receiving device of an optical line terminal (to be referred to as an OLT hereinafter) of PON (Passive Optical Network) system which has been developed as a means for implementing FTTH (Fiber To The Home). The OLT stores a plurality of optical network units (to be referred to as ONUs hereinafter) (not shown). According to the IEEE 802.3av standard, up link signals from the ONUs to the OLT are time-divisionally multiplexed as burst signals having different strengths or phases for the respective ONUs.

As shown in FIG. 41, the receiving device of the OLT includes an optical receiving device 200, a CDR (Clock Data Recovery) circuit 201, a demultiplexer 202, and a control LSI 203. The optical receiving device 200 includes an APD (Avalanche Photodiode)-TIA (Transimpedance Amplifier) 204 and a LIM (Limiting Amplifier) 205. The APD-TIA 204 converts an optical signal into a current signal and further converts the current signal into a voltage signal. The LIM 205 amplifies the voltage signal while limiting its amplitude to a level identifiable/recoverable by the CDR circuit 201 of the subsequent stage. The control LSI 203 includes a low-speed receiving circuit 206.

The receiving device of the OLT shown in FIG. 41 causes, for each burst signal, the optical receiving device 200 to perform gain control and threshold detection and the CDR circuit 201 to perform clock extraction and signal retiming. The demultiplexer 202 demultiplexes the multiplexed signal output from the CDR circuit 201 into N outputs. The control LSI 203 having a MAC (Media Access Control) function then performs necessary processing, thus complementary signal reception processing. To improve the up link transmission efficiency from the ONUs to the OLT, the necessary overhead (preamble period) needs to shorten, and the optical receiving device 200 or the CDR circuit 201 having a quick response characteristic to the burst signal is necessary. The CDR circuit 201 of this type is disclosed in, for example, J. Terada, et al., "Jitter-reduction and pulse-width-distortion compensation circuits for a 10 Gb/s burst-mode CDR circuit", in 2009 IEEE International Solid-State Circuits Conference Digest, pp. 104-106, February 2009.

The recent progress of CMOS technologies is making the control LSI capable of integrating not only a logic circuit but also a high-speed I/O (for example, CDR circuit) and the like. However, equipping an LSI with a CDR circuit of special specifications for burst signals is not beneficial in terms of both cost and technique. To enable the control LSI to process a burst signal, conventionally, the demultiplexer 202 needs to parallelly expand the data signal at a low speed so as to permit the phase change of a clock extracted by the CDR circuit 201, as shown in FIG. 41. In this arrangement, since both the CDR circuit 201 and the control LSI 203 need to include buffers as many as the parallel paths, power consumption increases. In addition, the size of the device increases due to make the wires of the parallel paths isometric.

On the other hand, to directly input serial data signals to a control LSI including a general-purpose CDR circuit compatible with a continuous signal, the CDR circuit compatible with a continuous signal needs to be prevented from unstably operating due to frequency step-out or the like. FIG. 42 illustrates an arrangement disclosed in Japanese Patent Laid-Open No. 3-166836 as a technique of this type. A signal multiplexing device shown in FIG. 42 includes a flip-flop circuit (to be referred to as an F/F hereinafter) 3 and a PLL-type clock recovery circuit 30. The clock recovery circuit 30 includes a phase comparator 31, a low pass filter (to be referred to as a LPF hereinafter) 32, a voltage controlled oscillator (to be referred to as a VCO hereinafter) 33, and a selector 34.

FIGS. 43A to 43E are timing charts for explaining the operation of the signal multiplexing device. The phase comparator 31 compares the phase of input data 4 with that of a recovered clock 7, and outputs a phase difference signal representing the phase difference between the input data 4 and the recovered clock 7. The LPF 32 integrates the phase difference signal and thus converts it into a control signal. The VCO 33 outputs a recovered clock 35 having a frequency corresponding to the voltage of the control signal. The selector 34 selects the recovered clock 35 in a normal state in which the input data 4 is input, and outputs it as the recovered clock 7. In this way, the recovered clock 7 having the same frequency as the input data rate frequency can be generated.

The recovered clock 7 is input to the clock terminal of the F/F 3 and used for retiming of the input data 4 input to the data input terminal of the F/F 3. The F/F 3 thus outputs recovered data 6.

On the other hand, when a no-signal state has occurred due to loss of the input data 4, the selector 34 selects an IDLE signal 36 that is the complementary signal of the input data 4 in accordance with a switching signal 37. To always stabilize the operation of the PLL even when the input data 4 is intermittently lost, the IDLE signal 36 having almost the same frequency as the recovered clock 35 output from the VCO 33 is multiplexed and input to the clock recovery circuit 30 in the loss period (no-signal period). This stabilizes the operation of the clock recovery circuit 30, as shown in FIG. 43D.

DISCLOSURE OF INVENTION

Problem to be Solved by the Invention

In the signal multiplexing device shown in FIG. 42, however, when the no-signal state has occurred due to loss of the input data 4, the recovered data 6 output from the F/F 3 becomes a signal including the loss period. For this reason, when the CDR circuit compatible with a continuous signal is connected to the subsequent stage of the signal multiplexing device, the operation of the CDR circuit becomes unstable, and the response time of the CDR circuit to the signal becomes very long.

When the arrangement shown in FIG. 42 is applied to the PON system, the phase lock time of the clock recovery circuit itself also becomes long. The prolongation of the phase lock time occurs due to the random phase relationships between burst signals used as the up link signals of the PON system. In the worst case in which the IDLE signal 36 and the immediately succeeding burst signal have opposite phases, the phase relationship between the IDLE signal 36 and the burst signal abruptly reverses at the timing when the input data 4 switches from the no-signal to the burst signal. For this reason, the pull-in time required for phase lock of the PLL is long. Hence, the recovered data 6 identified/recovered by the recovered clock 7 at this time contains bit errors during the period corresponding to the pull-in time of the PLL from the start.

That is, in both a case in which the arrangement shown in FIG. 42 is applied to the PON system, that is, the arrangement is used as a signal multiplexing device that converts burst signals into continuous signals at the preceding stage of the control LSI of the OLT and a case in which the arrangement is used as a signal multiplexing device implemented on the serial input port of the control LSI, the large increase in the response time of the CDR circuit compatible with a continuous signal cannot be avoided. Hence, the up link transmission efficiency lowers.

It is an object of the present invention to solve the above-described conventional problem and implement a simple signal multiplexing device having a burst signal/continuous signal conversion function for enabling a general-purpose CDR circuit compatible with a continuous signal to respond at a high speed.

Means of Solution to the Problem

According to the present invention, there is provided a signal multiplexing device including a selection circuit that selects and outputs one of an input signal and at least one complementary signal of the input signal, a clock recovery circuit that adjusts a phase of a recovered clock to a timing of an output signal of the selection circuit and outputs the recovered clock in synchronism with the output signal of the selection circuit, and an identification circuit that performs identification/recovery of the output signal of the selection circuit based on the recovered clock, wherein a frequency of the recovered clock equals a frequency of the input signal, and a frequency of the complementary signal is an integral submultiple of the frequency of the recovered clock, and the selection circuit selects the complementary signal during part of a no-signal period of the input signal.

According to the present invention, there is also provided a signal multiplexing device including a clock recovery circuit that adjusts a phase of a recovered clock to a timing of an input signal and outputs the recovered clock in synchronism with the input signal, an identification circuit that performs identification/recovery of the input signal based on the recovered clock, and a selection circuit that selects and outputs one of an output signal of the identification circuit and at least one complementary signal of the output signal, wherein a frequency of the recovered clock equals a frequency of the input signal, and a frequency of the complementary signal is an integral submultiple of the frequency of the recovered clock, and the selection circuit selects the complementary signal during part of a no-signal period of the input signal.

Effects of the Invention

According to the present invention, the complementary signal is multiplexed during part of the no-signal period of the input signal, and the multiplexed continuous signal is identified/recovered. This makes it possible to output recovered data as the continuous signal. Hence, in the present invention, there is no concern about considerably lowering the response speed of a general-purpose CDR circuit compatible with a continuous signal and connected to the subsequent stage of the signal multiplexing device. This facilitates inputting a serial data signal to a control LSI including the general-purpose CDR circuit compatible with a continuous signal. Hence, in the present invention, since the serial data signal can easily be input to the control LSI including the general-purpose CDR circuit compatible with a continuous signal, it is possible to reduce the size, cost, and power consumption of the device for a PON system and improve the transmission efficiency of the PON system. Additionally, in the present invention, since it is possible to select one of a plurality of signals for which at least one of a frequency and a signal pattern changes, the problem of operation errors of the control LSI can be avoided.

According to the present invention, the complementary signal is multiplexed on the output signal of the identification circuit during part of the no-signal period of the input signal. This makes it possible to output recovered data as a continuous signal. In the present invention, there is no concern about considerably lowering the response speed of a general-purpose CDR circuit compatible with a continuous signal and connected to the subsequent stage of the signal multiplexing device. Hence, in the present invention, since a serial data signal can easily be input to a control LSI including the general-purpose CDR circuit compatible with a continuous signal, it is possible to reduce the size, cost, and power consumption of the device for a PON system and improve the transmission efficiency of the PON system. Additionally, in the present invention, since it is possible to select, as a complementary signal, one of a plurality of signals for which at least one of a frequency and a signal pattern changes, the problem of operation errors of the control LSI can be avoided.

BRIEF DESCRIPTION OF DRAWINGS

FIGS. 2A to 2F are timing charts for explaining the operation of the signal multiplexing device according to the first embodiment of the present invention;

FIGS. 6A to 6I are timing charts for explaining the operation of the signal multiplexing device according to the second embodiment of the present invention;

FIGS. 11A to 11I are timing charts for explaining the operation of the signal multiplexing device according to the fourth embodiment of the present invention;

FIGS. 16A to 16J are timing charts for explaining the operation of the signal multiplexing device according to the seventh embodiment of the present invention;

FIGS. 18A to 18J are timing charts for explaining the operation of the signal multiplexing device according to the eighth embodiment of the present invention;

FIGS. 23A to 23F are timing charts for explaining the operation of the signal multiplexing device according to the 11th embodiment of the present invention;

FIGS. 25A to 25H are timing charts for explaining the operation of the signal multiplexing device according to the 12th embodiment of the present invention;

FIGS. 27A to 27I are timing charts for explaining the operation of the signal multiplexing device according to the 13th embodiment of the present invention;

FIGS. 29A to 29J are timing charts for explaining the operation of the signal multiplexing device according to the 14th embodiment of the present invention;

FIGS. 31A to 31J are timing charts for explaining the operation of the signal multiplexing device according to the 15th embodiment of the present invention;

FIGS. 33A to 33H are timing charts for explaining the operation of the signal multiplexing device according to the 16th embodiment of the present invention;

FIGS. 43A to 43E are timing charts for explaining the operation of the conventional signal multiplexing device.

BEST MODE FOR CARRYING OUT THE INVENTION

[First Embodiment]

Figure 1:
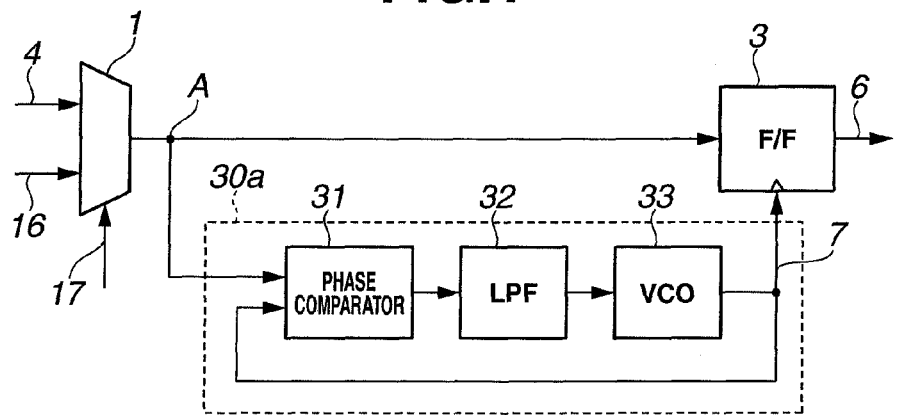
FIG. 1 is a block diagram showing the arrangement of a signal multiplexing device according to the first embodiment of the present invention.
Figure 42:
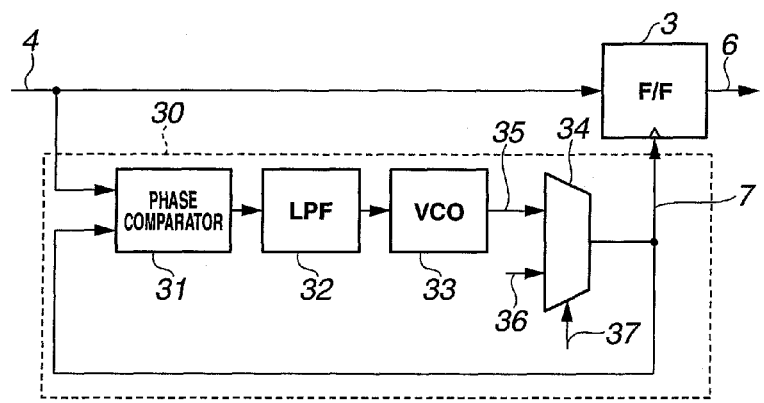
FIG. 42 is a block diagram showing the arrangement of a conventional signal multiplexing device.

An embodiment of the present invention will now be described with reference to the accompanying drawings. FIG. 1 is a block diagram showing the arrangement of a signal multiplexing device according to the first embodiment of the present invention. The same reference numerals as in FIG. 42 denote the same components. The signal multiplexing device according to this embodiment includes a selector 1 serving as a selection circuit, an F/F 3 serving as an identification circuit, and a clock recovery circuit 30a. The clock recovery circuit 30a includes a phase comparator 31, an LPF 32, and a VCO 33. As the major characteristic feature of the signal multiplexing device according to this embodiment, the selector 1 is provided at the input portion of the CDR circuit to select one of input data 4 and an IDLE signal 16 that is the complementary signal of the input data 4 based on a switching signal 17, thereby generating the input signal to the CDR core portion formed from the F/F 3 and the clock recovery circuit 30a. The main point of difference between the signal multiplexing device and the conventional signal multiplexing device shown in FIG. 42 is the arrangement position of the selector 1.

The operation of the signal multiplexing device according to this embodiment will be described with reference to the timing charts of FIGS. 2A to 2F. When a burst signal including a no-signal period is input as the input data 4, and the no-signal period is long, the operation of the PLL-type clock recovery circuit 30a becomes unstable. To solve this problem, the IDLE signal 16 is multiplexed on the input data 4 during the no-signal period, thereby always outputting a stable recovered clock 7. Multiplexing the IDLE signal 16 can be implemented by setting the switching signal 17 to be given to the selector 1 to High only during the no-signal period, as shown in FIG. 2C. When the switching signal 17 is High, the selector 1 selects and outputs the IDLE signal 16. When the switching signal 17 is Low, the selector 1 selects and outputs the input data 4.

The switching signal 17 necessary for switching control of the selector 1 can be supplied from a switching signal generation unit (not shown). As the switching signal generation unit, a MAC-IC that is an LSI having a PON system communication timing control function and a function of grasping the signal reception period is usable (see, for example, IEEE 802.3av standard). The switching signal 17 can also be generated using a no-signal detection circuit. The arrangement of the switching signal generation unit using the no-signal detection circuit is disclosed in, for example, Japanese Patent Laid-Open No. 3-166836.

Note that the selector 1 may select the IDLE signal 16 when the switching signal 17 is Low, as a matter of course.

The frequency of the IDLE signal 16 is preferably set to almost ½ the input data rate frequency. In this case, the IDLE signal 16 corresponds to a 0101 signal at the data rate of the input data 4 and includes pulses of the same period as the input data 4. The IDLE signal 16 can be generated by an oscillator (not shown) in synchronism with a system clock from the control LSI (MAC-IC) or a frequency divider (not shown) that divides the recovered clock 7 to ½. In addition, a pattern generation circuit (not shown) may be provided to make the IDLE signal have a specific repetitive pattern.

At a point A shown in FIG. 1, the IDLE signal 16 can thus be multiplexed on the burst signal to generate a continuous signal having a uniform frequency. When the IDLE signal 16 is supplied from an external oscillator having a high frequency stability, the uniformity of the frequency can easily be raised. The clock recovery circuit 30a can recover the clock only by phase-locking to the continuous signal having the almost constant frequency. It is therefore possible to output the recovered clock 7 always stably.

Details of the operation will be described below. The phase comparator 31 detects the phase difference between the multiplexed input signal and the recovered clock 7 output from the VCO 33. The LPF 32 extracts only the low-frequency component from the phase difference signal output from the phase comparator 31, and inputs it to the phase (frequency) control terminal of the VCO 33 as a control signal. The VCO 33 generates a clock in accordance with the voltage of the control signal, thereby outputting the recovered clock 7 having a frequency equal to that of the input data 4. Since the recovered clock 7 in synchronism with the IDLE signal 16 is output during the no-signal period of the input data 4, stable clock recovery can always be performed. The operation described above is the same as in the related art shown in FIG. 42.

On the other hand, in this embodiment, since the selector 1 is arranged not inside the clock recovery circuit 30a but at the input portion of the signal multiplexing device, the input signal to the F/F 3 is the continuous signal obtained by multiplexing the IDLE signal 16 during the no-signal period of the input data 4. The F/F 3 retimes the multiplexed continuous signal at a predetermined timing of the recovered clock 7 (for example, the leading edge of the recovered clock 7), thereby outputting recovered data 6. It is therefore possible to output the recovered data 6 as a continuous signal with low jitter.

As described above, in this embodiment, the recovered data 6 as a continuous signal having an almost constant frequency can be generated. For this reason, even when a general-purpose CDR circuit compatible with a continuous signal is connected to the subsequent stage of the signal multiplexing device, there is no concern about frequency step-out of the CDR circuit, and the CDR circuit compatible with a continuous signal can complete clock recovery and data recovery within its phase lock time. Additionally, in this embodiment, the signal multiplexing device has an identification/recovery function for the input data 4. For this reason, the distance between the optical receiving device and the CDR circuit compatible with a continuous signal can be increased even when transmitting a high-speed signal, and the degree of freedom of the device arrangement can be improved.

Furthermore, the signal multiplexing device according to this embodiment serves as a means for transferring a continuous signal between the optical receiving device and the CDR circuit compatible with a continuous signal. Hence, capacitive coupling with the CDR circuit is possible, and the signal multiplexing device can easily be connected to a CDR circuit of different DC level. As described above, in this embodiment, a means capable of multiplexing a burst signal and an IDLE signal can be provided by a simple arrangement, and serial data can directly be input to a control LSI including a general-purpose CDR circuit compatible with a continuous signal. It is therefore possible to reduce the size, cost, and power consumption of the device for the PON system and improve the transmission efficiency of the PON system.

Note that the frequency of the IDLE signal 16 is not limited to ½ the input data rate frequency. The frequency need only be an integral submultiple of the input data rate frequency and may be, for example, ¼ the input data rate frequency.

[Second Embodiment]

Figure 3:
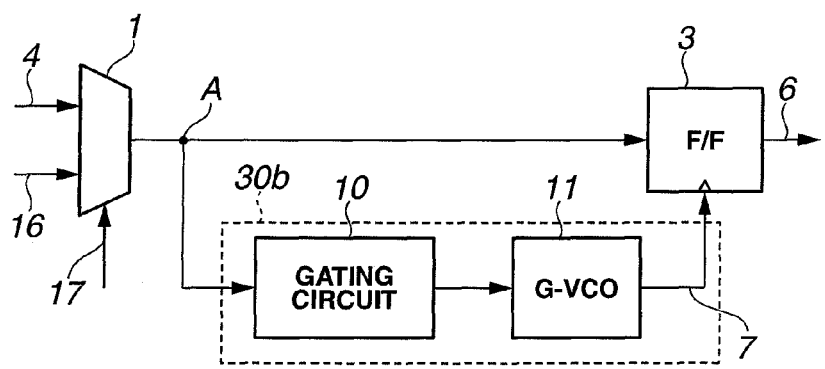
FIG. 3 is a block diagram showing the arrangement of a signal multiplexing device according to the second embodiment of the present invention.

The second embodiment of the present invention will be described next. FIG. 3 is a block diagram showing the arrangement of a signal multiplexing device according to the second embodiment of the present invention. The same reference numerals as in FIG. 1 denote the same components. The signal multiplexing device according to this embodiment includes a selector 1, an F/F 3, and a clock recovery circuit 30b. The point of difference from the first embodiment shown in FIG. 1 is that the clock recovery circuit 30b includes a gating circuit 10 and a gated VCO (to be referred to as a G-VCO hereinafter) 11 that is a gated voltage controlled oscillator.

Figure 4:
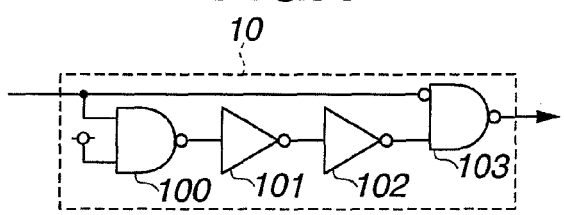
FIG. 4 is a circuit diagram showing an example of the arrangement of a gating circuit in the signal multiplexing device according to the second embodiment of the present invention.

FIG. 4 is a circuit diagram showing an example of the arrangement of the gating circuit 10. The gating circuit 10 includes a NAND 100 having one input terminal receiving the output signal of the selector 1 and the other input terminal pulled up, an inverter 101 that receives the output of the NAND 100, an inverter 102 that receives the output of the inverter 101, and a NAND 103 having one input terminal receiving the output signal of the selector 1 and the other input terminal receiving the output of the inverter 102.

Figure 5:
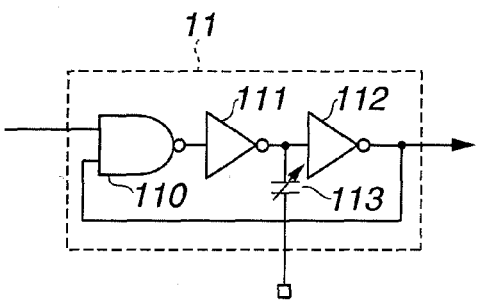
FIG. 5 is a circuit diagram showing an example of the arrangement of a gated voltage controlled oscillator in the signal multiplexing device according to the second embodiment of the present invention.

The G-VCO 11 includes a gate circuit capable of controlling the oscillation start timing in a normal ring oscillation circuit formed from a multistage variable delay inverter, as disclosed in literature J. Terada, et al., "Jitter-reduction and pulse-width-distortion compensation circuits for a 10 Gb/s burst-mode CDR circuit", in 2009 IEEE International Solid-State Circuits Conference Digest, pp. 104-106, February 2009. FIG. 5 is a circuit diagram showing an example of the arrangement of the G-VCO 11. The G-VCO 11 includes a NAND 110 having one input terminal receiving the output of the gating circuit 10 and the other input terminal receiving the output of the G-VCO 11, an inverter 111 that receives the output of the NAND 110, an inverter 112 that receives the output of the inverter 111, and a variable capacitor 113 having one terminal connected to the output terminal of the inverter 111 and the input terminal of the inverter 112 and the capacitance control terminal as the other terminal connected to the frequency control terminal of the G-VCO 11. Note that in this embodiment, the frequency control terminal of the G-VCO 11 is given a potential that makes the frequency of a recovered clock 7 output from the G-VCO 11 equal to the input data rate frequency.

The operation of the signal multiplexing device according to this embodiment will be described mainly concerning the points of difference from the first embodiment. FIGS. 6A to 6I are timing charts for explaining the operation of the signal multiplexing device according to this embodiment. Note that FIG. 6A shows input data 4 when the phase of the second burst signal delays by a ¼ bit, and FIG. 6B shows the input data 4 without phase delay. All of the signal (the signal at a point A in FIG. 3) in FIG. 6E, the output of the gating circuit 10 in FIG. 6F, the recovered clock 7 in FIG. 6H, and recovered data 6 in FIG. 6I are illustrated for the case in which the phase of the burst signal delays by a ¼ bit. The output of the gating circuit 10 in FIG. 6G is illustrated for the case in which the input data 4 has no phase delay.

The gating circuit 10 outputs an edge pulse that falls when the input signal makes a transition from "0" to "1" and rises after, for example, T/2 (T is the period of the input data 4), and has a width of T/2.

The phase of the recovered clock 7 output from the G-VCO 11 is controlled by the edge pulse output from the gating circuit 10. That is, the G-VCO 11 is reset and outputs "0" when an edge pulse having a value of, for example, "0" is output from the gating circuit 10, starts oscillating at the instant of ending the edge pulse output and changing the output of the gating circuit 10 to "1", and continues oscillating during the time when the output of the gating circuit 10 is "1". When the G-VCO 11 oscillates at a frequency equal to the data rate frequency of the input data 4, adjustment is done to make the phase of the recovered clock 7 instantaneously match the phase of the input data 4.

As described above, since the recovered clock 7 that instantaneously synchronizes with the transition of the edge pulse can be output, quick response is possible even when the relative phases of the burst signals shift, unlike the first embodiment. As in the first embodiment, when the frequency of an IDLE signal 16 is set to almost ½ the input data rate frequency, a multiplexed signal (continuous signal) formed by multiplexing the IDLE signal 16 having an almost uniform data rate frequency during the no-signal period of the input data 4 can be generated. When the IDLE signal 16 is supplied from an external oscillator having a high frequency stability, the uniformity of the frequency can easily be raised.

Multiplexing the IDLE signal 16 can be implemented by setting a switching signal 17 to be given to the selector 1 to High only during the no-signal period, as shown in FIG. 6D. The switching signal 17 necessary for switching control of the selector 1 can be supplied from a switching signal generation unit (not shown). As the switching signal generation unit, a MAC-IC described in the first embodiment is usable. The switching signal 17 can also be generated using a no-signal detection circuit. The arrangement of the switching signal generation unit using the no-signal detection circuit is disclosed in, for example, Japanese Patent Laid-Open No. 3-166836.

Note that the selector 1 may select the IDLE signal 16 when the switching signal 17 is Low, as described in the first embodiment.

The gating circuit 10 outputs the edge pulse when the input data 4 makes a transition from "0" to "1". For this reason, if the phase delays by a ¼ bit relative to the first burst signal and the immediately preceding IDLE signal 16, like the second burst signal shown in FIG. 6A, the gating circuit 10 starts outputting the edge pulse reflecting the delay at the timing of the second burst signal. During the no-signal period immediately after the end of the second burst signal shown in FIG. 6A, the gating circuit 10 outputs the edge pulse when the IDLE signal 16 makes a transition from "0" to "1". The operation of the gating circuit 10 indicates that it can output the edge pulse in synchronism with the burst signal and the IDLE signal 16 input in any phase.

The oscillation phase of the G-VCO 11 is instantaneously controlled by the edge pulse output from the gating circuit 10. Hence, the G-VCO 11 can output the recovered clock 7 in synchronism with the burst signal and the IDLE signal 16 input in any phase from the start of these signals.

In this embodiment, the input signal to the F/F 3 (the signal at the point A shown in FIG. 3) is the continuous signal obtained by multiplexing the input data 4 and the IDLE signal 16. Hence, when the F/F 3 identifies/recovers the input signal using the recovered clock 7, the continuous signal free from bit errors can be output as the recovered data 6.

As described above, in this embodiment, the recovered data 6 as a continuous signal having an almost constant frequency can be generated. For this reason, even when a general-purpose CDR circuit compatible with a continuous signal is connected to the subsequent stage of the signal multiplexing device, there is no concern about frequency step-out of the CDR circuit, and the CDR circuit compatible with a continuous signal can complete clock recovery and data recovery within its phase lock time. Additionally, in this embodiment, the signal multiplexing device has an identification/recovery function for the input data 4. For this reason, the distance between the optical receiving device and the CDR circuit compatible with a continuous signal can be increased even when transmitting a high-speed signal, and the degree of freedom of the device arrangement can be improved.

Furthermore, the signal multiplexing device according to this embodiment serves as a means for transferring a continuous signal between the optical receiving device and the CDR circuit compatible with a continuous signal. Hence, capacitive coupling with the CDR circuit is possible, and the signal multiplexing device can easily be connected to a CDR circuit of different DC level. As described above, in this embodiment, a means capable of multiplexing a burst signal and an IDLE signal can be provided by a simple arrangement, and serial data can directly be input to a control LSI including a general-purpose CDR circuit compatible with a continuous signal. It is therefore possible to reduce the size, cost, and power consumption of the device for the PON system and improve the transmission efficiency of the PON system.

Note that the frequency of the IDLE signal 16 is not limited to ½ the input data rate frequency. The frequency need only be an integral submultiple of the input data rate frequency and may be, for example, ¼ the input data rate frequency.

[Third Embodiment]

Figure 7:
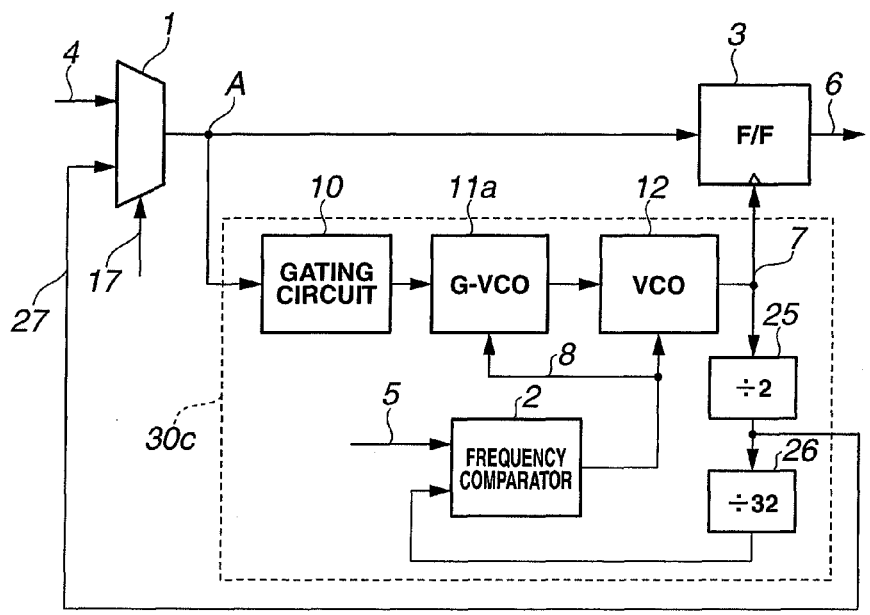
FIG. 7 is a block diagram showing the arrangement of a signal multiplexing device according to the third embodiment of the present invention.

The third embodiment of the present invention will be described next. FIG. 7 is a block diagram showing the arrangement of a signal multiplexing device according to the third embodiment of the present invention. The same reference numerals as in FIGS. 1 and 3 denote the same components. The signal multiplexing device according to this embodiment includes a selector 1, an F/F 3, and a clock recovery circuit 30c. The main points of difference from the second embodiment shown in FIG. 3 are that a VCO 12 is provided at the subsequent stage of a G-VCO 11a, and a ½ frequency-divided signal of a recovered clock 7 output from the VCO 12 is used as an IDLE signal 27. In addition to the VCO 12, a frequency comparator 2 and frequency dividers 25 and 26 are added to the clock recovery circuit 30c. The frequency comparator 2, the VCO 12, and the frequency dividers 25 and 26 form a frequency synchronization loop. Furthermore, the frequency divider 25 forms a feedback circuit that inputs the ½ frequency-divided signal of the recovered clock 7 to the selector 1 as the IDLE signal 27.

The frequency divider 25 divides the recovered clock 7 output from the VCO 12 to ½. The frequency divider 26 divides the clock output from the frequency divider 25 to 1/32. As a result, a 1/64 frequency-divided signal of the recovered clock 7 is input to the frequency comparator 2. The frequency comparator 2 generates a voltage (frequency control signal 8) that reflects the frequency difference between the frequency of the 1/64 frequency-divided signal of the recovered clock 7 and the frequency of a reference clock 5 whose frequency is 1/64 the input data rate frequency. The frequency comparator 2 and the frequency dividers 25 and 26 thus perform closed-loop control so as to make the frequency of the frequency-divided signal of the recovered clock 7 match the frequency of the reference clock 5. The frequency control signal 8 generated by the closed-loop control is input not only to the VCO 12 but also to the frequency control terminal of the G-VCO 11a.

The VCO 12 preferably has the same circuit arrangement as that of the G-VCO 11a. Each of the G-VCO 11a and the VCO 12 includes a gate circuit capable of controlling the oscillation start timing in a normal ring oscillation circuit formed from a multistage variable delay inverter, as disclosed in, for example, literature J. Terada, et al., "Jitter-reduction and pulse-width-distortion compensation circuits for a 10 Gb/s burst-mode CDR circuit", in 2009 IEEE International Solid-State Circuits Conference Digest, pp. 104-106, February 2009.

Figure 8:
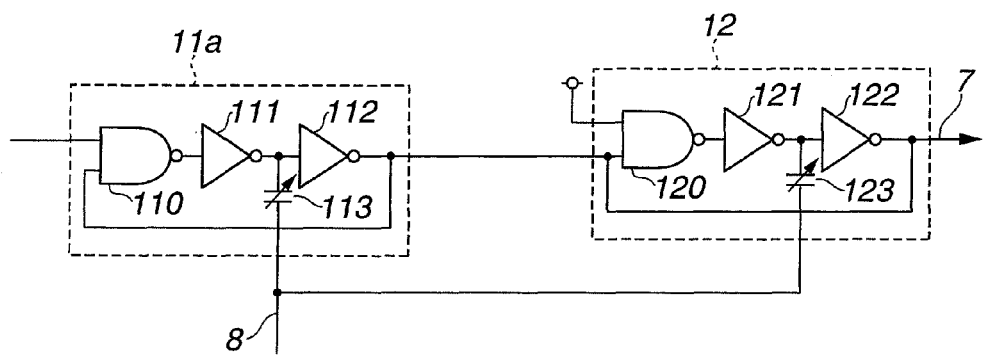
FIG. 8 is a circuit diagram showing an example of the arrangement of a gated voltage controlled oscillator and a voltage controlled oscillator in the signal multiplexing device according to the third embodiment of the present invention.

FIG. 8 is a circuit diagram showing an example of the arrangement of the G-VCO 11a and the VCO 12. The G-VCO 11a has the same arrangement as that of the G-VCO 11 of the second embodiment. The VCO 12 includes a NAND 120 having one input terminal pulled up and the other input terminal (the input terminal of the VCO 12) receiving the clock output from the G-VCO 11a and the recovered clock 7 that is the output of the VCO 12, an inverter 121 that receives the output of the NAND 120, an inverter 122 that receives the output of the inverter 121 and outputs the recovered clock 7, and a variable capacitor 123 having one terminal connected to the output terminal of the inverter 121 and the input terminal of the inverter 122 and the capacitance control terminal as the other terminal connected to the frequency control terminal of the VCO 12.

When the same frequency control signal 8 generated by the frequency synchronization loop is input to the frequency control terminal of the G-VCO 11a and the frequency control terminal of the VCO 12 having the above-described arrangements, the oscillation frequencies of the G-VCO 11a and the VCO 12 can be made to match the input data rate frequency. When the input data having the same data rate frequency as the clock frequency is input to the clock recovery circuit 30c whose clock frequency has been stabilized in the above-described way, quick and stable phase lock can be established even during the consecutive identical digit period.

Figure 9:
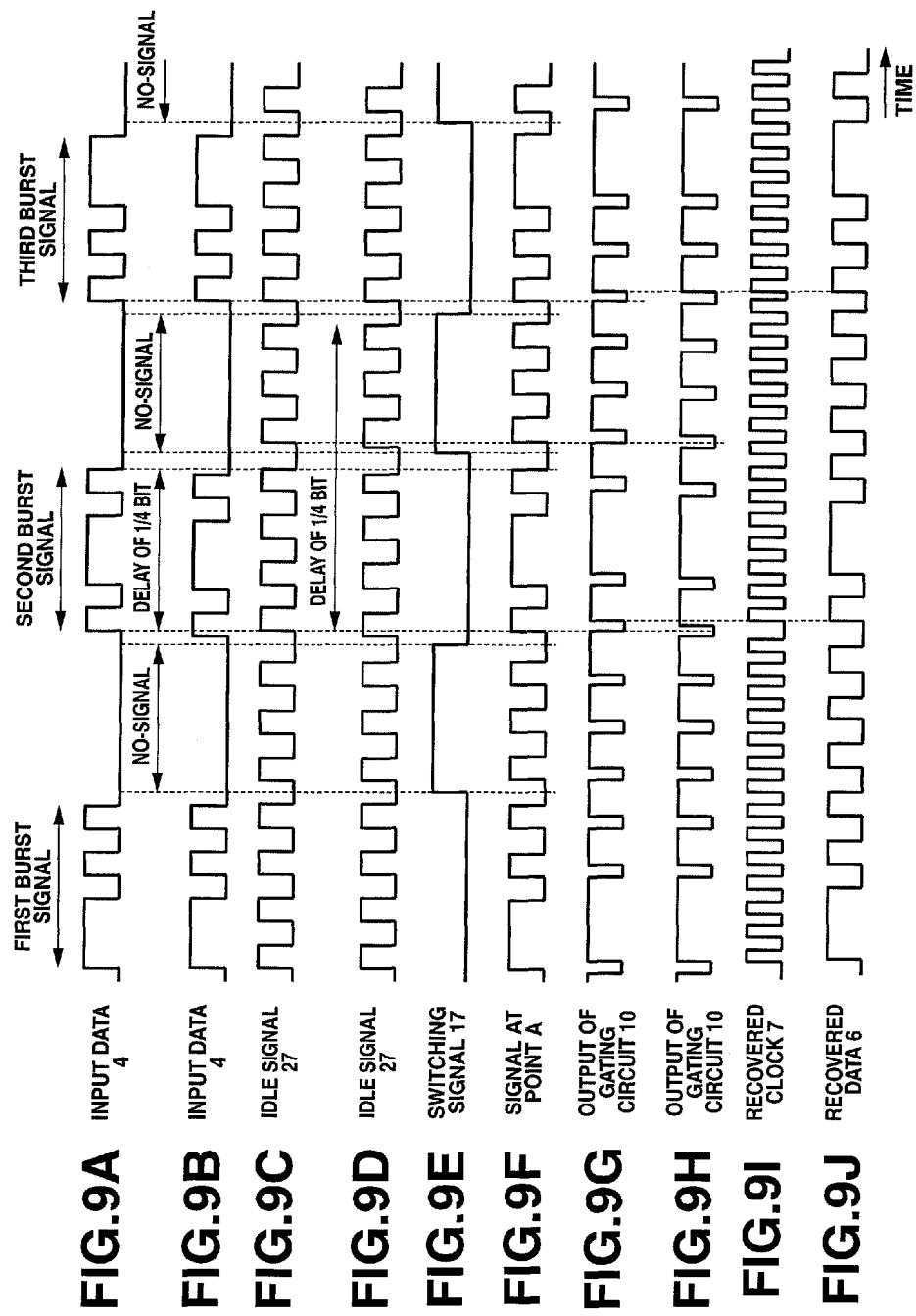
FIGS. 9A to 9J are timing charts for explaining the operation of the signal multiplexing device according to the third embodiment of the present invention.

The operation of the signal multiplexing device according to this embodiment will be described next. FIGS. 9A to 9J are timing charts for explaining the operation of the signal multiplexing device according to this embodiment. Note that FIG. 9A shows input data 4 when the phase of the second burst signal delays by a ¼ bit, and FIG. 9B shows the input data 4 without phase delay. All of the IDLE signal 27 in FIG. 9C, the signal (the signal at a point A in FIG. 7) in FIG. 9F, the output of the gating circuit 10 in FIG. 9G, the recovered clock 7 in FIG. 9I, and recovered data 6 in FIG. 9J are illustrated for the case in which the phase of the burst signal delays by a ¼ bit. The IDLE signal 27 in FIG. 9D and the output of the gating circuit 10 in FIG. 9H are illustrated for the case in which the input data 4 has no phase delay.

The gating circuit 10 outputs an edge pulse that falls when the input signal makes a transition from "0" to "1" and rises after, for example, T/2 (T is the period of the input data 4), and has a width of T/2.

The G-VCO 11a is reset and outputs "0" when an edge pulse having a value of, for example, "0" is output from the gating circuit 10, starts oscillating at the instant of ending the edge pulse output and changing the output of the gating circuit 10 to "1", and continues oscillating during the time when the output of the gating circuit 10 is "1". In this way, the G-VCO 11a adjusts to make the phase of the output clock instantaneously match the phase of the input data 4.

The clock output from the G-VCO 11a in phase with the input data 4 and the recovered clock 7 that is the output of the VCO 12 itself are input to the VCO 12 in a superimposed manner. For this reason, the phase of the recovered clock 7 is adjusted so as to match the phase of the output clock of the G-VCO 11a (that is, match the phase of the input data 4). However, since the phase of the recovered clock 7 is also affected by the feedback signal of the VCO 12 itself, the influence of the output of the G-VCO 11a on the phase of the recovered clock 7 is reduced. Hence, even when the jitter of the output clock of the G-VCO 11a increases in accordance with the jitter of the input data 4, the recovered clock 7 is hardly affected by the output of the G-VCO 11a, and the jitter of the recovered clock 7 can be reduced. The ability of suppressing the jitter spells degradation in the instantaneous response characteristic to the input data 4. However, as compared to the signal multiplexing device using a PLL-type clock recovery circuit shown in FIG. 42 or 1, the signal multiplexing device of this embodiment can maintain a much quicker response (within several bits).

As described above, in this embodiment, since the recovered clock 7 that quickly synchronizes with the transition of the edge pulse output from the gating circuit 10 can be output, a normal operation is performed even when the relative phases of the burst signals shift, unlike the first embodiment. In this embodiment, since the ½ frequency-divided signal of the recovered clock 7 is used as the IDLE signal 27, a multiplexed signal having an almost uniform frequency can be generated by multiplexing the IDLE signal 27 during the no-signal period of the burst signal, as in the first and second embodiments. In this embodiment, since the IDLE signal 27 is extracted from the clock recovery circuit 30c, an external oscillation circuit is unnecessary, and the size and power consumption of the signal multiplexing device can be reduced.

Multiplexing the IDLE signal 27 can be implemented by setting a switching signal 17 to be given to the selector 1 to High only during the no-signal period, as shown in FIG. 9E. A switching signal generation unit for outputting the switching signal 17 can be implemented by the arrangement described in the first and second embodiments. The selector 1 may select the IDLE signal 27 when the switching signal 17 is Low, as in the first and second embodiments.

The gating circuit 10 outputs the edge pulse when the input data 4 makes a transition from "0" to "1". For this reason, if the phase delays by a ¼ bit relative to the first burst signal and the immediately preceding IDLE signal 27, like the second burst signal shown in FIG. 9A, the gating circuit 10 starts outputting the edge pulse reflecting the delay at the timing of the second burst signal. During the no-signal period immediately after the end of the second burst signal shown in FIG. 9A, the gating circuit 10 outputs the edge pulse when the IDLE signal 27 makes a transition from "0" to "1". The operation of the gating circuit 10 indicates that it can output the edge pulse in synchronism with the burst signal and the IDLE signal 27 input in any phase.

The oscillation phase of the VCO 12 is quickly controlled by the pulse output from the gating circuit 10 via the G-VCO 11a. Hence, the VCO 12 can output the recovered clock 7 with little jitter in synchronism with the burst signal and the IDLE signal 27 input in any phase from almost the start of these signals.

In this embodiment, the input signal to the F/F 3 (the signal at the point A shown in FIG. 7) is the continuous signal obtained by multiplexing the input data 4 and the IDLE signal 27. Hence, when the F/F 3 identifies/recovers the input signal using the recovered clock 7, the continuous signal free from bit errors can be output as the recovered data 6.

As described above, in this embodiment, the recovered data 6 as a low-jitter continuous signal having an almost constant frequency can be generated. For this reason, even when a general-purpose CDR circuit compatible with a continuous signal is connected to the subsequent stage of the signal multiplexing device, there is no concern about frequency step-out of the CDR circuit, and the CDR circuit compatible with a continuous signal can complete clock recovery and data recovery within its phase lock time. Additionally, in this embodiment, the signal multiplexing device has an identification/recovery function for the input data 4. For this reason, the distance between the optical receiving device and the CDR circuit compatible with a continuous signal can be increased even when transmitting a high-speed signal, and the degree of freedom of the device arrangement can be improved.

Furthermore, the signal multiplexing device according to this embodiment serves as a means for transferring a continuous signal between the optical receiving device and the CDR circuit compatible with a continuous signal. Hence, capacitive coupling with the CDR circuit is possible, and the signal multiplexing device can easily be connected to a CDR circuit of different DC level. As described above, in this embodiment, a means capable of multiplexing a burst signal and an IDLE signal can be provided by a simple arrangement, and serial data can directly be input to a control LSI including a general-purpose CDR circuit compatible with a continuous signal. It is therefore possible to reduce the size, cost, and power consumption of the device for the PON system and improve the transmission efficiency of the PON system.

Note that the frequency of the IDLE signal 27 need only be an integral submultiple of the frequency of the recovered clock 7 (input data rate frequency).

The frequency of the reference clock 5 is not limited to 1/64 the input data rate frequency and may be 1/32 or the like. That is, when the total division ratio of the frequency dividers 25 and 26 is n (n is an integer of 2 or more), the frequency of the recovered clock 7 can be stabilized by inputting the reference clock 5 whose frequency is 1/n the input data rate frequency to the frequency comparator 2.

[Fourth Embodiment]

Figure 10:
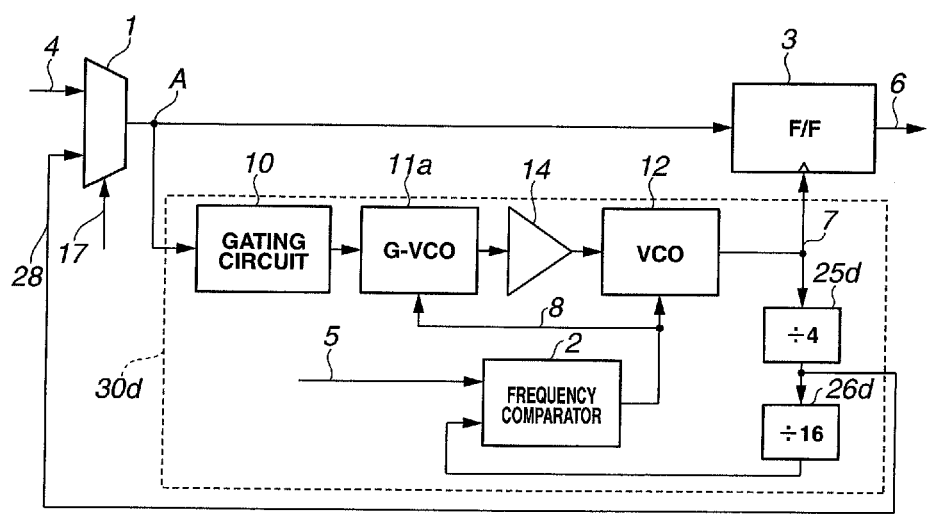
FIG. 10 is a block diagram showing the arrangement of a signal multiplexing device according to the fourth embodiment of the present invention.

The fourth embodiment of the present invention will be described next. FIG. 10 is a block diagram showing the arrangement of a signal multiplexing device according to the fourth embodiment of the present invention. The same reference numerals as in FIGS. 1, 3, and 7 denote the same components. The signal multiplexing device according to this embodiment includes a selector 1, an F/F 3, and a clock recovery circuit 30d. The points of difference from the third embodiment shown in FIG. 7 are that a buffer amplifier 14 is arranged between the output of a G-VCO 11a and the input of a VCO 12, the frequency divider 25 having a division ratio of 2 is changed to a frequency divider 25d having a division ratio of 4, and the frequency divider 26 having a division ratio of 32 is changed to a frequency divider 26d having a division ratio of 16. In this embodiment, since the division ratio of the frequency divider 25d is 4, the ¼ frequency-divided signal of a recovered clock 7 is used as an IDLE signal 28. The frequency divider 25d forms a feedback circuit that inputs the ¼ frequency-divided signal of the recovered clock 7 to the selector 1 as the IDLE signal 28.

The arrangements of the G-VCO 11a and the VCO 12 are the same as described in the third embodiment. When the same frequency control signal 8 generated by the frequency synchronization loop is input to the frequency control terminal of the G-VCO 11a and that of the VCO 12, the oscillation frequencies of the G-VCO 11a and the VCO 12 can be made to match the input data rate frequency. When the input data having the same data rate frequency as the clock frequency is input to the clock recovery circuit 30d whose clock frequency has been stabilized in the above-described way, quick and stable phase lock can be established even during the consecutive identical digit period.

The operation of the signal multiplexing device according to this embodiment will be described next. FIGS. 11A to 11I are timing charts for explaining the operation of the signal multiplexing device according to this embodiment. Note that FIG. 11A shows input data 4 when the phase of the second burst signal delays by a ½ bit, and FIG. 11B shows the input data 4 without phase delay. All of the signal (the signal at a point A in FIG. 10) in FIG. 11E, the output of a gating circuit 10 in FIG. 11F, and the recovered clocks 7 in FIGS. 11G and 11H are illustrated for the case in which the phase of the burst signal delays by a ½ bit. Out of FIGS. 11G to 11I, the recovered clock 7 shown in FIG. 11G is a clock output by the signal multiplexing device according to this embodiment. The recovered clock 7 shown in FIG. 11H is a clock output when the buffer amplifier 14 is removed, and the G-VCO 11a and the VCO 12 are directly connected. The recovered clock 7 shown in FIG. 11I is a clock when recovery is performed at a timing immediately before the second burst signal.

The operations of the gating circuit 10 and the G-VCO 11a are the same as in the third embodiment, and a description thereof will be omitted.

The clock output from the G-VCO 11a in phase with the input data 4 and the recovered clock 7 that is the output of the VCO 12 itself are input to the VCO 12 in a superimposed manner. For this reason, the phase of the recovered clock 7 is adjusted so as to match the phase of the output clock of the G-VCO 11a (that is, match the phase of the input data 4). However, since the phase of the recovered clock 7 is also affected by the feedback signal of the VCO 12 itself, the influence of the output of the G-VCO 11a on the phase of the recovered clock 7 is reduced.

Additionally, in this embodiment, the buffer amplifier 14 is provided between the G-VCO 11a and the VCO 12. Since the buffer amplifier 14 attenuates the output signal of the G-VCO 11a, the influence of the G-VCO 11a on the phase of the recovered clock 7 is further reduced. As described above, when the buffer amplifier 14 is provided, the response time required for the phase lock of the recovered clock 7 becomes long. It is therefore possible to relax the abrupt phase change between the IDLE signal 28 and the burst signal.

As the IDLE signal 28, the ¼ frequency-divided signal of the recovered clock 7, which is equivalent to a 0011 signal at the data rate of the input data 4, is used. Hence, a multiplexed signal (continuous signal) formed by multiplexing the IDLE signal 28 having an almost uniform data rate frequency during the no-signal period of the input data 4 can be obtained, as shown in FIG. 11E. Multiplexing the IDLE signal 28 can be implemented by setting a switching signal 17 to be given to the selector 1 to High only during the no-signal period, as shown in FIG. 11D. A switching signal generation unit for outputting the switching signal 17 can be implemented by the arrangement described in the first to third embodiments. The selector 1 may select the IDLE signal 28 when the switching signal 17 is Low, as in the first to third embodiments.

The gating circuit 10 outputs the edge pulse when the input data 4 makes a transition from "0" to "1". For this reason, if the phase delays by a ½ bit relative to the first burst signal and the immediately preceding IDLE signal 28, like the second burst signal shown in FIG. 11A, the gating circuit 10 starts outputting the edge pulse reflecting the delay at the timing of the second burst signal. The operation described above is the same as in the third embodiment.

The edge pulse output from the gating circuit 10 is input to the VCO 12 via the G-VCO 11a and the buffer amplifier 14. Since the output signal of the G-VCO 11a is attenuated by the buffer amplifier 14 and then input to the VCO 12, the phase lock establishment of the VCO 12 delays. In the example shown in FIG. 11G, the response time (delay of phase lock establishment) at this time is represented by a time from t0 to t1. In this example, the phase lock establishment delays by 8 bits.

FIG. 11H shows the recovered clock 7 when the buffer amplifier 14 is removed, and the G-VCO 11a and the VCO 12 are directly connected. In this case, the VCO 12 synchronizes the phase with the output signal of the G-VCO 11a almost instantaneously.

Figure 12:
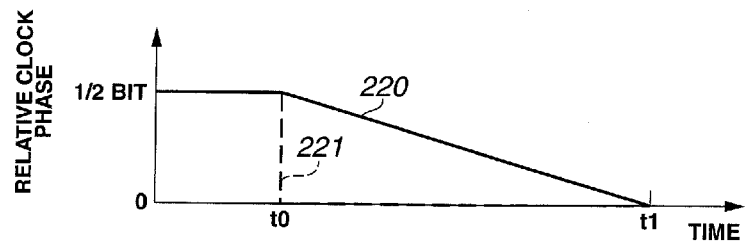
FIG. 12 is a timing chart showing the phase change of a recovered clock when an input signal to a gating circuit changes from an IDLE signal to a second burst signal in the fourth embodiment of the present invention.

FIG. 12 shows the phase change of the recovered clocks 7 shown in FIGS. 11G and 11H when the input signal to the gating circuit 10 changes from the IDLE signal 28 to the second burst signal. In FIG. 12, 220 represents the phase change of the recovered clock 7 according to this embodiment shown in FIG. 11G, and 221 represents the phase change of the recovered clock 7 shown in FIG. 11H. In FIG. 11H where the clock recovery circuit 30d instantaneously establishes phase lock, the phase of the recovered clock 7 abruptly changes at t0, as indicated by 221. On the other hand, according to this embodiment, the operation is performed such that the phase state immediately before the second burst shown in FIG. 11I continues at t0, the phase lock is gradually established during the period from t0 to t1, and the state corresponding to the instantaneous response characteristic shown in FIG. 11H is obtained at t1. In this way, the phase change of the recovered clock 7 can be smoothed as indicated by 220.

In this embodiment, the input signal to the F/F 3 (the signal at the point A shown in FIG. 10) is the continuous signal obtained by multiplexing the input data 4 and the IDLE signal 28. When the F/F 3 identifies/recovers the input signal using the recovered clock 7 whose abrupt phase change is relaxed as described with reference to FIG. 12, the low-jitter continuous signal having an almost constant frequency and a phase smoothly changing between the IDLE signal section and the burst signal section can be output as recovered data 6.

By outputting the recovered data 6, in this embodiment, even when a general-purpose CDR circuit compatible with a continuous signal is connected to the subsequent stage of the signal multiplexing device, there is no concern about frequency step-out of the CDR circuit. At the same time, since the phase change of the recovered data 6 is smooth, the time required for the phase lock of the CDR circuit compatible with a continuous signal can greatly be shortened. Hence, quicker clock recovery and data recovery are possible. Additionally, in this embodiment, the signal multiplexing device has an identification/recovery function for the input data 4. For this reason, the distance between the optical receiving device and the CDR circuit compatible with a continuous signal can be increased even when transmitting a high-speed signal, and the degree of freedom of the device arrangement can be improved.

Furthermore, the signal multiplexing device according to this embodiment serves as a means for transferring a continuous signal between the optical receiving device and the CDR circuit compatible with a continuous signal. Hence, capacitive coupling with the CDR circuit is possible, and the signal multiplexing device can easily be connected to a CDR circuit of different DC level. As described above, in this embodiment, a means capable of multiplexing a burst signal and an IDLE signal can be provided by a simple arrangement, and serial data can directly be input to a control LSI including a general-purpose CDR circuit compatible with a continuous signal. It is therefore possible to reduce the size, cost, and power consumption of the device for the PON system and further improve the transmission efficiency of the PON system.

Note that the frequency of the IDLE signal 28 need only be an integral submultiple of the frequency of the recovered clock 7 (input data rate frequency).

The frequency of a reference clock 5 is not limited to 1/64 the input data rate frequency and may be 1/16 or the like. That is, when the total division ratio of the frequency dividers 25d and 26d is n (n is an integer of 2 or more), the frequency of the recovered clock 7 can be stabilized by inputting the reference clock 5 whose frequency is 1/n the input data rate frequency to the frequency comparator 2.

[Fifth Embodiment]

Figure 13:
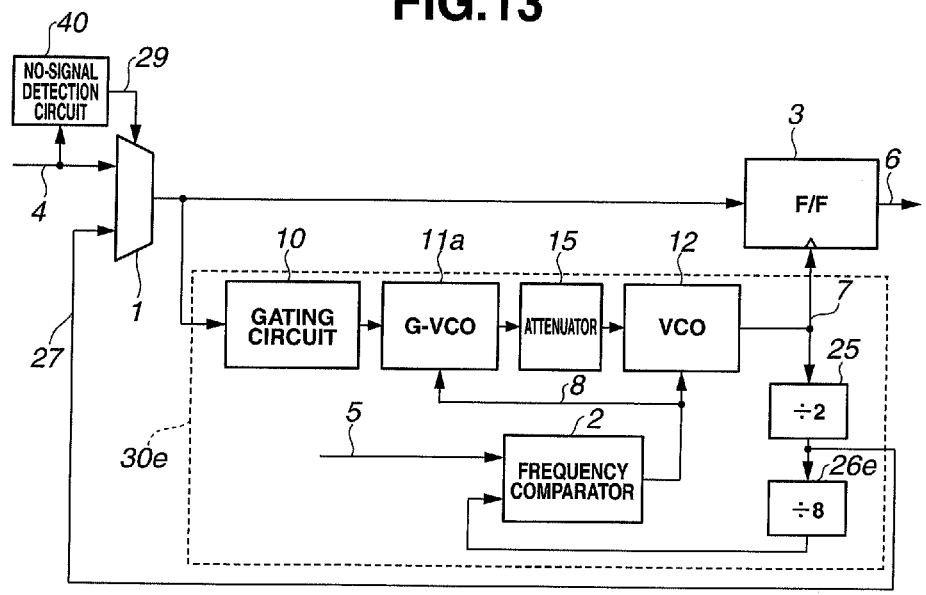
FIG. 13 is a block diagram showing the arrangement of a signal multiplexing device according to the fifth embodiment of the present invention.

The fifth embodiment of the present invention will be described next. FIG. 13 is a block diagram showing the arrangement of a signal multiplexing device according to the fifth embodiment of the present invention. The same reference numerals as in FIGS. 1, 3, 7, and 10 denote the same components. The signal multiplexing device according to this embodiment includes a selector 1, an F/F 3, a clock recovery circuit 30e, and a no-signal detection circuit 40 serving as a switching signal generation unit. The points of difference from the fourth embodiment shown in FIG. 10 are that an attenuator 15 is provided in place of the buffer amplifier 14, the frequency divider 25d having a division ratio of 4 is changed to a frequency divider 25 having a division ratio of 2, the frequency divider 26d having a division ratio of 16 is changed to a frequency divider 26e having a division ratio of 8, and the no-signal detection circuit 40 for detecting the no-signal period of input data 4 is provided.

Since the division ratio of the frequency divider 25 is 2, the frequency of an IDLE signal 27 is higher by twice than in the fourth embodiment. However, as in the third embodiment, a multiplexed signal formed by multiplexing the IDLE signal 27 having an almost uniform data rate frequency during the no-signal period of the burst signal can be generated.

Since the total division ratio of the frequency dividers 25 and 26e is 16, the frequency-divided signal input to a frequency comparator 2 also has a frequency 1/16 the input data rate frequency. However, when the frequency of a reference clock 5 is also set to 1/16 the input data rate frequency, the frequency comparator 2 normally operates.

In this embodiment, the attenuator 15 is provided between the output of a G-VCO 11a and the input of a VCO 12. Since the output signal of the G-VCO 11a is attenuated and then input to the VCO 12, the response time needed for phase lock of a recovered clock 7 becomes long, as in the fourth embodiment shown in FIG. 10, and the abrupt phase change between the IDLE signal 27 and the burst signal can be relaxed. The attenuator 15 can be formed from a passive element. It is therefore possible to reduce the size and power consumption of the circuit and improve the yield, as compared to the fourth embodiment in which the buffer amplifier 14 is used.

Additionally, in this embodiment, the no-signal detection circuit 40 is provided, and its detection output is used as a switching signal 29 to the selector 1. It is therefore possible to reliably detect the no-signal period even, for example, in case of a failure of the ONU which is difficult to grasp in the upper layer such as a MAC, and generate the multiplexed signal formed by multiplexing the IDLE signal 27 during the no-signal period of the burst signal. As the no-signal detection circuit 40, for example, a comparator for comparing the input data 4 and a predetermined threshold is usable. When the level of the input data 4 is equal to or lower than the threshold, the comparator determines the no-signal state and outputs the switching signal 29 of High level. The selector 1 selects and outputs the IDLE signal 27 in accordance with the switching signal 29.

In this embodiment, since the signal multiplexing device can solely execute the operation of multiplexing the IDLE signal 27 during the no-signal period of the burst signal without an external no-signal detection circuit, the degree of freedom of the connectable device can be improved, and the size and cost of the device can be reduced. Additionally, in this embodiment as well, the recovered clock 7 whose abrupt phase change is relaxed can be recovered, as in the fourth embodiment shown in FIG. 10. When the F/F 3 identifies/recovers the input signal using the recovered clock 7, the low-jitter continuous signal having an almost constant frequency and a phase smoothly changing between the IDLE signal section and the burst signal section can be output as recovered data 6.

By outputting the recovered data 6, in this embodiment, even when a general-purpose CDR circuit compatible with a continuous signal is connected to the subsequent stage of the signal multiplexing device, there is no concern about frequency step-out of the CDR circuit. At the same time, since the phase change of the recovered data 6 is smooth, the time required for the phase lock of the CDR circuit compatible with a continuous signal can greatly be shortened. Hence, quicker clock recovery and data recovery are possible. Additionally, in this embodiment, the signal multiplexing device has an identification/recovery function for the input data 4. For this reason, the distance between the optical receiving device and the CDR circuit compatible with a continuous signal can be increased even when transmitting a high-speed signal, and the degree of freedom of the device arrangement can be improved.

Furthermore, the signal multiplexing device according to this embodiment serves as a means for transferring a continuous signal between the optical receiving device and the CDR circuit compatible with a continuous signal. Hence, capacitive coupling with the CDR circuit is possible, and the signal multiplexing device can easily be connected to a CDR circuit of different DC level. As described above, in this embodiment, a means capable of multiplexing a burst signal and an IDLE signal can be provided by a simple arrangement, and serial data can directly be input to a control LSI including a general-purpose CDR circuit compatible with a continuous signal. It is therefore possible to reduce the size, cost, and power consumption of the device for the PON system, increase the reliability of the device, and further improve the transmission efficiency of the PON system.

[Sixth Embodiment]

Figure 14:
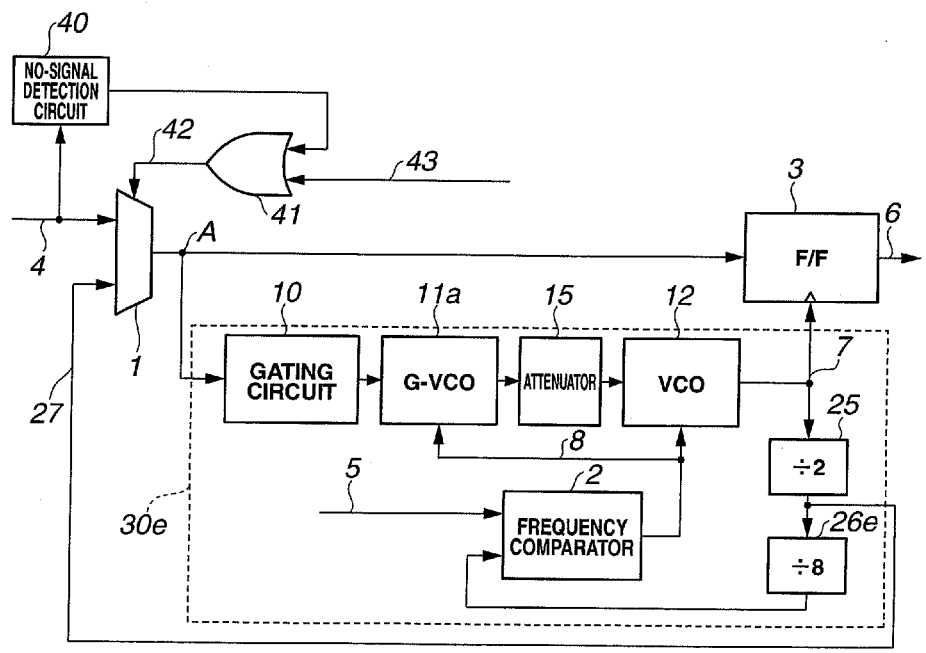
FIG. 14 is a block diagram showing the arrangement of a signal multiplexing device according to the sixth embodiment of the present invention.

The sixth embodiment of the present invention will be described next. FIG. 14 is a block diagram showing the arrangement of a signal multiplexing device according to the sixth embodiment of the present invention. The same reference numerals as in FIGS. 1, 3, 7, 10, and 13 denote the same components. The signal multiplexing device according to this embodiment includes a selector 1, an F/F 3, a clock recovery circuit 30e, a no-signal detection circuit 40, and an OR circuit 41. This embodiment is a modification of the fifth embodiment shown in FIG. 13. The point of difference from the fifth embodiment is that a switching signal 42 to the selector 1 is generated by OR-processing the output signal of the no-signal detection circuit 40 and a bit rate determination signal 43.

For example, if the signal multiplexing device according to this embodiment is designed for 10 Gbps and applied to a dual-rate-compatible OLT for 1 Gbps and 10 Gbps, a multiplexed signal needs to be generated by multiplexing an IDLE signal 27 not only during the no-signal period but also during the 1-Gbps data rate period. Assume that the output of the no-signal detection circuit 40 changes to High during the no-signal period while the bit rate determination signal 43 changes to High when the data rate is 1 Gbps or Low when the data rate is 10 Gbps. In this case, the OR circuit 41 changes the switching signal 42 to High in all periods other than the period for inputting input data 4 of 10 Gbps.

Hence, a continuous signal having a data rate uniformed to almost 10 Gbps can be generated by multiplexing the IDLE signal 27 at a point A in FIG. 14. The bit rate determination signal 43 necessary for multiplexing the IDLE signal 27 can be supplied from a switching signal generation unit (not shown). An example of the switching signal generation unit is a MAC-IC.

As described above, in this embodiment, a signal multiplexing device compatible with a dual-rate PON system can be implemented. It is therefore possible to reduce the size, cost, and power consumption of the device and improve the transmission efficiency of the PON system.

Note that the no-signal detection circuit 40 need not always be included in the signal multiplexing device and may be provided outside the signal multiplexing device, as described in the first to fourth embodiments. For example, the output from a no-signal detection circuit incorporated in a limiting amplifier may be used.

[Seventh Embodiment]

Figure 15:
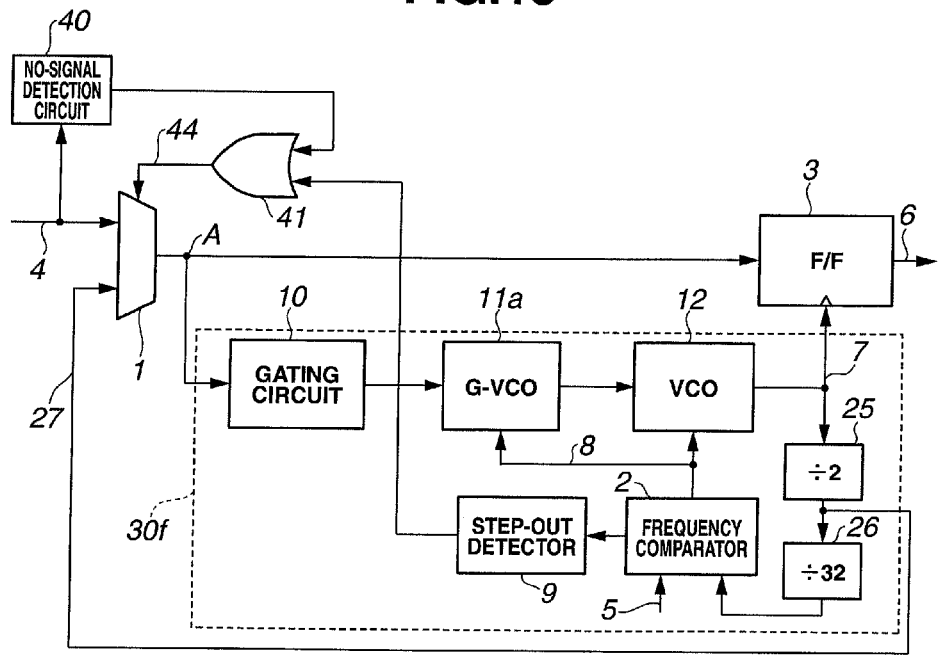
FIG. 15 is a block diagram showing the arrangement of a signal multiplexing device according to the seventh embodiment of the present invention.

The seventh embodiment of the present invention will be described next. FIG. 15 is a block diagram showing the arrangement of a signal multiplexing device according to the seventh embodiment of the present invention. The same reference numerals as in FIGS. 1, 3, 7, 10, 13, and 14 denote the same components. The signal multiplexing device according to this embodiment includes a selector 1, an F/F 3, a clock recovery circuit 30f, a no-signal detection circuit 40, and an OR circuit 41. In the signal multiplexing device according to this embodiment, a step-out detector 9, the no-signal detection circuit 40, and the OR circuit 41 are provided in the signal multiplexing device of the third embodiment shown in FIG. 7. The output of the step-out detector 9 and the output of the no-signal detection circuit 40 are OR-processed and used as a switching signal 44 to the selector 1.

The basic operation is the same as in the third embodiment. A ½ frequency-divided signal of a recovered clock 7 is multiplexed as an IDLE signal 27 during the no-signal period so that the clock recovery circuit 30f outputs the recovered clock 7 that quickly synchronizes with the transition of the edge pulse of the signal at a point A. The F/F 3 identifies/recovers the input signal (signal at the point A) using the recovered clock 7. Hence, the continuous signal free from bit errors can be output as recovered data 6.

However, the recovered clock 7 may be unstable during the period until the frequency synchronization of the frequency synchronization loop is established immediately after power-on or the like. FIGS. 16A to 16J are timing charts showing the operation at this time. FIG. 16F shows the unstable recovered clock 7 immediately after power-on or the like. FIG. 16G shows the stable recovered clock 7. In FIG. 16F, the recovered clock 7 is unstable during the period up to time t2. All of the output of the step-out detector 9 in FIG. 16H, the switching signal 44 in FIG. 16I, and the recovered data 6 in FIG. 16J are illustrated for the case in which the recovered clock 7 is unstable during the period up to the time t2.

Note that in this embodiment, the selector 1 selects and outputs the IDLE signal 27 when the switching signal 44 is Low, and selects and outputs input data 4 when the switching signal 44 is High. The no-signal detection circuit 40 outputs a signal of Low when the input data 4 is in the no-signal state.

If the IDLE signal 27 is continuously multiplexed during the period in which the recovered clock 7 is unstable, the frequency-divided signal of the unstable recovered clock 7 is continuously fed back. Hence, the operation of the signal multiplexing device is very unstable. This operation instability can be avoided by using the output signal of the step-out detector 9 as the switching signal 44 to the selector 1. Based on the output signal (frequency control signal 8) of a frequency comparator 2, when the frequency of the recovered clock 7 shifts from the input data rate frequency by a predetermined value (for example, 1000 ppm) or more, the step-out detector 9 outputs a signal of High. When the output signal of the step-out detector 9 is given to the selector 1 as the switching signal 44, the selector 1 selects the input data side in the no-signal state. Since selection of the unstable IDLE signal 27 can be prohibited, the operation of the signal multiplexing device can be avoided from becoming unstable immediately after power-on or the like.

The switching signal 44 to the selector 1 is generated by OR-processing the output of the step-out detector 9 and the output of the no-signal detection circuit 40. For this reason, control can be done such that the selector 1 can select the input data 4 even during the period in which a signal exist in the input data 4 in addition to the step-out period. Hence, in this embodiment, the operation of the signal multiplexing device can be avoided from becoming unstable immediately after power-on or the like. After the frequency synchronization loop has reached the steady state, the continuous signal formed by multiplexing the IDLE signal 27 during the no-signal period of the input data 4 can be output as the recovered data 6.

Note that this embodiment is not limited to the arrangement shown in FIG. 15. A buffer amplifier 14 or an attenuator 15 may be provided between a G-VCO 11a and a VCO 12, as shown in FIG. 10 or 13. When the buffer amplifier 14 or the attenuator 15 is provided, a jitter reduction effect can be obtained.

[Eighth Embodiment]

Figure 17:
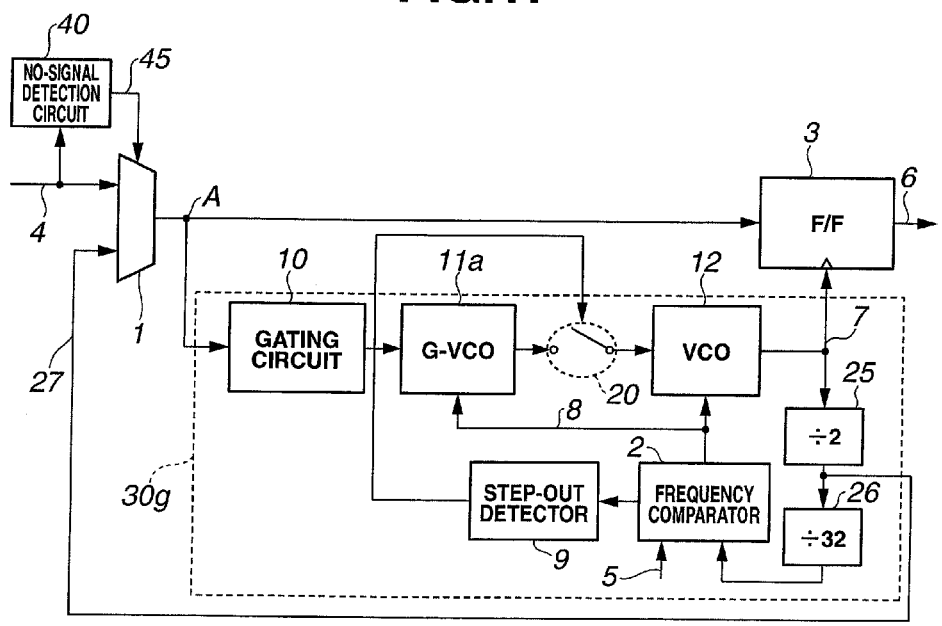
FIG. 17 is a block diagram showing the arrangement of a signal multiplexing device according to the eighth embodiment of the present invention.

The eighth embodiment of the present invention will be described next. FIG. 17 is a block diagram showing the arrangement of a signal multiplexing device according to the eighth embodiment of the present invention. The same reference numerals as in FIGS. 1, 3, 7, 10, and 13 to 15 denote the same components. The signal multiplexing device according to this embodiment includes a selector 1, an F/F 3, a clock recovery circuit 30g, a no-signal detection circuit 40, and an OR circuit 41. This embodiment is a modification of the seventh embodiment shown in FIG. 15. Points of difference from the seventh embodiment are that a switching signal 45 to the selector 1 is generated using only the output of the no-signal detection circuit 40, a switch 20 is provided between the output of a G-VCO 11a and the input of a VCO 12, and the output signal of a step-out detector 9 is used as a signal to on/off-control the switch 20.

In this embodiment, to avoid a case in which a recovered clock 7 becomes unstable during the period until the frequency synchronization of the frequency synchronization loop is established immediately after power-on or the like, adaptive control of the switch 20 is performed. That is, when the step-out detector 9 detects step-out of the frequency synchronization loop and outputs a signal of High, the switch 20 is turned off. When the step-out detector 9 outputs a signal of Low, the switch 20 is turned on. The switch 20 capable of on/off-controlling based on a control signal can easily be implemented by a transistor circuit or the like, as is known.

FIGS. 18A to 18J are timing charts for explaining the operation of the signal multiplexing device according to this embodiment. FIG. 18F shows the unstable recovered clock 7 immediately after power-on or the like. FIG. 18G shows the stable recovered clock 7. In FIG. 18F, the recovered clock 7 is unstable during the period up to time t2. All of the output of the step-out detector 9 in FIG. 18H, the output of the switch 20 in FIG. 18I, and recovered data 6 in FIG. 18J are illustrated for the case in which the recovered clock 7 is unstable during the period up to the time t2.

The switch 20 is controlled by the output of the step-out detector 9. This makes it possible to prevent the output of the G-VCO 11a disturbed by an unstable IDLE signal 27 from being transmitted to the VCO 12 and the frequency synchronization loop from becoming unstable even when the no-signal detection circuit 40 detects the no-signal state, and the selector 1 selects the unstable IDLE signal 27 during the frequency step-out period. On the other hand, during the period in which the frequency synchronization is established, the stable IDLE signal 27 can be multiplexed during the no-signal period of input data 4 in accordance with the output of the no-signal detection circuit 40. In this embodiment, the same effect as in the seventh embodiment can be obtained in this way.

Note that since it is only necessary to cut off unstable signal transmission to the VCO 12 during the frequency step-out period, the switch 20 may be provided between the output of a gating circuit 10 and the output of the G-VCO 11a.

In addition, this embodiment is not limited to the arrangement shown in FIG. 17. A buffer amplifier 14 or an attenuator 15 may be provided between the G-VCO 11a and the VCO 12, as shown in FIG. 10 or 13. When the buffer amplifier 14 or the attenuator 15 is provided, a jitter reduction effect can be obtained.

Note that in the seventh and eighth embodiments shown in FIGS. 15 and 17, the frequency of the IDLE signal 27 is not limited to ½ the input data rate frequency (the frequency of the recovered clock 7). The frequency need only be an integral submultiple of the input data rate frequency and may be, for example, ¼ the input data rate frequency.

The frequency of a reference clock 5 is not limited to 1/64 the input data rate frequency and may be 1/32 or the like. That is, when the total division ratio of frequency dividers 25 and 26 is n (n is an integer of 2 or more), the frequency of the recovered clock 7 can be stabilized by inputting the reference clock 5 whose frequency is 1/n the input data rate frequency to a frequency comparator 2.

[Ninth Embodiment]

Figure 19:
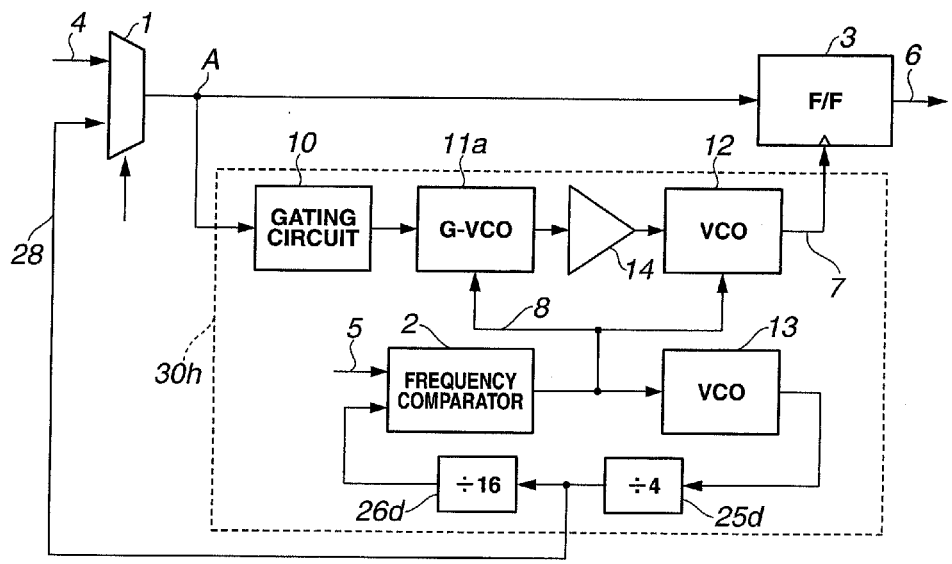
FIG. 19 is a block diagram showing the arrangement of a signal multiplexing device according to the ninth embodiment of the present invention.

The ninth embodiment of the present invention will be described next. FIG. 19 is a block diagram showing the arrangement of a signal multiplexing device according to the ninth embodiment of the present invention. The same reference numerals as in FIGS. 1, 3, 7, 10, 13 to 15, and 17 denote the same components. The signal multiplexing device according to this embodiment includes a selector 1, an F/F 3, and a clock recovery circuit 30h. In the signal multiplexing device according to this embodiment, a VCO 13 is added to the signal multiplexing device of the fourth embodiment shown in FIG. 10. The frequency synchronization loop is formed by a frequency comparator 2 and frequency dividers 25d and 26d. A frequency control signal 8 generated by the frequency synchronization loop is supplied to a G-VCO 11a and a VCO 12. The frequency divider 25d forms a feedback circuit that inputs the ¼ frequency-divided signal of the output clock of the VCO 13 to the selector 1 as an IDLE signal 28.

The operation of the signal multiplexing device according to this embodiment will be described mainly concerning the points of difference from the fourth embodiment. The VCO 13 preferably has the same circuit arrangement as the G-VCO 11a or the VCO 12. The arrangements of the G-VCO 11a and the VCO 12 are the same as described in the third embodiment. The VCO 13 is designed to pull up one input terminal of a timing control gate circuit as in the G-VCO 11a and feed back the output of the VCO 13 to the other input terminal of the timing control gate circuit.

The frequency comparator 2 generates a voltage (frequency control signal 8) that reflects the frequency difference between the frequency of the 1/32 frequency-divided signal output for the frequency divider 26d and a reference clock 5 whose frequency is 1/32 the input data rate frequency, and inputs it to the frequency control terminal of the VCO 13. The frequency comparator 2 and the frequency dividers 25d and 26d thus perform closed-loop control so as to make the frequency of the frequency-divided signal of the output of the VCO 13 match the frequency of the reference clock 5.

When the same frequency control signal 8 generated by the frequency synchronization loop is input to the frequency control terminal of the G-VCO 11a, the frequency control terminal of the VCO 12, and the frequency control terminal of the VCO 13 having the above-described arrangement, the oscillation frequencies of the G-VCO 11a, the VCO 12, and the VCO 13 can be made to match the input data rate frequency. When input data 4 having the same data rate frequency as the clock frequency is input to the clock recovery circuit 30h whose clock frequency has been stabilized in the above-described way, quick and stable phase lock can be established even during the consecutive identical digit period.

As compared to the fourth embodiment shown in FIG. 10, although the circuit scale and power consumption increase due to addition of the VCO 13, the frequency synchronization loop can be disconnected from the edge pulse path. For this reason, even when the input data 4 having a frequency different from the desired data rate frequency is input, the stable frequency control signal 8 can always be output. The rest of the operation is the same as in the fourth embodiment.

In this embodiment, even when the phase abruptly changes between the IDLE signal 28 and the burst signal, as shown in the timing charts of FIGS. 11A to 11I, the phase change can be smoothed by the effect of a buffer amplifier 14. The input signal to the F/F 3 (the signal at a point A shown in FIG. 19) is the continuous signal obtained by multiplexing the input data 4 and the IDLE signal 28. When the F/F 3 identifies/recovers the input signal using a recovered clock 7 whose abrupt phase change is relaxed, the low-jitter continuous signal having an almost constant frequency and a phase smoothly changing between the IDLE signal section and the burst signal section can be output as recovered data 6.

By outputting the recovered data 6, in this embodiment, even when a general-purpose CDR circuit compatible with a continuous signal is connected to the subsequent stage of the signal multiplexing device, there is no concern about frequency step-out of the CDR circuit. At the same time, since the phase change of the recovered data 6 is smooth, the time required for the phase lock of the CDR circuit compatible with a continuous signal can greatly be shortened. Hence, quicker clock recovery and data recovery are possible. Additionally, in this embodiment, the signal multiplexing device has an identification/recovery function for the input data 4. For this reason, the distance between the optical receiving device and the CDR circuit compatible with a continuous signal can be increased even when transmitting a high-speed signal, and the degree of freedom of the device arrangement can be improved.

Furthermore, the signal multiplexing device according to this embodiment serves as a means for transferring a continuous signal between the optical receiving device and the CDR circuit compatible with a continuous signal. Hence, capacitive coupling with the CDR circuit is possible, and the signal multiplexing device can easily be connected to a CDR circuit of different DC level. As described above, in this embodiment, a means capable of multiplexing a burst signal and an IDLE signal can be provided by a simple arrangement, and serial data can directly be input to a control LSI including a general-purpose CDR circuit compatible with a continuous signal. It is therefore possible to reduce the size, cost, and power consumption of the device for the PON system and further improve the transmission efficiency of the PON system.

Note that the signal multiplexing device according to this embodiment is not limited to the form shown in FIG. 19. The VCO 13 may be added to the signal multiplexing device according to the third embodiment shown in FIG. 7, the fifth embodiment shown in FIG. 13, or the sixth embodiment shown in FIG. 14, and the frequency control signal 8 may be generated by closed-loop control of the VCO 13.

The frequency of the IDLE signal 28 is not limited to ¼ the input data rate frequency (the frequency of the recovered clock 7) and need only be an integral submultiple of the input data rate frequency.

The frequency of the reference clock 5 is not limited to 1/64 the input data rate frequency and may be 1/16 or the like. That is, when the total division ratio of the frequency dividers 25d and 26d is n (n is an integer of 2 or more), the frequency of the recovered clock 7 can be stabilized by inputting the reference clock 5 whose frequency is 1/n the input data rate frequency to the frequency comparator 2.

A gating circuit 10 is not limited to that shown in the second to ninth embodiments and may output the edge pulse when the input signal makes a transition from "1" to "0".

The signal multiplexing devices shown in the first to ninth embodiments need not always be arranged outside the control LSI and may be provided inside the control LSI. Providing the signal multiplexing device inside the control LSI makes it possible to further reduce the size, cost, and power consumption of the device.

The frequency of the recovered clock 7 is the same as the frequency of the input data 4, as shown in the first to ninth embodiments but may be an integral submultiple of the frequency of the input data 4 as needed.

In the first to ninth embodiments, a case has been described in which the no-signal section of the input data 4 is completely complemented by the IDLE signal that is the complementary signal of the input data 4. However, when the switching signal is output later than the starting point of the no-signal section, or signal switching by the selector delays, the no-signal section is only partially complemented by the IDLE signal. Even in this case, if the no-signal section remaining after the complementation is as short as several hundred ns, no problem arises in most subsequent-stage circuits, and the effects of the present invention can sufficiently be obtained.

[10th Embodiment]

Figure 20:
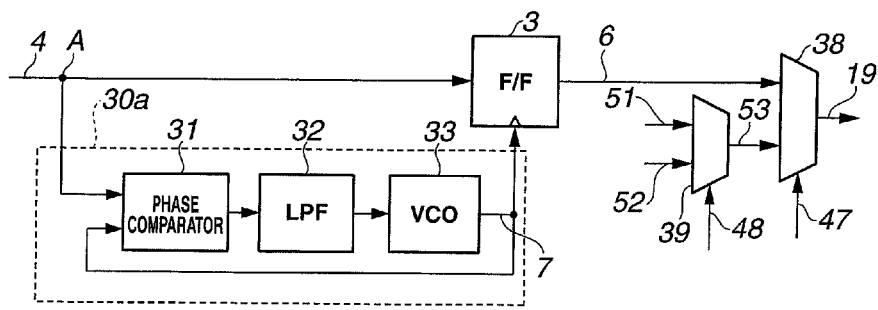
FIG. 20 is a block diagram showing the arrangement of a signal multiplexing device according to the 10th embodiment of the present invention.

The 10th embodiment of the present invention will be described next. FIG. 20 is a block diagram showing the arrangement of a signal multiplexing device according to the 10th embodiment of the present invention. The same reference numerals as in FIG. 42 denote the same components. The signal multiplexing device according to this embodiment includes an F/F 3 serving as an identification circuit, a clock recovery circuit 30*a*, and selectors 38 and 39 each serving as a selection circuit. The clock recovery circuit 30*a* includes a phase comparator 31, an LPF 32, and a VCO 33. In the signal multiplexing device according to this embodiment, the selector 38 is provided at the output portion of the F/F 3 in the CDR circuit to selectively output one of recovered data 6 and an IDLE signal 53 that is the complementary signal of the recovered data 6 based on a switching signal 47. In addition, the selector 39 is provided at the input portion of the selector 38 to selectively input one of an IDLE signal 51 and an IDLE signal 52 to the selector 38 as the IDLE signal 53 based on a switching signal 48.

Figure 21:
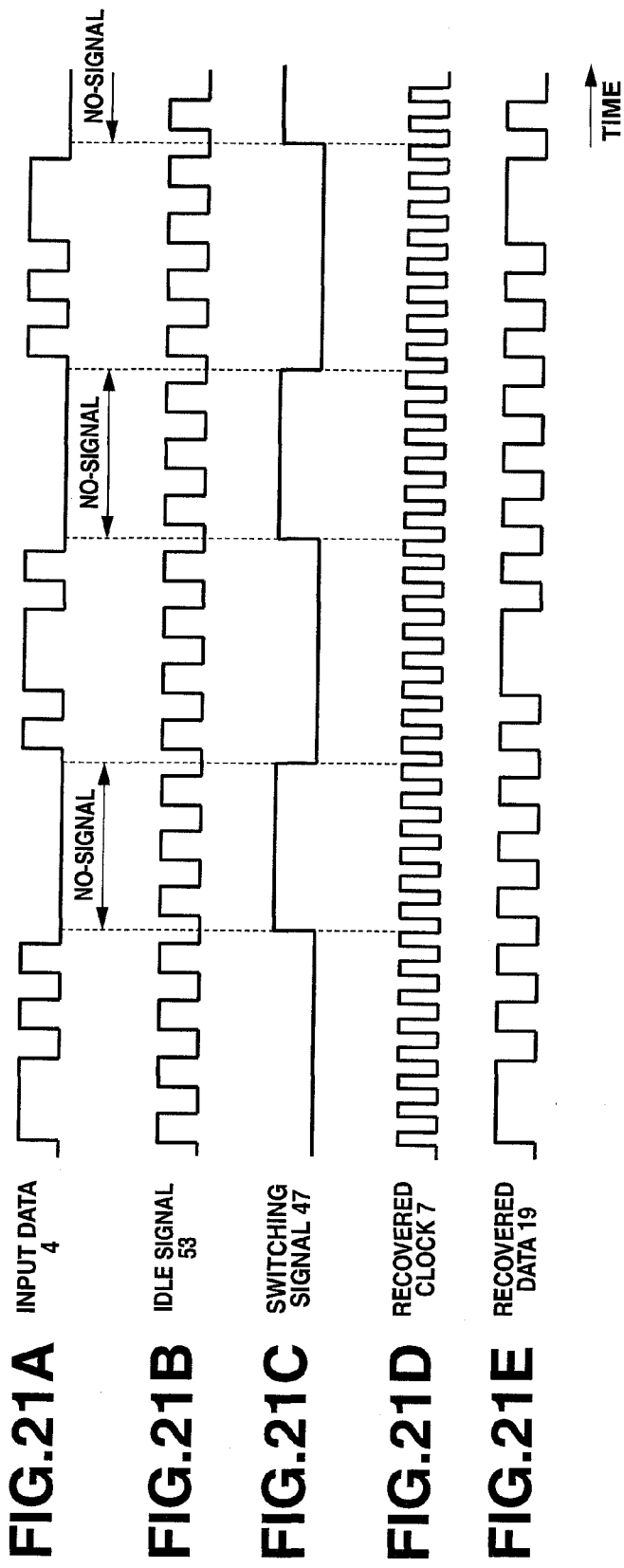
FIGS. 21A to 21E are timing charts for explaining the operation of the signal multiplexing device according to the 10th embodiment of the present invention.

The operation of the signal multiplexing device according to this embodiment will be described with reference to the timing charts of FIGS. 21A to 21E. Note that FIGS. 21A to 21E indicate a case in which the selector 39 selects the IDLE signal 51 and outputs it as the IDLE signal 53. When a burst signal including a no-signal period is input as input data 4, and the no-signal period in the recovered data 6 is long, the operation of a CDR circuit compatible with a continuous signal and connected to the subsequent stage becomes unstable. To solve this problem, the IDLE signal 53 is multiplexed on the recovered data 6 during the no-signal period of the input data 4, thereby always outputting stable recovered data 19. Multiplexing the IDLE signal 53 can be implemented by setting the switching signal 47 to be given to the selector 38 to High only during the no-signal period of the input data 4, as shown in FIG. 21C. When the switching signal 47 is High, the selector 38 selects and outputs the IDLE signal 53. When the switching signal 47 is Low, the selector 38 selects and outputs the recovered data 6.

The switching signal 47 necessary for switching control of the selector 38 can be supplied from a switching signal generation unit (not shown). As the switching signal generation unit, a MAC-IC that is an LSI having a PON system communication timing control function and a function of grasping the signal reception period is usable. The switching signal 47 can also be generated using a no-signal detection circuit. The arrangement of the switching signal generation unit using the no-signal detection circuit is disclosed in, for example, Japanese Patent Laid-Open No. 3-166836.

Note that the selector 38 may select the IDLE signal 53 when the switching signal 47 is Low, as a matter of course.

The frequency of the IDLE signal 51 is preferably set to almost ½ the input data rate frequency. In this case, the IDLE signal 51 corresponds to a "0101" signal at the data rate of the input data 4 and includes pulses of the same period as the input data 4. The frequency of the IDLE signal 52 is preferably set to almost ¼ the input data rate frequency. In this case, the IDLE signal 52 corresponds to a "0011" signal at the data rate of the input data 4. The IDLE signal 51 can be generated by an external oscillator (not shown) in synchronism with a system clock from the control LSI (MAC-IC) or a frequency divider (not shown) that divides a recovered clock 7 to ½. Similarly, the IDLE signal 52 can be generated by an external oscillator or a frequency divider that divides the recovered clock 7 to ¼. In addition, a pattern generation circuit (not shown) may be provided to make the IDLE signals 51 and 52 have a specific repetitive pattern.

Details of the operation will be described below. The phase comparator 31 detects the phase difference between the input data 4 and the recovered clock 7 output from the VCO 33. The LPF 32 extracts only the low-frequency component from the phase difference signal output from the phase comparator 31, and inputs it to the phase (frequency) control terminal of the VCO 33 as a control signal. The VCO 33 generates a clock in accordance with the voltage of the control signal, thereby outputting the recovered clock 7 having a frequency equal to that of the input data 4. The F/F 3 retimes the input data 4 at a predetermined timing of the recovered clock 7 (for example, the leading edge of the recovered clock 7), thereby outputting the recovered data 6. The operation described above is the same as in the related art shown in FIG. 42. In this embodiment, in the signal multiplexing device that may receive the input data 4 of a deteriorated waveform, no other circuit is added between the input portion and the identification circuit, and therefore, the waveform is not influenced.

Additionally, in this embodiment, the selector 38 is arranged not inside the clock recovery circuit 30*a* but at the output portion of the signal multiplexing device. For this reason, the recovered data 19 output from the selector 38 is a continuous signal obtained by multiplexing the IDLE signal 53 during the no-signal period of the input data 4.

As described above, in this embodiment, the recovered data 19 as a continuous signal having an almost constant frequency can be generated. For this reason, even when a general-purpose CDR circuit compatible with a continuous signal is connected to the subsequent stage of the signal multiplexing device, there is no concern about frequency step-out of the CDR circuit, and the CDR circuit compatible with a continuous signal can complete clock recovery and data recovery within its phase lock time. Additionally, in this embodiment, the signal multiplexing device has an identification/recovery function for the input data 4. For this reason, the distance between the optical receiving device and the CDR circuit compatible with a continuous signal can be increased even when transmitting a high-speed signal, and the degree of freedom of the device arrangement can be improved.

Furthermore, the signal multiplexing device according to this embodiment serves as a means for transferring a continuous signal between the optical receiving device and the CDR circuit compatible with a continuous signal. Hence, capacitive coupling with the CDR circuit is possible, and the signal multiplexing device can easily be connected to a CDR circuit of different DC level. As described above, in this embodiment, a means capable of multiplexing a burst signal and an IDLE signal can be provided by a simple arrangement, and serial data can directly be input to a control LSI including a general-purpose CDR circuit compatible with a continuous signal. It is therefore possible to reduce the size, cost, and power consumption of the device for the PON system and improve the transmission efficiency of the PON system.

However, when the control LSI (MAC-IC) connected to the subsequent stage of the signal multiplexing device detects and uses the specific repetitive pattern of the recovered data 19, an operation error may occur in the control LSI due to use of only the IDLE signal 51 having the "0101" pattern. To prevent this, for example, the IDLE signal 51 is set to the "0101" signal, and the IDLE signal 52 is set to the "0011" signal, as described above, and the IDLE signal 51 or the IDLE signal 52 is selectively output by the switching signal 48 in accordance with the type of the control LSI connected to the subsequent stage of the signal multiplexing device, thereby avoiding the problem of operation errors of the control LSI. With this switching, the signal multiplexing device can be connected to a control LSI (MAC-IC) of any type and can use the optimum IDLE signal 53. Especially when there is no concern about operation errors, the "0101" signal having a high frequency component is preferably used as the IDLE signal 53 to be multiplexed on the recovered data 6 to speed up the CDR circuit compatible with a continuous signal and connected to the subsequent stage of the signal multiplexing device.

Note that which one of the IDLE signal 51 and the IDLE signal 52 should be selected by the selector 39 is determined by the type of the control LSI of the subsequent stage. Hence, selection of the IDLE signal is fixed, and the switching need not be done during the operation of the signal multiplexing device. The user who uses the signal multiplexing device fixes the switching signal 48 to High or Low in advance in accordance with the type of the control LSI. Hence, one of the IDLE signal 51 and the IDLE signal 52 is selected by the selector 39.

[11th Embodiment]

Figure 22:
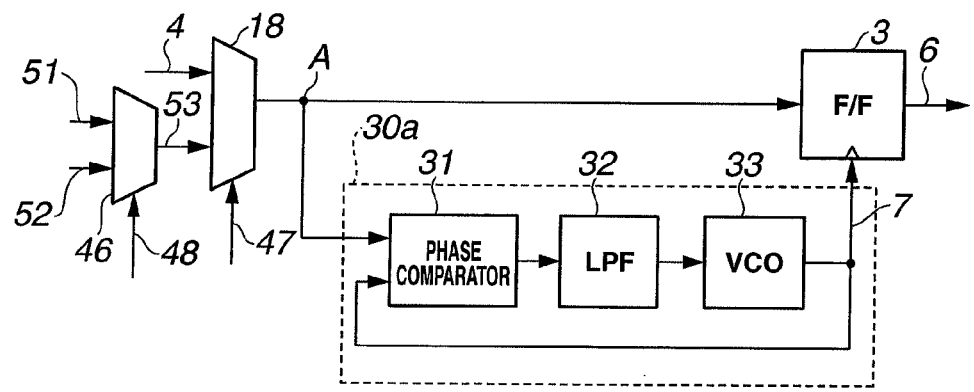
FIG. 22 is a block diagram showing the arrangement of a signal multiplexing device according to the 11th embodiment of the present invention.

The 11th embodiment of the present invention will be described next. FIG. 22 is a block diagram showing the arrangement of a signal multiplexing device according to the 11th embodiment of the present invention. The same reference numerals as in FIG. 20 denote the same components. The signal multiplexing device according to this embodiment includes selectors 18 and 46 each serving as a selection circuit, an F/F 3, and a clock recovery circuit 30a. The point of difference from the 10th embodiment shown in FIG. 20 is that the selector 18 is provided at the input portion to selectively input one of input data 4 and an IDLE signal 53 to the F/F 3 and the clock recovery circuit 30a, which form the CDR core portion, based on a switching signal 47. In addition, the selector 46 is provided at the input portion of the selector 18 to selectively input one of an IDLE signal 51 and an IDLE signal 52 to the selector 18 as the IDLE signal 53 based on a switching signal 48.

The operation of this signal multiplexing device will be described with reference to the timing charts of FIGS. 23A to 23F. Note that FIGS. 23A to 23F indicate a case in which the selector 46 selects the IDLE signal 51 and outputs it as the IDLE signal 53. When a burst signal including a no-signal period is input as the input data 4, and the no-signal period is long, the operation of the PLL-type clock recovery circuit 30a may be unstable. To solve this problem, the IDLE signal 53 is multiplexed on the input data 4 during the no-signal period, thereby always outputting a stable recovered clock 7. Multiplexing the IDLE signal 53 can be implemented by setting the switching signal 47 to be given to the selector 18 to High only during the no-signal period of the input data 4, as shown in FIG. 23C. When the switching signal 47 is High, the selector 18 selects and outputs the IDLE signal 53. When the switching signal 47 is Low, the selector 18 selects and outputs the input data 4.

The switching signal 47 necessary for switching control of the selector 18 can be supplied from a switching signal generation unit (not shown). As the switching signal generation unit, a MAC-IC that is an LSI having a PON system communication timing control function and a function of grasping the signal reception period is usable. The switching signal 47 can also be generated using a no-signal detection circuit. The arrangement of the switching signal generation unit using the no-signal detection circuit is disclosed in, for example, Japanese Patent Laid-Open No. 3-166836.

Note that the selector 18 may select the IDLE signal 53 when the switching signal 47 is Low, as a matter of course.

As in the 10th embodiment, the frequency of the IDLE signal 51 is preferably set to almost ½ the input data rate frequency. In this case, the IDLE signal 51 corresponds to a "0101" signal at the data rate of the input data 4 and includes pulses of the same period as the input data 4. The frequency of the IDLE signal 52 is preferably set to almost ¼ the input data rate frequency. In this case, the IDLE signal 52 corresponds to a "0011" signal at the data rate of the input data 4. The IDLE signal 51 can be generated by an external oscillator in synchronism with a system clock from the control LSI (MAC-IC) or a frequency divider that divides the recovered clock 7 to ½. Similarly, the IDLE signal 52 can be generated by an external oscillator or a frequency divider that divides the recovered clock 7 to ¼. In addition, a pattern generation circuit (not shown) may be provided to make the IDLE signals 51 and 52 have a specific repetitive pattern.

At a point A shown in FIG. 22, the IDLE signal 53 can thus be multiplexed on the burst signal to generate a continuous signal having a uniform frequency. When the IDLE signals 51 and 52 are supplied from external oscillators having a very high frequency stability, the uniformity of the frequency can easily be raised. The clock recovery circuit 30a can recover the clock only by phase-locking to the continuous signal having the almost constant frequency. It is therefore possible to output the recovered clock 7 always stably.

Details of the operation will be described below. A phase comparator 31 detects the phase difference between the multiplexed input signal and the recovered clock 7 output from a VCO 33. An LPF 32 extracts only the low-frequency component from the phase difference signal output from the phase comparator 31, and inputs it to the phase (frequency) control terminal of the VCO 33 as a control signal. The VCO 33 generates a clock in accordance with the voltage of the control signal, thereby outputting the recovered clock 7 having a frequency equal to that of the input data 4. Since the recovered clock 7 in synchronism with the IDLE signal 53 is output during the no-signal period of the input data 4, stable clock recovery can always be performed. The operation described above is the same as in the related art shown in FIG. 42.

On the other hand, in this embodiment, since the selector 18 is arranged not inside the clock recovery circuit 30a but at the input portion of the signal multiplexing device, the input signal to the F/F 3 is the continuous signal obtained by multiplexing the IDLE signal 53 during the no-signal period of the input data 4. The F/F 3 retimes the multiplexed continuous signal at a predetermined timing of the recovered clock 7 (for example, the leading edge of the recovered clock 7), thereby outputting recovered data 6. It is therefore possible to output the recovered data 6 as a continuous signal with low jitter.

As described above, in this embodiment, the recovered data 6 as a continuous signal having an almost constant frequency can be generated. For this reason, even when a general-purpose CDR circuit compatible with a continuous signal is connected to the subsequent stage of the signal multiplexing device, there is no concern about frequency step-out of the CDR circuit, and the CDR circuit compatible with a continuous signal can complete clock recovery and data recovery within its phase lock time. Additionally, in this embodiment, the signal multiplexing device has an identification/recovery function for the input data 4. For this reason, the distance between the optical receiving device and the CDR circuit compatible with a continuous signal can be increased even when transmitting a high-speed signal, and the degree of freedom of the device arrangement can be improved.

Furthermore, the signal multiplexing device according to this embodiment serves as a means for transferring a continuous signal between the optical receiving device and the CDR circuit compatible with a continuous signal. Hence, capacitive coupling with the CDR circuit is possible, and the signal multiplexing device can easily be connected to a CDR circuit of different DC level. As described above, in this embodiment, a means capable of multiplexing a burst signal and an IDLE signal can be provided by a simple arrangement, and serial data can directly be input to a control LSI including a general-purpose CDR circuit compatible with a continuous signal. It is therefore possible to reduce the size, cost, and power consumption of the device for the PON system and improve the transmission efficiency of the PON system.

However, when the control LSI (MAC-IC) connected to the subsequent stage of the signal multiplexing device detects and uses the specific repetitive pattern of the recovered data 6, an operation error may occur in the control LSI due to use of only the IDLE signal 51 having the "0101" pattern. To prevent this, for example, the IDLE signal 51 is set to the "0101" signal, and the IDLE signal 52 is set to the "0011" signal, as described above, and the IDLE signal 51 or the IDLE signal 52 is selectively output by the switching signal 48 in accordance with the type of the control LSI connected to the subsequent stage of the signal multiplexing device, thereby avoiding the problem of operation errors of the control LSI. With this switching, the signal multiplexing device can be connected to a control LSI (MAC-IC) of any type and can use the optimum IDLE signal 53. Especially when there is no concern about operation errors, the "0101" signal having a high frequency component is preferably used as the IDLE signal 53 to be multiplexed on the recovered data 6 to speed up the CDR circuit compatible with a continuous signal and connected to the subsequent stage of the signal multiplexing device.

[12th Embodiment]

Figure 24:
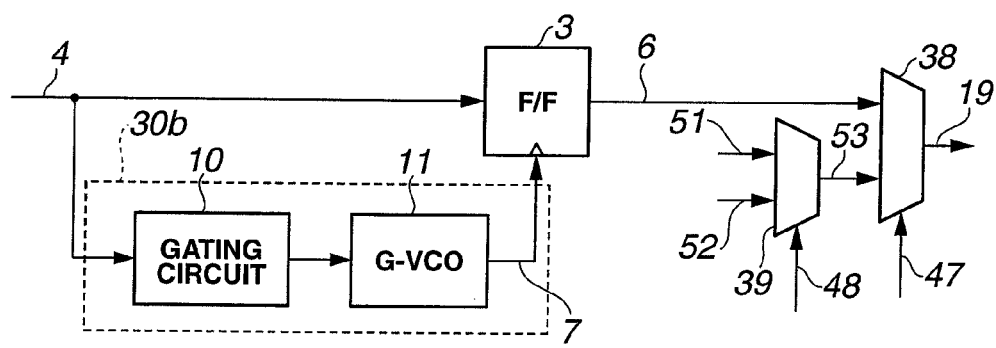
FIG. 24 is a block diagram showing the arrangement of a signal multiplexing device according to the 12th embodiment of the present invention.

The 12th embodiment of the present invention will be described next. FIG. 24 is a block diagram showing the arrangement of a signal multiplexing device according to the 12th embodiment of the present invention. The same reference numerals as in FIGS. 20 and 22 denote the same components. The signal multiplexing device according to this embodiment includes an F/F 3, a clock recovery circuit 30*b*, and selectors 38 and 39. The point of difference from the 10th embodiment shown in FIG. 20 is that the clock recovery circuit 30*b* includes a gating circuit 10 and a G-VCO 11.

The arrangement of the gating circuit 10 is the same as that shown in FIG. 4. The arrangement of the G-VCO 11 is the same as that shown in FIG. 5. Note that in this embodiment, the frequency control terminal of the G-VCO 11 is fixed to a potential that makes the frequency of a recovered clock 7 output from the G-VCO 11 equal to the input data rate frequency.

The operation of the signal multiplexing device according to this embodiment will be described mainly concerning the points of difference from the 10th embodiment. FIGS. 25A to 25H are timing charts for explaining the operation of the signal multiplexing device according to this embodiment. FIG. 25A shows input data 4 when the phase of the second burst signal delays by a ¼ bit, and FIG. 25B shows the input data 4 without phase delay. All of the output of the gating circuit 10 in FIG. 25E, the recovered clock 7 in FIG. 25G, and recovered data 6 in FIG. 25H are illustrated for the case in which the phase of the burst signal delays by a ¼ bit. The output of the gating circuit 10 in FIG. 25F is illustrated for the case in which the input data 4 has no phase delay. Note that FIGS. 25A to 25H indicate a case in which the selector 39 selects an IDLE signal 51 and outputs it as an IDLE signal 53.

The gating circuit 10 outputs an edge pulse that falls when the input data 4 makes a transition from "0" to "1" and rises after, for example, T/2 (T is the period of the input data 4), and has a width of T/2.

The phase of the recovered clock 7 output from the G-VCO 11 is controlled by the edge pulse output from the gating circuit 10. That is, the G-VCO 11 is reset and outputs "0" when an edge pulse having a value of, for example, "0" is output from the gating circuit 10, starts oscillating at the instant of ending the edge pulse output and changing the output of the gating circuit 10 to "1", and continues oscillating during the time when the output of the gating circuit 10 is "1". When the G-VCO 11 oscillates at a frequency equal to the data rate frequency of the input data 4, adjustment is done to make the phase of the recovered clock 7 instantaneously match the phase of the input data 4.

As described above, since the recovered clock 7 that instantaneously synchronizes with the transition of the edge pulse can be output, quick response is possible even when the relative phases of the burst signals shift, unlike the 10th embodiment.

The gating circuit 10 outputs the edge pulse when the input data 4 makes a transition from "0" to "1". For this reason, if the phase delays by a ¼ bit relative to the first burst signal, like the second burst signal shown in FIG. 25A, the gating circuit 10 starts outputting the edge pulse reflecting the delay at the timing of the second burst signal. The operation of the gating circuit 10 indicates that it can output the edge pulse in synchronism with the burst signal input in any phase. The oscillation phase of the G-VCO 11 is instantaneously controlled by the edge pulse output from the gating circuit 10. Hence, the G-VCO 11 can output the recovered clock 7 in synchronism with the burst signal input in any phase from the start of the signal. Hence, even when the no-signal period exists in the input data 4, the operation never becomes unstable, unlike the PLL-type clock recovery circuit 30*a* as described in the 10th embodiment.

As in the 10th embodiment, when the frequency of the IDLE signal 53 to be multiplexed on the recovered data 6 is set to an integral submultiple, for example, ½ or ¼ the input data rate frequency, recovered data 19 that is a multiplexed signal (continuous signal) formed by multiplexing the IDLE signal 53 having an almost uniform data rate frequency during the no-signal period of the input data 4 can be generated. When the IDLE signals 51 and 52 are supplied from external oscillators having a high frequency stability, the uniformity of the frequency can easily be raised.

Multiplexing the IDLE signal 53 can be implemented by setting a switching signal 47 to be given to the selector 38 to High only during the no-signal period of the input data 4, as shown in FIG. 25D. The switching signal 47 necessary for switching control of the selector 38 can be supplied from a switching signal generation unit (not shown). As the switching signal generation unit, a MAC-IC described in the 10th embodiment is usable. The switching signal 47 can also be generated using a no-signal detection circuit. The arrangement of the switching signal generation unit using the no-signal detection circuit is disclosed in, for example, Japanese Patent Laid-Open No. 3-166836.

Note that the selector 38 may select the IDLE signal 53 when the switching signal 47 is Low, as described in the 10th embodiment.

As described above, in this embodiment, the recovered data 19 as a low-jitter continuous signal having an almost constant frequency can be generated. For this reason, even when a general-purpose CDR circuit compatible with a continuous signal is connected to the subsequent stage of the signal multiplexing device, there is no concern about frequency step-out of the CDR circuit, and the CDR circuit compatible with a continuous signal can complete clock recovery and data recovery within its phase lock time. Additionally, in this embodiment, the signal multiplexing device has an identification/recovery function for the input data 4. For this reason, the distance between the optical receiving device and the CDR circuit compatible with a continuous signal can be increased even when transmitting a high-speed signal, and the degree of freedom of the device arrangement can be improved.

Furthermore, the signal multiplexing device according to this embodiment serves as a means for transferring a continuous signal between the optical receiving device and the CDR circuit compatible with a continuous signal. Hence, capacitive coupling with the CDR circuit is possible, and the signal multiplexing device can easily be connected to a CDR circuit of different DC level. As described above, in this embodiment, a means capable of multiplexing a burst signal and an IDLE signal can be provided by a simple arrangement, and serial data can directly be input to a control LSI including a general-purpose CDR circuit compatible with a continuous signal. It is therefore possible to reduce the size, cost, and power consumption of the device for the PON system and improve the transmission efficiency of the PON system.

In this embodiment as well, for example, the IDLE signal 51 is set to the above-described "0101" signal, and the IDLE signal 52 is set to the above-described "0011" signal, and the IDLE signal 51 or the IDLE signal 52 is selectively output by a switching signal 48 in accordance with the type of the control LSI connected to the subsequent stage of the signal multiplexing device, thereby avoiding the problem of operation errors of the control LSI. Especially when there is no concern about operation errors, the "0101" signal having a high frequency component is preferably used as the IDLE signal 53 to be multiplexed on the recovered data 6 to speed up the CDR circuit compatible with a continuous signal and connected to the subsequent stage of the signal multiplexing device.

[13th Embodiment]

Figure 26:
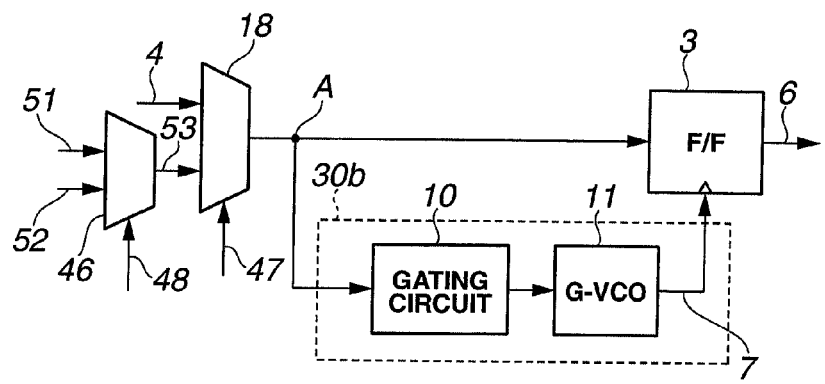
FIG. 26 is a block diagram showing the arrangement of a signal multiplexing device according to the 13th embodiment of the present invention.

The 13th embodiment of the present invention will be described next. FIG. 26 is a block diagram showing the arrangement of a signal multiplexing device according to the 13th embodiment of the present invention. The same reference numerals as in FIGS. 20, 22, and 24 denote the same components. The signal multiplexing device according to this embodiment includes selectors 18 and 46, an F/F 3, and a clock recovery circuit 30b. The point of difference from the 11th embodiment shown in FIG. 22 is that the clock recovery circuit 30b includes a gating circuit 10 and a G-VCO 11.

The operation of the signal multiplexing device according to this embodiment will be described mainly concerning the points of difference from the 11th embodiment. FIGS. 27A to 27I are timing charts for explaining the operation of the signal multiplexing device according to this embodiment. FIG. 27A shows input data 4 when the phase of the second burst signal delays by a ¼ bit, and FIG. 27B shows the input data 4 without phase delay. All of the signal (the signal at a point A in FIG. 26) in FIG. 27E, the output of the gating circuit 10 in FIG. 27F, a recovered clock 7 in FIG. 27H, and recovered data 6 in FIG. 27I are illustrated for the case in which the phase of the burst signal delays by a ¼ bit. The output of the gating circuit 10 in FIG. 27G is illustrated for the case in which the input data 4 has no phase delay. Note that FIGS. 27A to 27I indicate a case in which the selector 46 selects an IDLE signal 51 and outputs it as an IDLE signal 53.

The gating circuit 10 outputs an edge pulse that falls when the input signal makes a transition from "0" to "1" and rises after, for example, T/2 (T is the period of the input data 4), and has a width of T/2.

The phase of the recovered clock 7 output from the G-VCO 11 is controlled by the edge pulse output from the gating circuit 10. That is, the G-VCO 11 is reset and outputs "0" when an edge pulse having a value of, for example, "0" is output from the gating circuit 10, starts oscillating at the instant of ending the edge pulse output and changing the output of the gating circuit 10 to "1", and continues oscillating during the time when the output of the gating circuit 10 is "1". When the G-VCO 11 oscillates at a frequency equal to the data rate frequency of the input data 4, adjustment is done to make the phase of the recovered clock 7 instantaneously match the phase of the input data 4.

As described above, since the recovered clock 7 that instantaneously synchronizes with the transition of the edge pulse can be output, quick response is possible even when the relative phases of the burst signals shift, unlike the 11th embodiment.

As in the 11th embodiment, when the frequency of the IDLE signal 53 is set to an integral submultiple, for example, ½ or ¼ the input data rate frequency, a multiplexed signal (continuous signal) formed by multiplexing the IDLE signal 53 having an almost uniform data rate frequency during the no-signal period of the input data 4 can be generated. When the IDLE signals 51 and 52 are supplied from external oscillators having a very high frequency stability, the uniformity of the frequency can easily be raised.

Multiplexing the IDLE signal 53 can be implemented by setting a switching signal 47 to be given to the selector 18 to High only during the no-signal period of the input data 4, as shown in FIG. 27D. The switching signal 47 necessary for switching control of the selector 18 can be supplied from a switching signal generation unit (not shown). As the switching signal generation unit, a MAC-IC described in the 10th embodiment is usable. The switching signal 47 can also be generated using a no-signal detection circuit. The arrangement of the switching signal generation unit using the no-signal detection circuit is disclosed in, for example, Japanese Patent Laid-Open No. 3-166836.

Note that the selector 18 may select the IDLE signal 53 when the switching signal 47 is Low, as described in the 11th embodiment.

The gating circuit 10 outputs the edge pulse when the input signal makes a transition from "0" to "1". For this reason, if the phase delays by a ¼ bit relative to the first burst signal and the immediately preceding IDLE signal 53, like the second burst signal shown in FIG. 27A, the gating circuit 10 starts outputting the edge pulse reflecting the delay at the timing of the second burst signal. During the no-signal period immediately after the end of the second burst signal shown in FIG. 27A, the gating circuit 10 outputs the edge pulse when the IDLE signal 53 makes a transition from "0" to "1". The operation of the gating circuit 10 indicates that it can output the edge pulse in synchronism with the burst signal and the IDLE signal 53 input in any phase.

The oscillation phase of the G-VCO 11 is instantaneously controlled by the edge pulse output from the gating circuit 10.

Hence, the G-VCO 11 can output the recovered clock 7 in synchronism with the burst signal and the IDLE signal 53 input in any phase from the start of these signals.

In this embodiment, the input signal to the F/F 3 (the signal at the point A shown in FIG. 26) is the continuous signal obtained by multiplexing the input data 4 and the IDLE signal 53. Hence, when the F/F 3 identifies/recovers the input signal using the recovered clock 7, the continuous signal free from bit errors can be output as the recovered data 6.

As described above, in this embodiment, the recovered data 6 as a low-jitter continuous signal having an almost constant frequency can be generated. For this reason, even when a general-purpose CDR circuit compatible with a continuous signal is connected to the subsequent stage of the signal multiplexing device, there is no concern about frequency step-out of the CDR circuit, and the CDR circuit compatible with a continuous signal can complete clock recovery and data recovery within its phase lock time. Additionally, in this embodiment, the signal multiplexing device has an identification/recovery function for the input data 4. For this reason, the distance between the optical receiving device and the CDR circuit compatible with a continuous signal can be increased even when transmitting a high-speed signal, and the degree of freedom of the device arrangement can be improved.

Furthermore, the signal multiplexing device according to this embodiment serves as a means for transferring a continuous signal between the optical receiving device and the CDR circuit compatible with a continuous signal. Hence, capacitive coupling with the CDR circuit is possible, and the signal multiplexing device can easily be connected to a CDR circuit of different DC level. As described above, in this embodiment, a means capable of multiplexing a burst signal and an IDLE signal can be provided by a simple arrangement, and serial data can directly be input to a control LSI including a general-purpose CDR circuit compatible with a continuous signal. It is therefore possible to reduce the size, cost, and power consumption of the device for the PON system and improve the transmission efficiency of the PON system.

In this embodiment as well, for example, the IDLE signal 51 is set to the above-described "0101" signal, and the IDLE signal 52 is set to the above-described "0011" signal, and the IDLE signal 51 or the IDLE signal 52 is selectively output by a switching signal 48 in accordance with the type of the control LSI connected to the subsequent stage of the signal multiplexing device, thereby avoiding the problem of operation errors of the control LSI. Especially when there is no concern about operation errors, the "0101" signal having a high frequency component is preferably used as the IDLE signal 53 to be multiplexed on the input data 4 to speed up the CDR circuit compatible with a continuous signal and connected to the subsequent stage of the signal multiplexing device.

[14th Embodiment]

Figure 28:
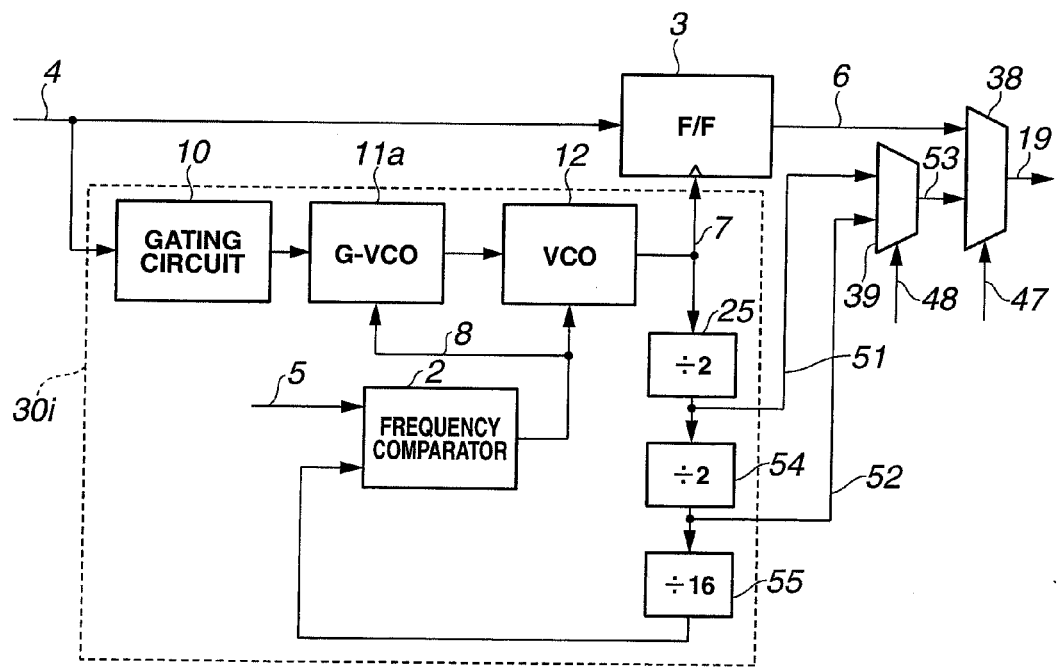
FIG. 28 is a block diagram showing the arrangement of a signal multiplexing device according to the 14th embodiment of the present invention.

The 14th embodiment of the present invention will be described next. FIG. 28 is a block diagram showing the arrangement of a signal multiplexing device according to the 14th embodiment of the present invention. The same reference numerals as in FIGS. 20, 22, 24, and 26 denote the same components. The signal multiplexing device according to this embodiment includes an F/F 3, a clock recovery circuit 30i, and selectors 38 and 39. The main points of difference from the 12th embodiment shown in FIG. 24 are that a VCO 12 is provided at the subsequent stage of a G-VCO 11a, a ½ frequency-divided signal of a recovered clock 7 output from the VCO 12 is used as an IDLE signal 51, and a ¼ frequency-divided signal of the recovered clock 7 is used as an IDLE signal 52. In addition to the VCO 12, a frequency comparator 2 and frequency dividers 25, 54, and 55 are added to the clock recovery circuit 30i. The frequency comparator 2, the VCO 12, and the frequency dividers 25, 54, and 55 form a frequency synchronization loop. Furthermore, the frequency dividers 25 and 54 form a feedback circuit that inputs the IDLE signals 51 and 52 to the selector 39.

The frequency divider 25 divides the recovered clock 7 output from the VCO 12 to ½. The frequency divider 54 divides the clock (IDLE signal 51) output from the frequency divider 25 to ½. The frequency divider 55 divides the clock (IDLE signal 52) output from the frequency divider 54 to ¹⁄₁₆. As a result, a ¹⁄₆₄ frequency-divided signal of the recovered clock 7 is input to the frequency comparator 2.

The frequency comparator 2 generates a voltage (frequency control signal 8) that reflects the frequency difference between the frequency of the ¹⁄₆₄ frequency-divided signal of the recovered clock 7 and the frequency of a reference clock 5 whose frequency is ¹⁄₆₄ the input data rate frequency. The frequency comparator 2 and the frequency dividers 25, 54, and 55 thus perform closed-loop control so as to make the frequency of the frequency-divided signal of the recovered clock 7 match the frequency of the reference clock 5. The frequency control signal 8 generated by the closed-loop control is input not only to the VCO 12 but also to the frequency control terminal of the G-VCO 11a.

The arrangements of the G-VCO 11a and the VCO 12 are the same as shown in FIG. 8. When the same frequency control signal 8 generated by the frequency synchronization loop is input to the frequency control terminal of the G-VCO 11a and the frequency control terminal of the VCO 12, the oscillation frequencies of the G-VCO 11a and the VCO 12 can be made to match the input data rate frequency. When input data 4 having the same data rate frequency as the clock frequency is input to the clock recovery circuit 30i whose clock frequency has been stabilized in the above-described way, quick and stable phase lock can be established even during the consecutive identical digit period.

The operation of the signal multiplexing device according to this embodiment will be described next. FIGS. 29A to 29J are timing charts for explaining the operation of the signal multiplexing device according to this embodiment. FIG. 29A shows the input data 4 when the phase of the second burst signal delays by a ¼ bit, and FIG. 29B shows the input data 4 without phase delay. All of an IDLE signal 53 in FIG. 29C, the output of a gating circuit 10 in FIG. 29F, the recovered clock 7 in FIG. 29H, and recovered data 19 in FIG. 29I are illustrated for the case in which the phase of the burst signal delays by a ¼ bit. The IDLE signal 53 in FIG. 29D, the output of the gating circuit 10 in FIG. 29G, and the recovered data 19 in FIG. 29J are illustrated for the case in which the input data 4 has no phase delay. Note that FIGS. 29A to 29J indicate a case in which the selector 39 selects the IDLE signal 51 and outputs it as the IDLE signal 53.

The gating circuit 10 outputs an edge pulse that falls when the input data 4 makes a transition from "0" to "1" and rises after, for example, T/2 (T is the period of the input data 4), and has a width of T/2.

The G-VCO 11a is reset and outputs "0" when an edge pulse having a value of, for example, "0" is output from the gating circuit 10, starts oscillating at the instant of ending the edge pulse output and changing the output of the gating circuit 10 to "1", and continues oscillating during the time when the output of the gating circuit 10 is "1". In this way, the G-VCO 11a adjusts to make the phase of the output clock instantaneously match the phase of the input data 4.

The clock output from the G-VCO 11a in phase with the input data 4 and the recovered clock 7 that is the output of the VCO 12 itself are input to the VCO 12 in a superimposed manner. For this reason, the phase of the recovered clock 7 is adjusted so as to match the phase of the output clock of the G-VCO 11a (that is, match the phase of the input data 4). However, since the phase of the recovered clock 7 is also affected by the feedback signal of the VCO 12 itself, the influence of the output of the G-VCO 11a on the phase of the recovered clock 7 is reduced. Hence, even when the pulse width of the output clock of the G-VCO 11a varies in accordance with the jitter of the input data 4, the recovered clock 7 is hardly affected by the output of the G-VCO 11a, and the jitter of the recovered clock 7 can be reduced. The ability of suppressing the jitter spells degradation in the instantaneous response characteristic to the input data 4. However, as compared to the signal multiplexing device using a PLL-type clock recovery circuit shown in FIG. 42 or 20, the signal multiplexing device of this embodiment can maintain a much quicker response (within several bits).

As described above, in this embodiment, since the recovered clock 7 that quickly synchronizes with the transition of the edge pulse output from the gating circuit 10 can be output, a normal operation is performed even when the relative phases of the burst signals shift, unlike the 10th embodiment. In this embodiment, since the ½ frequency-divided signal of the recovered clock 7 is used as the IDLE signal 51, and the ¼ frequency-divided signal of the recovered clock 7 is used as the IDLE signal 52, the recovered data 19 that is a multiplexed signal (continuous signal) formed by multiplexing the IDLE signal 53 having an almost uniform data rate frequency during the no-signal period of the input data 4 can be generated, as in the 10th embodiment. In this embodiment, since the IDLE signals 51 and 52 are extracted from the clock recovery circuit 30i, an external oscillation circuit is unnecessary, and the size and power consumption of the signal multiplexing device can be reduced.

Multiplexing the IDLE signal 53 can be implemented by setting a switching signal 47 to be given to the selector 38 to High only during the no-signal period of the input data 4, as shown in FIG. 29E. A switching signal generation unit for outputting the switching signal 47 can be implemented by the arrangement described in the 10th embodiment. The selector 38 may select the IDLE signal 53 when the switching signal 47 is Low, as in the 10th embodiment.

The gating circuit 10 outputs the edge pulse when the input data 4 makes a transition from "0" to "1". For this reason, if the phase delays by a ¼ bit relative to the first burst signal and the immediately preceding IDLE signal 53, like the second burst signal shown in FIG. 29A, the gating circuit 10 starts outputting the edge pulse reflecting the delay at the timing of the second burst signal. The operation of the gating circuit 10 indicates that it can output the edge pulse in synchronism with the burst signal and the IDLE signal 53 input in any phase.

The oscillation phase of the VCO 12 is quickly controlled by the pulse output from the gating circuit 10 via the G-VCO 11a. Hence, the VCO 12 can output the recovered clock 7 with little jitter in synchronism with the burst signal and the IDLE signal 53 input in any phase from almost the start of these signals. Hence, even when the no-signal period exists in the input data 4, the operation never becomes unstable, unlike the PLL-type clock recovery circuit 30a as described in the 10th embodiment.

Additionally, in this embodiment, the selector 38 is arranged not inside the clock recovery circuit 30i but at the output portion of the signal multiplexing device. For this reason, the recovered data 19 output from the selector 38 is a continuous signal obtained by multiplexing the IDLE signal 53 during the no-signal period of the input data 4.

As described above, in this embodiment, the recovered data 19 as a low-jitter continuous signal having an almost constant frequency can be generated. For this reason, even when a general-purpose CDR circuit compatible with a continuous signal is connected to the subsequent stage of the signal multiplexing device, there is no concern about frequency step-out of the CDR circuit, and the CDR circuit compatible with a continuous signal can complete clock recovery and data recovery within its phase lock time. Additionally, in this embodiment, the signal multiplexing device has an identification/recovery function for the input data 4. For this reason, the distance between the optical receiving device and the CDR circuit compatible with a continuous signal can be increased even when transmitting a high-speed signal, and the degree of freedom of the device arrangement can be improved.

Furthermore, the signal multiplexing device according to this embodiment serves as a means for transferring a continuous signal between the optical receiving device and the CDR circuit compatible with a continuous signal. Hence, capacitive coupling with the CDR circuit is possible, and the signal multiplexing device can easily be connected to a CDR circuit of different DC level. As described above, in this embodiment, a means capable of multiplexing a burst signal and an IDLE signal can be provided by a simple arrangement, and serial data can directly be input to a control LSI including a general-purpose CDR circuit compatible with a continuous signal. It is therefore possible to reduce the size, cost, and power consumption of the device for the PON system and improve the transmission efficiency of the PON system.

In this embodiment as well, the IDLE signal 51 is set to the above-described "0101" signal, and the IDLE signal 52 is set to the above-described "0011" signal, and the IDLE signal 51 or the IDLE signal 52 is selectively output by a switching signal 48 in accordance with the type of the control LSI connected to the subsequent stage of the signal multiplexing device, thereby avoiding the problem of operation errors of the control LSI. Especially when there is no concern about operation errors, the "0101" signal having a high frequency component is preferably used as the IDLE signal 53 to be multiplexed on the input data 4 to speed up the CDR circuit compatible with a continuous signal and connected to the subsequent stage of the signal multiplexing device.

[15th Embodiment]

Figure 30:
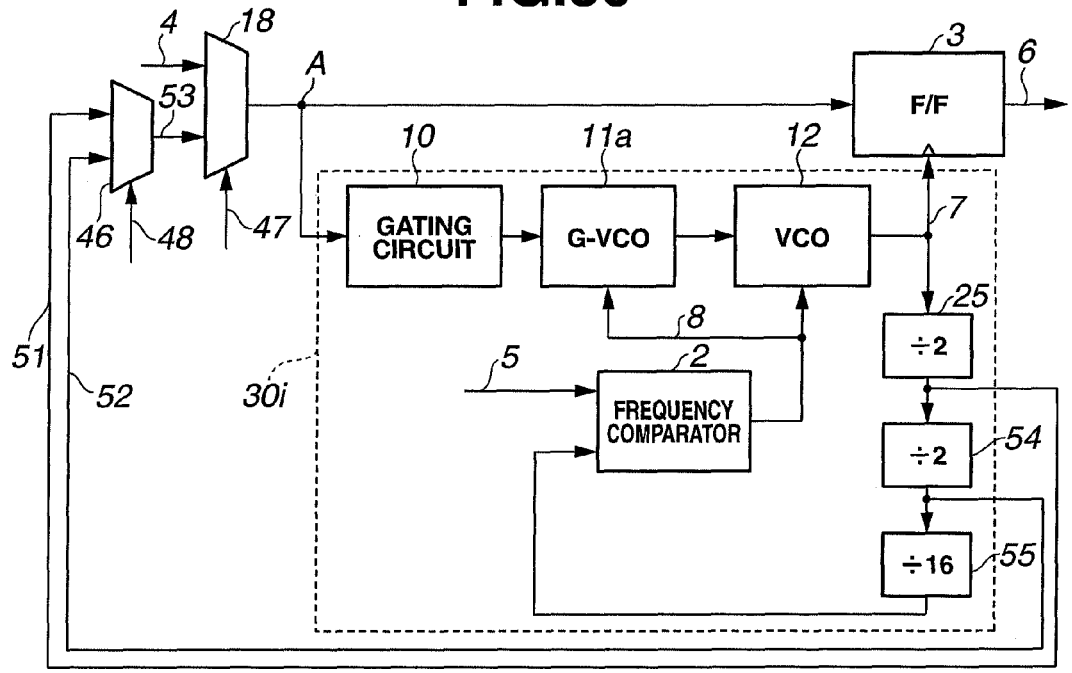
FIG. 30 is a block diagram showing the arrangement of a signal multiplexing device according to the 15th embodiment of the present invention.

The 15th embodiment of the present invention will be described next. FIG. 30 is a block diagram showing the arrangement of a signal multiplexing device according to the 15th embodiment of the present invention. The same reference numerals as in FIGS. 20, 22, 24, 26, and 28 denote the same components. The signal multiplexing device according to this embodiment includes selectors 18 and 46, an F/F 3, a clock recovery circuit 30i. The main points of difference from the 13th embodiment shown in FIG. 26 are that a VCO 12 is provided at the subsequent stage of a G-VCO 11a, a ½ frequency-divided signal of a recovered clock 7 output from the VCO 12 is used as an IDLE signal 51, and a ¼ frequency-divided signal of the recovered clock 7 is used as an IDLE signal 52. In addition to the VCO 12, a frequency comparator 2 and frequency dividers 25, 54, and 55 are added to the clock recovery circuit 30i. The frequency comparator 2, the VCO 12, and the frequency dividers 25, 54, and 55 form a frequency synchronization loop. Furthermore, the frequency dividers 25 and 54 form a feedback circuit that inputs the IDLE signals 51 and 52 to the selector 46.

The frequency divider 25 divides the recovered clock 7 output from the VCO 12 to ½. The frequency divider 54 divides the clock (IDLE signal 51) output from the frequency divider 25 to ½. The frequency divider 55 divides the clock (IDLE signal 52) output from the frequency divider 54 to 1/16. As a result, a 1/64 frequency-divided signal of the recovered clock 7 is input to the frequency comparator 2.

The frequency comparator 2 generates a voltage (frequency control signal 8) that reflects the frequency difference between the frequency of the 1/64 frequency-divided signal of the recovered clock 7 and the frequency of a reference clock 5 whose frequency is 1/64 the input data rate frequency. The frequency comparator 2 and the frequency dividers 25, 54, and 55 thus perform closed-loop control so as to make the frequency of the frequency-divided signal of the recovered clock 7 match the frequency of the reference clock 5. The frequency control signal 8 generated by the closed-loop control is input not only to the VCO 12 but also to the frequency control terminal of the G-VCO 11a.

The arrangements of the G-VCO 11a and the VCO 12 are the same as described in the 14th embodiment. When the same frequency control signal 8 generated by the frequency synchronization loop is input to the frequency control terminal of the G-VCO 11a and the frequency control terminal of the VCO 12, the oscillation frequencies of the G-VCO 11a and the VCO 12 can be made to match the input data rate frequency. When input data 4 having the same data rate frequency as the clock frequency is input to the clock recovery circuit 30i whose clock frequency has been stabilized in the above-described way, quick and stable phase lock can be established even during the consecutive identical digit period.

The operation of the signal multiplexing device according to this embodiment will be described next. FIGS. 31A to 31J are timing charts for explaining the operation of the signal multiplexing device according to this embodiment. FIG. 31A shows the input data 4 when the phase of the second burst signal delays by a ¼ bit, and FIG. 31B shows the input data 4 without phase delay. All of an IDLE signal 53 in FIG. 31C, the signal (the signal at a point A in FIG. 30) in FIG. 31F, the output of a gating circuit 10 in FIG. 31G, the recovered clock 7 in FIG. 31I, and recovered data 6 in FIG. 31J are illustrated for the case in which the phase of the burst signal delays by a ¼ bit. The IDLE signal 53 in FIG. 31D and the output of the gating circuit 10 in FIG. 31H are illustrated for the case in which the input data 4 has no phase delay. Note that FIGS. 31A to 31J indicate a case in which the selector 46 selects the IDLE signal 51 and outputs it as the IDLE signal 53.

The operations of the gating circuit 10 and the G-VCO 11a are the same as in the 14th embodiment, and a description thereof will be omitted.

The clock output from the G-VCO 11a in phase with the input data 4 and the recovered clock 7 that is the output of the VCO 12 itself are input to the VCO 12 in a superimposed manner. For this reason, the phase of the recovered clock 7 is adjusted so as to match the phase of the output clock of the G-VCO 11a (that is, match the phase of the input data 4). However, since the phase of the recovered clock 7 is also affected by the feedback signal of the VCO 12 itself, the influence of the output of the G-VCO 11a on the phase of the recovered clock 7 is reduced. Hence, even when the pulse width of the output clock of the G-VCO 11a varies in accordance with the jitter of the input data 4, the recovered clock 7 is hardly affected by the output of the G-VCO 11a, and the jitter of the recovered clock 7 can be reduced. The ability of suppressing the jitter spells degradation in the instantaneous response characteristic to the input data 4. However, as compared to the signal multiplexing device using a PLL-type clock recovery circuit shown in FIG. 42 or 20, the signal multiplexing device of this embodiment can maintain a much quicker response (within several bits).

As described above, in this embodiment, since the recovered clock 7 that quickly synchronizes with the transition of the edge pulse output from the gating circuit 10 can be output, a normal operation is performed even when the relative phases of the burst signals shift, unlike the 11th embodiment. In this embodiment, since the ½ frequency-divided signal of the recovered clock 7 is used as the IDLE signal 51, and the ¼ frequency-divided signal of the recovered clock 7 is used as the IDLE signal 52, a multiplexed signal having an almost uniform frequency can be generated by multiplexing the IDLE signal 53 during the no-signal period of the input data 4, as in the 11th embodiment. In this embodiment, since the IDLE signals 51 and 52 are extracted from the clock recovery circuit 30i, an external oscillation circuit is unnecessary, and the size and power consumption of the signal multiplexing device can be reduced.

Multiplexing the IDLE signal 53 can be implemented by setting a switching signal 47 to be given to the selector 18 to High only during the no-signal period of the input data 4, as shown in FIG. 31E. A switching signal generation unit for outputting the switching signal 47 can be implemented by the arrangement described in the 11th embodiment. The selector 18 may select the IDLE signal 53 when the switching signal 47 is Low, as in the 11th embodiment.

The gating circuit 10 outputs the edge pulse when the input signal makes a transition from "0" to "1". For this reason, if the phase delays by a ¼ bit relative to the first burst signal and the immediately preceding IDLE signal 53, like the second burst signal shown in FIG. 31A, the gating circuit 10 starts outputting the edge pulse reflecting the delay at the timing of the second burst signal. During the no-signal period immediately after the end of the second burst signal shown in FIG. 31A, the gating circuit 10 outputs the edge pulse when the IDLE signal 53 makes a transition from "0" to "1". The operation of the gating circuit 10 indicates that it can output the edge pulse in synchronism with the burst signal and the IDLE signal 53 input in any phase.

The oscillation phase of the VCO 12 is quickly controlled by the pulse output from the gating circuit 10 via the G-VCO 11a. Hence, the VCO 12 can output the recovered clock 7 with little jitter in synchronism with the burst signal and the IDLE signal 53 input in any phase from almost the start of these signals.

In this embodiment, the input signal to the F/F 3 (the signal at the point A shown in FIG. 30) is the continuous signal obtained by multiplexing the input data 4 and the IDLE signal 53. Hence, when the F/F 3 identifies/recovers the input signal using the recovered clock 7, the continuous signal free from bit errors can be output as the recovered data 6.

As described above, in this embodiment, the recovered data 6 as a low-jitter continuous signal having an almost constant frequency can be generated. For this reason, even when a general-purpose CDR circuit compatible with a continuous signal is connected to the subsequent stage of the signal multiplexing device, there is no concern about frequency step-out of the CDR circuit, and the CDR circuit compatible with a continuous signal can complete clock recovery and data recovery within its phase lock time. Additionally, in this embodiment, the signal multiplexing device has an identification/recovery function for the input data 4. For this reason, the distance between the optical receiving device and the CDR circuit compatible with a continuous signal can be increased even when transmitting a high-speed signal, and the degree of freedom of the device arrangement can be improved.

Furthermore, the signal multiplexing device according to this embodiment serves as a means for transferring a continuous signal between the optical receiving device and the CDR circuit compatible with a continuous signal. Hence, capacitive coupling with the CDR circuit is possible, and the signal multiplexing device can easily be connected to a CDR circuit of different DC level. As described above, in this embodiment, a means capable of multiplexing a burst signal and an IDLE signal can be provided by a simple arrangement, and serial data can directly be input to a control LSI including a general-purpose CDR circuit compatible with a continuous signal. It is therefore possible to reduce the size, cost, and power consumption of the device for the PON system and improve the transmission efficiency of the PON system.

In this embodiment as well, the IDLE signal 51 is set to the above-described "0101" signal, and the IDLE signal 52 is set to the above-described "0011" signal, and the IDLE signal 51 or the IDLE signal 52 is selectively output by a switching signal 48 in accordance with the type of the control LSI connected to the subsequent stage of the signal multiplexing device, thereby avoiding the problem of operation errors of the control LSI. Especially when there is no concern about operation errors, the "0101" signal having a high frequency component is preferably used as the IDLE signal 53 to be multiplexed on the input data 4 to speed up the CDR circuit compatible with a continuous signal and connected to the subsequent stage of the signal multiplexing device.

[16th Embodiment]

Figure 32:
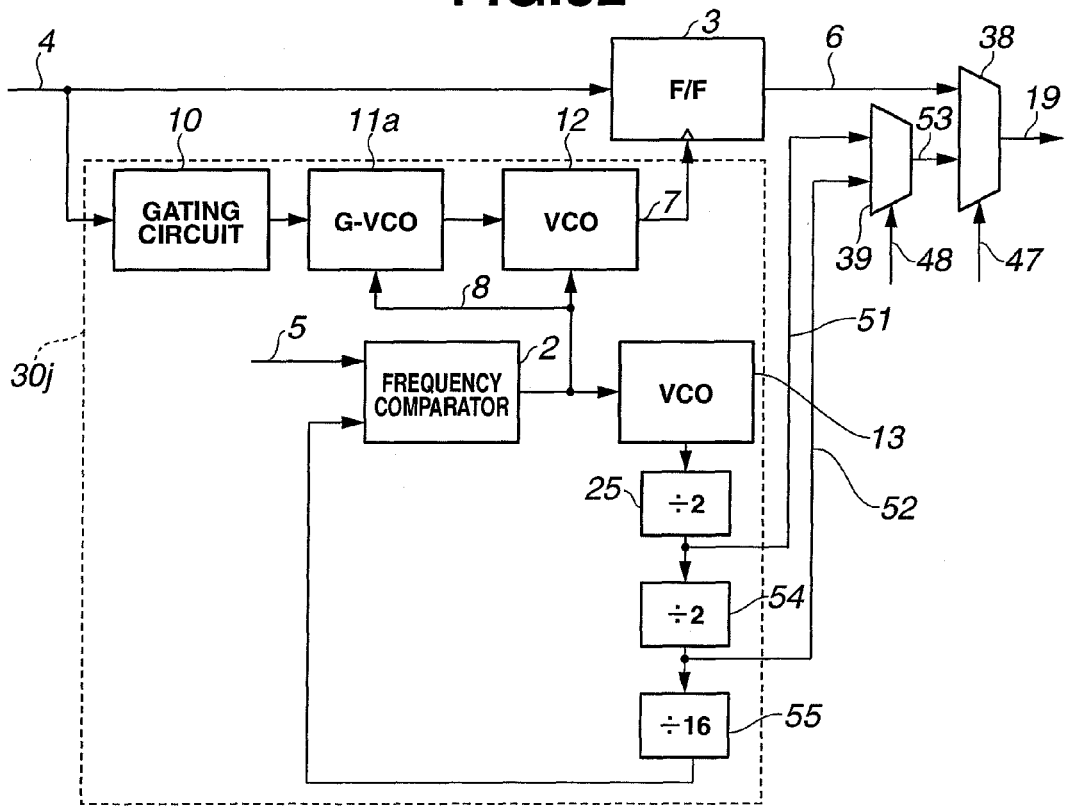
FIG. 32 is a block diagram showing the arrangement of a signal multiplexing device according to the 16th embodiment of the present invention.

The 16th embodiment of the present invention will be described next. FIG. 32 is a block diagram showing the arrangement of a signal multiplexing device according to the 16th embodiment of the present invention. The same reference numerals as in FIGS. 20, 22, 24, 26, 28, and 30 denote the same components. The signal multiplexing device according to this embodiment includes an F/F 3, a clock recovery circuit 30*j*, and selectors 38 and 39. The main points of difference from the 14th embodiment shown in FIG. 28 are that a VCO 13 is provided at the subsequent stage of a frequency comparator 2, a ½ frequency-divided signal of the output clock of the VCO 13 is used as an IDLE signal 51, and a ¼ frequency-divided signal of the output clock of the VCO 13 is used as an IDLE signal 52. The frequency comparator 2, the VCO 13, and frequency dividers 25, 54, and 55 form a frequency synchronization loop.

The frequency divider 25 divides a clock 7 output from the VCO 13 to ½. The frequency divider 54 divides the clock (IDLE signal 51) output from the frequency divider 25 to ½. The frequency divider 55 divides the clock (IDLE signal 52) output from the frequency divider 54 to ⅟16. As a result, a ⅟64 frequency-divided signal of the output clock of the VCO 13 is input to the frequency comparator 2.

The frequency comparator 2 generates a voltage (frequency control signal 8) that reflects the frequency difference between the frequency of the ⅟64 frequency-divided signal of the output clock of the VCO 13 and the frequency of a reference clock 5 whose frequency is ⅟64 the input data rate frequency. The frequency comparator 2 and the frequency dividers 25, 54, and 55 thus perform closed-loop control so as to make the frequency of the frequency-divided signal of the output clock of the VCO 13 match the frequency of the reference clock 5. The frequency control signal 8 generated by the closed-loop control is input not only to the VCO 13 but also to the frequency control terminal of a G-VCO 11*a* and the frequency control terminal of a VCO 12.

The VCO 13 preferably has the same circuit arrangement as the G-VCO 11*a* or the VCO 12. The arrangements of the G-VCO 11*a* and the VCO 12 are the same as described in the 14th embodiment. The VCO 13 is designed to pull up one input terminal of a timing control gate circuit as in the G-VCO 11*a* and feed back the output of the VCO 13 to the other input terminal of the timing control gate circuit.

When the same frequency control signal 8 generated by the frequency synchronization loop is input to the frequency control terminal of the G-VCO 11*a*, the frequency control terminal of the VCO 12, and the frequency control terminal of the VCO 13 having the above-described arrangement, the oscillation frequencies of the G-VCO 11*a*, the VCO 12, and the VCO 13 can be made to match the input data rate frequency. When input data 4 having the same data rate frequency as the clock frequency is input to the clock recovery circuit 30*j* whose clock frequency has been stabilized in the above-described way, quick and stable phase lock can be established even during the consecutive identical digit period.

Additionally, in this embodiment, as compared to the 14th embodiment shown in FIG. 28, although the circuit scale and power consumption increase due to addition of the VCO 13, the frequency synchronization loop can be disconnected from the edge pulse path. For this reason, even when the input data 4 having a frequency different from the desired data rate frequency is input, the recovered clock 7 having the desired input data rate frequency can always continuously be output, and the frequency synchronization can be maintained.

As described above, in this embodiment, the frequency synchronization can be maintained independently of the input data 4. For this reason, a normal operation can be performed even when a signal other than the desired data rate is mixed in the input data 4, unlike the 14th embodiment.

FIGS. 33A to 33H are timing charts for explaining the operation of the signal multiplexing device according to this embodiment. FIG. 33A shows the input data 4 when the phase of the second burst signal delays by a ¼ bit, and FIG. 33B shows the input data 4 without phase delay. All of an IDLE signal 53 in FIG. 33C, the output of a gating circuit 10 in FIG. 33E, the recovered clock 7 in FIG. 33G, and recovered data 19 in FIG. 33H are illustrated for the case in which the phase of the burst signal delays by a ¼ bit. The output of the gating circuit 10 in FIG. 33F is illustrated for the case in which the input data 4 has no phase delay. Note that FIGS. 33A to 33H indicate a case in which the selector 39 selects the IDLE signal 51 and outputs it as the IDLE signal 53.

The oscillation phases of the G-VCO 11*a* and the VCO 12 are controlled by the edge pulse output from the gating circuit 10. Hence, when the phase of the second burst signal delays by a ¼ bit, and a signal having a frequency different from the desired input data rate frequency, for example, a signal of 1 Gbps is mixed between the second burst signal and the third burst signal, as shown in FIG. 33A, a frequency shift occurs in the outputs of the G-VCO 11*a* and the VCO 12 as they are going to lock the phases to the 1-Gbps signal. Hence, when the frequency-divided signal of the recovered clock 7 output from the VCO 12 is input to the frequency comparator 2, the frequency control signal 8 changes in accordance with the frequency difference between the reference clock 5 and the frequency-divided signal.

On the other hand, in this embodiment, the frequency-divided signal of the recovered clock 7 is not input to the frequency comparator 2, and the frequency synchronization loop is disconnected from the edge pulse path, unlike the 14th embodiment. For this reason, even when a signal having a frequency different from the desired data rate frequency is mixed in the input data 4, the frequency control signal 8 does not change. Hence, when the burst signal of the desired data rate is input after the 1-Gbps signal, as shown in FIG. 33A, the data can normally be recovered with a delay corresponding to the phase lock time.

When the optical receiving device outputs noise during the no-signal period of the input data 4, the oscillation frequencies of the G-VCO 11a and the VCO 12 may shift. In this embodiment, however, since the stable frequency synchronization can be maintained, a normal operation can be performed.

In this embodiment as well, the IDLE signal 51 is set to the above-described "0101" signal, and the IDLE signal 52 is set to the above-described "0011" signal, and the IDLE signal 51 or the IDLE signal 52 is selectively output by a switching signal 48 in accordance with the type of the control LSI connected to the subsequent stage of the signal multiplexing device, thereby avoiding the problem of operation errors of the control LSI. Especially when there is no concern about operation errors, the "0101" signal having a high frequency component is preferably used as the IDLE signal 53 to be multiplexed on the input data 4 to speed up the CDR circuit compatible with a continuous signal and connected to the subsequent stage of the signal multiplexing device.

[17th Embodiment]

Figure 34:
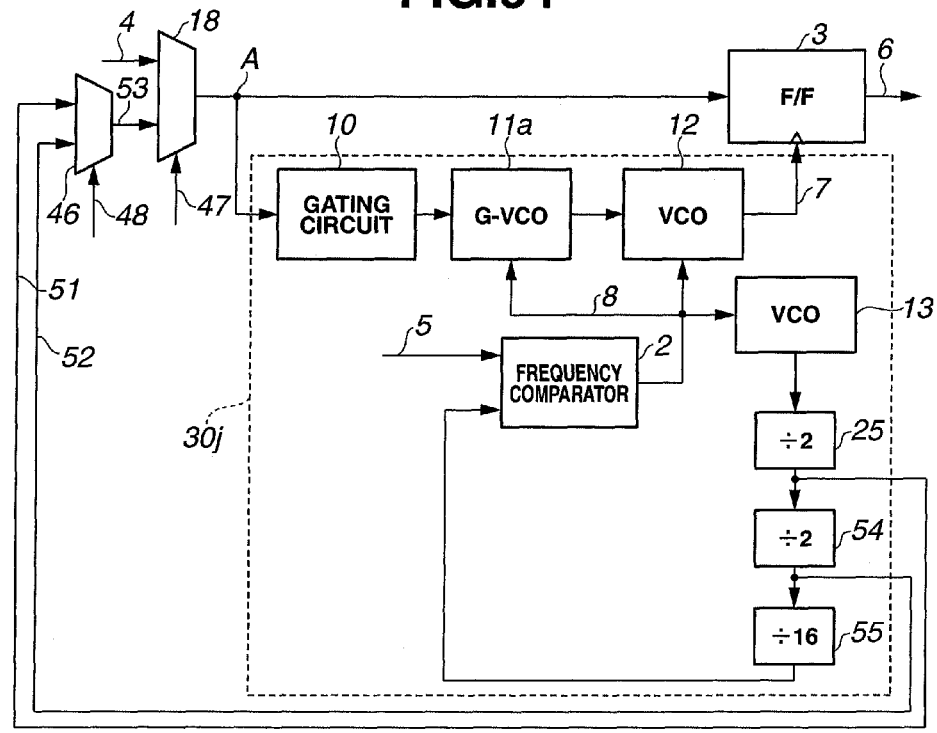
FIG. 34 is a block diagram showing the arrangement of a signal multiplexing device according to the 17th embodiment of the present invention.

The 17th embodiment of the present invention will be described next. FIG. 34 is a block diagram showing the arrangement of a signal multiplexing device according to the 17th embodiment of the present invention. The same reference numerals as in FIGS. 20, 22, 24, 26, 28, 30, and 32 denote the same components. The signal multiplexing device according to this embodiment includes selectors 18 and 46, an F/F 3, and a clock recovery circuit 30j. The main points of difference from the 15th embodiment shown in FIG. 30 are that a VCO 13 is provided at the subsequent stage of a frequency comparator 2, a ½ frequency-divided signal of the output clock of the VCO 13 is used as an IDLE signal 51, and a ¼ frequency-divided signal of the output clock of the VCO 13 is used as an IDLE signal 52. The frequency comparator 2, the VCO 13, and frequency dividers 25, 54, and 55 form a frequency synchronization loop.

The frequency comparator 2 generates a voltage (frequency control signal 8) that reflects the frequency difference between the frequency of the 1/64 frequency-divided signal of the output clock of the VCO 13 and the frequency of a reference clock 5 whose frequency is 1/64 the input data rate frequency. The frequency comparator 2 and the frequency dividers 25, 54, and 55 thus perform closed-loop control so as to make the frequency of the frequency-divided signal of the output clock of the VCO 13 match the frequency of the reference clock 5. The frequency control signal 8 generated by the closed-loop control is input not only to the VCO 13 but also to the frequency control terminal of a G-VCO 11a and the frequency control terminal of a VCO 12.

The VCO 13 preferably has the same circuit arrangement as the G-VCO 11a or the VCO 12. The arrangements of the G-VCO 11a and the VCO 12 are the same as described in the 14th embodiment. The arrangement of the VCO 13 is the same as described in the 16th embodiment. When the same frequency control signal 8 generated by the frequency synchronization loop is input to the frequency control terminal of the G-VCO 11a, the frequency control terminal of the VCO 12, and the frequency control terminal of the VCO 13, the oscillation frequencies of the G-VCO 11a, the VCO 12, and the VCO 13 can be made to match the input data rate frequency.

Additionally, in this embodiment, as compared to the 15th embodiment shown in FIG. 30, although the circuit scale and power consumption increase due to addition of the VCO 13, the frequency synchronization loop can be disconnected from the edge pulse path. For this reason, even when input data 4 having a frequency different from the desired data rate frequency is input, a recovered clock 7 having the desired input data rate frequency can always continuously be output, and the frequency synchronization can be maintained.

The oscillation phases of the G-VCO 11a and the VCO 12 are controlled by the edge pulse output from a gating circuit 10. Hence, when a large amount of jitter is mixed in the input data 4, the oscillation frequencies of the G-VCO 11a and the VCO 12 apparently increase/decrease. Hence, when the frequency-divided signal of the recovered clock 7 output from the VCO 12 is input to the frequency comparator 2, the frequency control signal 8 changes in accordance with the frequency difference between the reference clock 5 and the frequency-divided signal.

On the other hand, in this embodiment, the frequency synchronization can be maintained independently of the input data 4, unlike the 15th embodiment. For this reason, even when a large amount of jitter is mixed in the input data 4, the frequency control signal 8 does not change, and the low-jitter recovered clock 7 and recovered data 6 can be output.

In this embodiment as well, the IDLE signal 51 is set to the above-described "0101" signal, and the IDLE signal 52 is set to the above-described "0011" signal, and the IDLE signal 51 or the IDLE signal 52 is selectively output by a switching signal 48 in accordance with the type of the control LSI connected to the subsequent stage of the signal multiplexing device, thereby avoiding the problem of operation errors of the control LSI. Especially when there is no concern about operation errors, the "0101" signal having a high frequency component is preferably used as an IDLE signal 53 to be multiplexed on the input data 4 to speed up the CDR circuit compatible with a continuous signal and connected to the subsequent stage of the signal multiplexing device.

[18th Embodiment]

Figure 35:
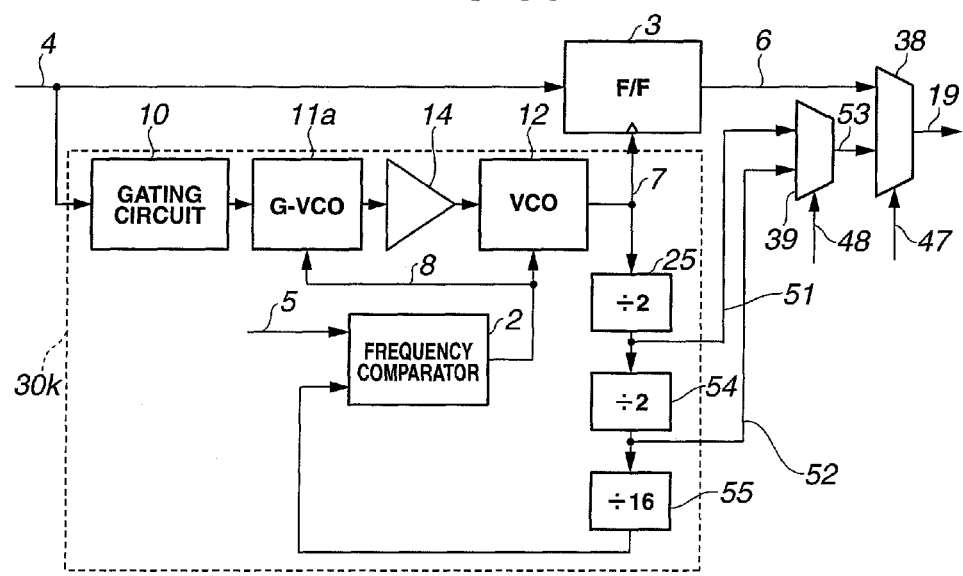
FIG. 35 is a block diagram showing the arrangement of a signal multiplexing device according to the 18th embodiment of the present invention.

The 18th embodiment of the present invention will be described next. FIG. 35 is a block diagram showing the arrangement of a signal multiplexing device according to the 18th embodiment of the present invention. The same reference numerals as in FIGS. 20, 22, 24, 26, 28, 30, 32, and 34 denote the same components. The signal multiplexing device according to this embodiment includes an F/F 3, a clock recovery circuit 30k, and selectors 38 and 39. The main point of difference from the 14th embodiment shown in FIG. 28 is that a buffer amplifier 14 is arranged between the output of a G-VCO 11a and the input of a VCO 12.

As described in the 14th embodiment, the phase of a recovered clock 7 that is the output of the VCO 12 is adjusted so as to match the phase of the output clock of the G-VCO 11a (that is, match the phase of input data 4). However, since the phase of the recovered clock 7 is also affected by the feedback signal of the VCO 12 itself, the influence of the output of the G-VCO 11a on the phase of the recovered clock 7 is reduced. In this embodiment, the buffer amplifier 14 is provided between the G-VCO 11a and the VCO 12. Since the buffer amplifier 14 attenuates the output signal of the G-VCO 11a, the influence of the G-VCO 11a on the phase of the recovered clock 7 is further reduced.

Hence, in this embodiment, even when the jitter of the output clock of the G-VCO 11a increases in accordance with the jitter of the input data 4, the VCO 12 hardly affected, and the jitter of the recovered clock 7 can be reduced. In this embodiment, the buffer amplifier 14 is applied to the 14th embodiment. However, it may be applied to the sixth to 17th embodiments.

[19th Embodiment]

Figure 36:
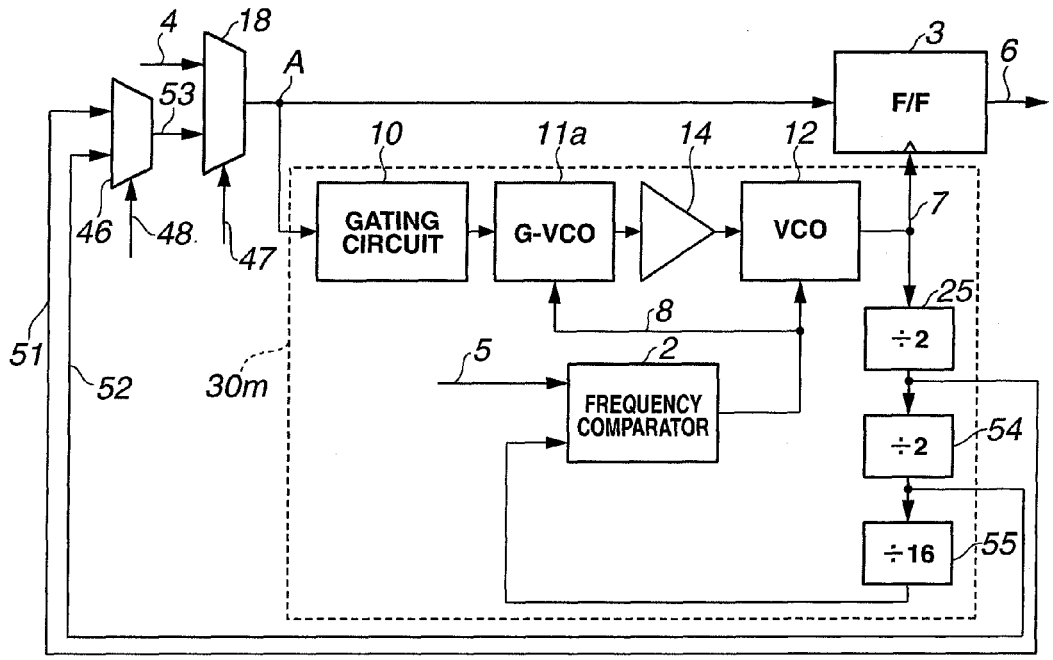
FIG. 36 is a block diagram showing the arrangement of a signal multiplexing device according to the 19th embodiment of the present invention.

The 19th embodiment of the present invention will be described next. FIG. 36 is a block diagram showing the arrangement of a signal multiplexing device according to the 19th embodiment of the present invention. The same reference numerals as in FIGS. 20, 22, 24, 26, 28, 30, 32, 34, and 35 denote the same components. The signal multiplexing device according to this embodiment includes selectors 18 and 46, an F/F 3, and a clock recovery circuit 30m. The main point of difference from the 15th embodiment shown in FIG. 30 is that a buffer amplifier 14 is arranged between the output of a G-VCO 11a and the input of a VCO 12. The operation and effect of the signal multiplexing device according to this embodiment are the same as in the 15th and 18th embodiments, and a detailed description thereof will be omitted.

[20th Embodiment]

Figure 37:
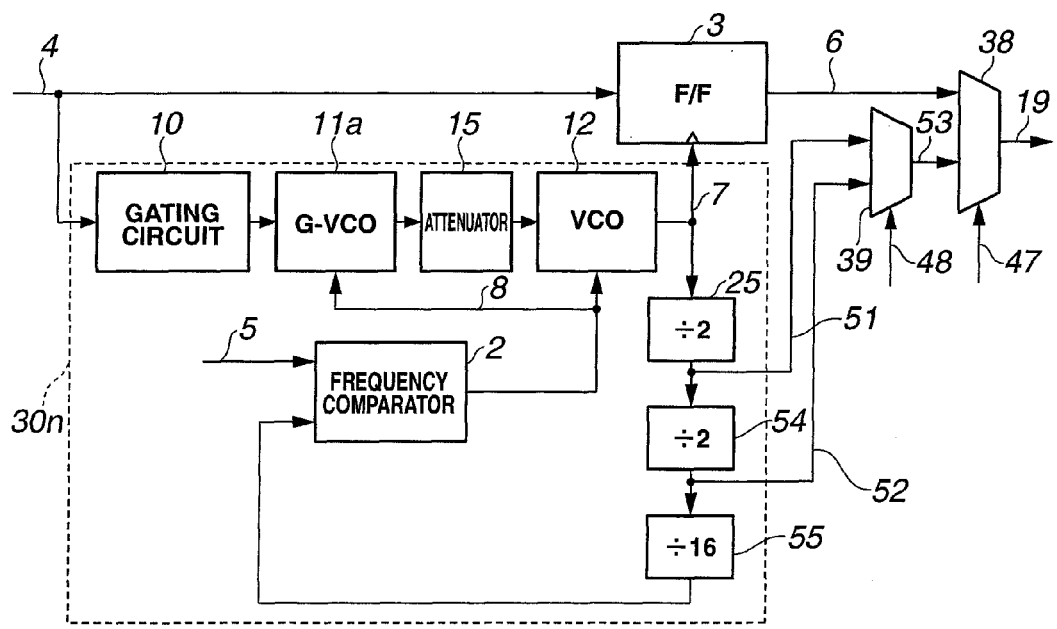
FIG. 37 is a block diagram showing the arrangement of a signal multiplexing device according to the 20th embodiment of the present invention.

The 20th embodiment of the present invention will be described next. FIG. 37 is a block diagram showing the arrangement of a signal multiplexing device according to the 20th embodiment of the present invention. The same reference numerals as in FIGS. 20, 22, 24, 26, 28, 30, 32, and 34 to 36 denote the same components. The signal multiplexing device according to this embodiment includes an F/F 3, a clock recovery circuit 30n, and selectors 38 and 39. The main point of difference from the 18th embodiment shown in FIG. 35 is that an attenuator 15 is provided in place of the buffer amplifier 14. The operation and effect of the signal multiplexing device according to this embodiment are the same as in the 18th embodiment, and a detailed description thereof will be omitted.

[21st Embodiment]

Figure 38:
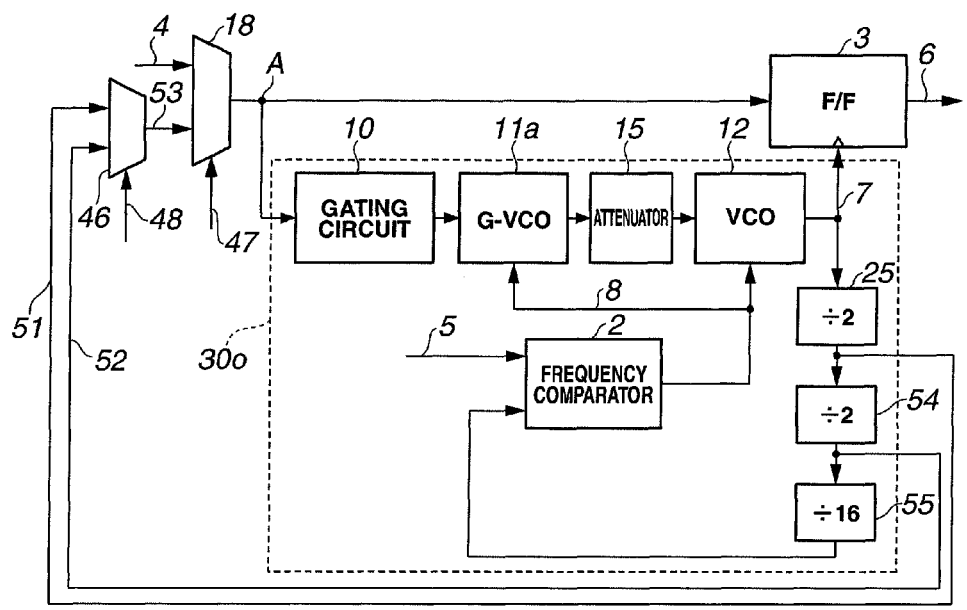
FIG. 38 is a block diagram showing the arrangement of a signal multiplexing device according to the 21st embodiment of the present invention.

The 21st embodiment of the present invention will be described next. FIG. 38 is a block diagram showing the arrangement of a signal multiplexing device according to the 21st embodiment of the present invention. The same reference numerals as in FIGS. 20, 22, 24, 26, 28, 30, 32, and 34 to 37 denote the same components. The signal multiplexing device according to this embodiment includes selectors 18 and 46, an F/F 3, and a clock recovery circuit 30o. The main point of difference from the 19th embodiment shown in FIG. 36 is that an attenuator 15 is provided in place of the buffer amplifier 14. The operation and effect of the signal multiplexing device according to this embodiment are the same as in the 19th embodiment, and a detailed description thereof will be omitted.

Note that in the 10th to 21st embodiments, the frequency of the IDLE signal 51 is not limited to ½ the input data rate frequency. Similarly, the frequency of the IDLE signal 52 is not limited to ¼ the input data rate frequency. The types of the IDLE signals 51 and 52 are not limited to the two types. However, when a signal having the data rate frequency such as the output clock itself of the VCO 13 is used as the IDLE signal 51 or 52, the signal corresponds to a "01" signal at a data rate twice the input data rate. For this reason, the frequency exceeds the effective band of the circuit, and distortion and jitter may occur in the waveform. In addition, the operation of the CDR circuit compatible with a continuous signal at the subsequent stage may be unstable. Hence, the frequency of the IDLE signal 51 or 52 need only be 1/N (N is an integer of 2 or more) the input data rate frequency.

The gating circuit 10 is not limited to that shown in the 12th to 21st embodiments and may output the edge pulse when the input signal makes a transition from "1" to "0".

In the 14th to 21st embodiments, the frequency of the reference clock 5 is not limited to 1/64 the input data rate frequency and may be 1/32 or the like. That is, when the total division ratio of the frequency dividers 25, 54, and 55 is n (n is an integer of 2 or more), the frequency of the recovered clock 7 can be stabilized by inputting the reference clock 5 whose frequency is 1/n the input data rate frequency to the frequency comparator 2.

The signal multiplexing devices shown in the 10th to 21st embodiments need not always be arranged outside the control LSI and may be provided inside the control LSI. Providing the signal multiplexing device inside the control LSI makes it possible to further reduce the size, cost, and power consumption of the device.

In the 10th to 21st embodiments, a case has been described in which the no-signal section of the input data 4 is completely complemented by the IDLE signal that is the complementary signal. However, when the switching signal is output later than the starting point of the no-signal section, or signal switching by the selector delays, the no-signal section is only partially complemented by the IDLE signal. Even in this case, if the no-signal section remaining after the complementation is as short as several hundred ns, no problem arises in most subsequent-stage circuits, and the effects of the present invention can sufficiently be obtained.

[22nd Embodiment]

Figure 39:
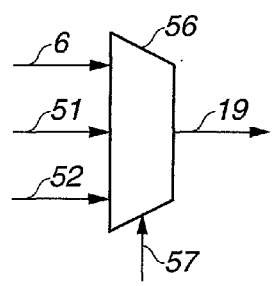
FIG. 39 is a view showing a selector of a signal multiplexing device according to the 22nd embodiment of the present invention.

The 22nd embodiment of the present invention will be described next. FIG. 39 is a view showing a selector of a signal multiplexing device according to the 22nd embodiment of the present invention. A selector 56 serving as a selection circuit is used in place of the selectors 38 and 39 shown in FIGS. 20, 24, 28, 32, 35, and 37. The selector 56 selects and outputs one of recovered data 6, an IDLE signal 51, and an IDLE signal 52 based on a switching signal 57. In this embodiment, the functions of the selectors 38 and 39 can be implemented by the single selector 56.

[23rd Embodiment]

Figure 40:
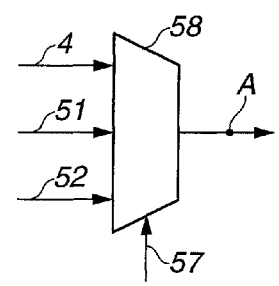
FIG. 40 is a view showing a selector of a signal multiplexing device according to the 23rd embodiment of the present invention.
Figure 41:
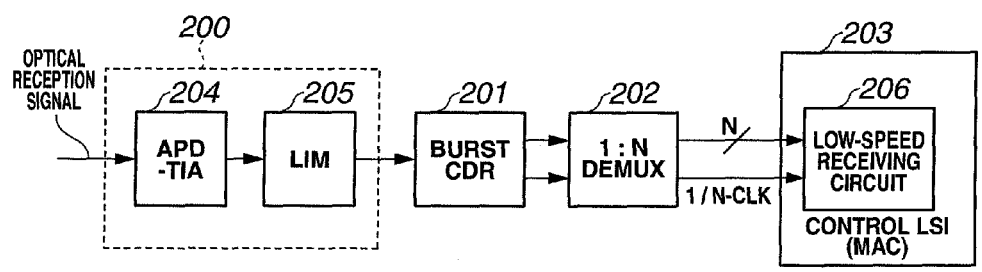
FIG. 41 is a block diagram showing an example of the arrangement of a receiving device of a conventional optical line terminal.

The 23rd embodiment of the present invention will be described next. FIG. 40 is a view showing a selector of a signal multiplexing device according to the 23rd embodiment of the present invention. A selector 58 serving as a selection circuit is used in place of the selectors 18 and 46 shown in FIGS. 22, 26, 30, 34, 36, and 38. The selector 58 selects and outputs one of input data 4, an IDLE signal 51, and an IDLE signal 52 based on a switching signal 57. In this embodiment, the functions of the selectors 18 and 46 can be implemented by the single selector 58.

INDUSTRIAL APPLICABILITY

The present invention is applicable to a signal multiplexing device for multiplexing a complementary signal on a burst signal, or a signal conditioner.

EXPLANATION OF THE REFERENCE NUMERALS AND SIGNS 1, 18, 38, 39, 46, 56, 58 . . . selector, 2 . . . frequency comparator, 3 . . . flip-flop circuit, 4 . . . input data, 5 . . . reference clock, 6, 19 . . . recovered data, 7 . . . recovered clock, 8 . . . frequency control signal, 9 . . . step-out detector, 10 . . . gating circuit, 11, 11a . . . gated voltage controlled oscillator, 12, 13, 33 . . . voltage controlled oscillator, 14 . . . buffer amplifier, 15 . . . attenuator, 16, 27, 28, 51, 52, 53 . . . IDLE signal, 17, 29, 42, 44, 45, 47, 48, 57 . . . switching signal, 20 . . . switch, 25, 25d, 26, 26d, 26e, 54, 55 . . . frequency divider, 30a, 30b, 30c, 30d, 30e, 30f, 30g, 30h, 30i, 30j, 30k, 30m, 30n, 30o . . . clock recovery circuit, 31 . . . phase comparator, 32 . . . low pass filter, 32 . . . voltage controlled oscillator, 40 . . . no-signal detection circuit, 41 . . . OR circuit, 43 . . . bit rate determination signal

The invention claimed is:

1. A signal multiplexing device comprising:
   a selection circuit that selects and outputs one of an input signal and at least one complementary signal of the input signal;
   a clock recovery circuit that adjusts a phase of a recovered clock to a timing of an output signal of said selection circuit and outputs the recovered clock in synchronism with the output signal of said selection circuit; and
   an identification circuit that performs identification/recovery of the output signal of said selection circuit based on the recovered clock,
   wherein a frequency of the recovered clock equals a frequency of the input signal, and a frequency of the complementary signal is an integral submultiple of the frequency of the recovered clock, and
   said selection circuit selects the complementary signal during part of a no-signal period of the input signal.

2. A signal multiplexing device according to claim 1, further comprising a first feedback circuit that inputs a frequency-divided signal of the recovered clock to said selection circuit as the complementary signal.

3. A signal multiplexing device according to claim 1, wherein said clock recovery circuit comprises:
   a gating circuit that outputs a pulse when the output signal of said selection circuit makes a transition; and
   a first voltage controlled oscillator that adjusts the phase of the recovered clock to a timing of the output pulse of said gating circuit, thereby outputting the recovered clock in synchronism with the output signal of said selection circuit.

4. A signal multiplexing device according to claim 3, further comprising:
   a second voltage controlled oscillator provided between an output of said gating circuit and an input signal of said first voltage controlled oscillator,
   wherein said second voltage controlled oscillator adjusts the phase of an output clock to the timing of the output pulse of said gating circuit, thereby outputting a clock in synchronism with the output signal of said selection circuit, and
   said first voltage controlled oscillator adjusts the phase of the recovered clock to the timing of the output clock of said second voltage controlled oscillator.

5. A signal multiplexing device according to claim 4, further comprising, between an output of said second voltage controlled oscillator and the input of said first voltage controlled oscillator, at least one of a buffer amplifier and an attenuator that attenuate a signal.

6. A signal multiplexing device according to claim 3, further comprising a frequency comparator that compares a frequency of the output of said first voltage controlled oscillator and a frequency of a reference clock, thereby outputting, to said first voltage controlled oscillator, a frequency control signal that causes said first voltage controlled oscillator to oscillate at a desired data rate frequency.

7. A signal multiplexing device according to claim 6, further comprising a step-out detector that detects a step-out of said first voltage controlled oscillator; and
   an OR circuit that is provided between said selection circuit and a switching signal generation unit that controls said selection circuit, OR-processes an output of said switching signal generation unit and an output of said step-out detector, and outputs the result as a switching signal to said selection circuit,
   wherein said selection circuit selects the complementary signal during the no-signal period of the input signal in which said step-out detector does not detect the step-out.

8. A signal multiplexing device according to claim 6, further comprising a step-out detector that detects a step-out of said first voltage controlled oscillator; and
   a switch that controls to make the timing of the recovered clock output from said first voltage controlled oscillator irrelevant to the output signal of said selection circuit during a period in which said step-out detector detects the step-out.

9. A signal multiplexing device according to claim 4, further comprising:
   a third voltage controlled oscillator whose oscillation frequency is controlled by a frequency control signal; and
   a frequency comparator that compares a frequency of an output of said third voltage controlled oscillator and a frequency of a reference clock, thereby outputting, to said first voltage controlled oscillator, said second voltage controlled oscillator, and said third voltage controlled oscillator, the frequency control signal that causes said first voltage controlled oscillator, said second voltage controlled oscillator, and said third voltage controlled oscillator to oscillate at a desired data rate frequency.

10. A signal multiplexing device according to claim 9, further comprising a second feedback circuit that inputs a frequency-divided signal of an output clock of said third voltage controlled oscillator to said selection circuit as the complementary signal.

11. A signal multiplexing device according to claim 1, further comprising a switching signal generation unit that generates a switching signal to cause said selection circuit to select the complementary signal during the part of the no-signal period of the input signal.

12. A signal multiplexing device according to claim 11, wherein said switching signal generation unit comprises a no-signal detection circuit that detects the no-signal period of the input signal.

13. A signal multiplexing device according to claim 11, wherein said switching signal generation unit generates the switching signal to cause said selection circuit to select the complementary signal even during a period in which an input signal having a data rate other than a desired data rate is input.

14. A signal multiplexing device according to claim 4, wherein said first voltage controlled oscillator and said second voltage controlled oscillator have the same arrangement.

15. A signal multiplexing device according to claim 9, wherein at least one of said first voltage controlled oscillator and said second voltage controlled oscillator has the same arrangement as said third voltage controlled oscillator.

16. A signal multiplexing device according to claim 1, wherein the complementary signal comprises a plurality of signals for which at least one of a frequency and a signal pattern changes.

17. A signal multiplexing device according to claim 1, wherein said selection circuit comprises:
   a first selection circuit that selects and outputs one of the input signal and the complementary signal; and
   a second selection circuit that selects and outputs, as the complementary signal, one of a plurality of signals for which at least one of a frequency and a signal pattern changes.

18. A signal multiplexing device according to claim 1, further comprising a first feedback circuit that inputs a frequency-divided signal of the recovered clock to said selection circuit as the complementary signal, wherein said clock recovery circuit comprises:

a gating circuit that outputs a pulse when the output signal of said selection circuit makes a transition;

a first voltage controlled oscillator that adjusts the phase of the recovered clock to a timing of the output pulse of said gating circuit, thereby outputting the recovered clock in synchronism with the output signal of said selection circuit;

a second voltage controlled oscillator provided between an output of said gating circuit and an input signal of said first voltage controlled oscillator;

a third voltage controlled oscillator whose oscillation frequency is controlled by a frequency control signal; and a frequency comparator that compares a frequency of an output of said third voltage controlled oscillator and a frequency of a reference clock, thereby outputting, to said first voltage controlled oscillator, said second voltage controlled oscillator, and said third voltage controlled oscillator, the frequency control signal that causes said first voltage controlled oscillator, said second voltage controlled oscillator, and said third voltage controlled oscillator to oscillate at a desired data rate frequency, said second voltage controlled oscillator adjusts the phase of the output clock to the timing of the output pulse of said gating circuit, thereby outputting a clock in synchronism with the output signal of said selection circuit, and said first voltage controlled oscillator adjusts the phase of the recovered clock to the timing of the output clock of said second voltage controlled oscillator.

19. A signal multiplexing device comprising:

a clock recovery circuit that adjusts a phase of a recovered clock to a timing of an input signal and outputs the recovered clock in synchronism with the input signal;

an identification circuit that performs identification/recovery of the input signal based on the recovered clock; and a selection circuit that selects and outputs one of an output signal of said identification circuit and at least one complementary signal of the output signal, wherein a frequency of the recovered clock equals a frequency of the input signal, and a frequency of the complementary signal is an integral submultiple of the frequency of the recovered clock, and said selection circuit selects the complementary signal during part of a no-signal period of the input signal.

* * * * *